United States Patent
Jinta et al.

(10) Patent No.: US 8,952,374 B2
(45) Date of Patent: Feb. 10, 2015

(54) DISPLAY AND ELECTRONIC APPARATUS

(71) Applicant: Sony Corporation, Tokyo (JP)

(72) Inventors: Seiichiro Jinta, Kanagawa (JP); Gaku Izumi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/192,934

(22) Filed: Feb. 28, 2014

(65) Prior Publication Data
US 2014/0284570 A1  Sep. 25, 2014

(30) Foreign Application Priority Data

Mar. 25, 2013 (JP) ................. 2013-062650

(51) Int. Cl.
| | |
|---|---|
| H01L 29/08 | (2006.01) |
| H01L 29/20 | (2006.01) |
| H01L 21/00 | (2006.01) |
| H01L 51/40 | (2006.01) |
| H01L 27/32 | (2006.01) |

(52) U.S. Cl.
CPC ........ H01L 27/3218 (2013.01); H01L 27/3213 (2013.01); H01L 27/3216 (2013.01)
USPC .................... 257/40; 257/89; 438/35; 438/99

(58) Field of Classification Search
CPC .. H01L 51/0545; H01L 51/0036; H01L 51/50
USPC ................. 257/40, 89; 345/87; 438/35, 99
See application file for complete search history.

(56) References Cited

FOREIGN PATENT DOCUMENTS

| | | |
|---|---|---|
| JP | 2011-034050 | 2/2011 |
| JP | 2011-249334 | 12/2011 |

*Primary Examiner* — Long K Tran
*Assistant Examiner* — Dzung Tran
(74) *Attorney, Agent, or Firm* — Rader, Fishman & Grauer PLLC

(57) ABSTRACT

A display device includes pixels, each including a set of sub-pixels. A first subset of the pixels may each include white, green, and blue sub-pixels, but not a red sub-pixel. A second subset of the pixels may each include white, green, and red sub-pixels, but not a blue sub-pixel. The pixels may alternate between the first subset and the second subset in at least one direction.

27 Claims, 46 Drawing Sheets

DISPLAY AND ELECTRONIC APPARATUS

CROSS REFERENCE TO RELATED APPLICATIONS

This application claims the benefit of Japanese Priority Patent Application JP 2013-062650 filed Mar. 25, 2013, the entire contents of which are incorporated herein by reference.

BACKGROUND

The present disclosure relates to a display including a current-driven display device, and to an electronic apparatus including such a display.

In recent years, in a field of displays performing image display, a display using a current-driven optical device in which light-emission luminance varies depending on a value of a current flown therethrough as a light-emitting device, for example, an organic EL (Electro Luminescence) display using an organic EL device, has been developed and commercialized. The light-emitting device is a self-emitting device unlike a liquid crystal device etc., and it is not necessary to provide any light source (backlight) separately. Therefore, compared to a liquid crystal display in which a light source is necessary, the organic EL display has characteristics such as high visibility of images, low power consumption, high response speed of device, etc.

The display generates light of arbitrary colors, for example, through combining light (basic color light) of red (R), green (G), and blue (B). For example, Japanese Unexamined Patent Application Publication Nos. 2011-304050 and 2011-249334 disclose an organic EL display in which sub-pixels of red (R) and blue (B) are formed to be larger than a sub-pixel of green (G).

SUMMARY

Generally, it is desirable to achieve low power consumption in an electronic apparatus. Also in a display, it is expected to reduce power consumption. Further, in a display, it is generally desirable to achieve high image quality, and further improvement in image quality is expected.

It is desirable to provide a display and an electronic apparatus that are capable of reducing power consumption and of improving image quality.

According to an exemplary illustration of the present disclosure, a display device may include a plurality of pixels on a substrate, each pixel of the plurality of pixels including a set of sub-pixels each being one of: first sub-pixels configured to emit light of a first color, second sub-pixels configured to emit light of a second color, third sub-pixels configured to emit light of a third color, and fourth sub-pixels configured to emit light of a fourth color. The display device may also include a drive section that is configured to drive the plurality of pixels. A first subset of the plurality of pixels may each include one of the first sub-pixels, one of the second sub-pixels, and one of the third sub-pixels, but not one of the fourth sub-pixels, and a second subset of the plurality of pixels may each include one of the first sub-pixels, one of the second sub-pixels, and one of the fourth sub-pixels, but not one of the third sub-pixels. The plurality of pixels may alternate, in at least one of a column direction and a row direction, between the first subset and the second subset.

According to another exemplary illustration of the present disclosure, a display device may include a plurality of pixels on a substrate, each pixel of the plurality of pixels including a set of sub-pixels each being one of: first sub-pixels configured to emit light of a first color, second sub-pixels configured to emit light of a second color, third sub-pixels configured to emit light of a third color, and fourth sub-pixels configured to emit light of a fourth color. A first subset of the plurality of pixels may each include one of the first sub-pixels, one of the second sub-pixels, and one of the third sub-pixels, and a second subset of the plurality of pixels may each include one of the first sub-pixels, one of the second sub-pixels, and one of the fourth sub-pixels. Resolutions of the third sub-pixels and the fourth sub-pixels may each be lower than resolutions of either of the first sub-pixels and the second sub-pixels.

According to the display and the electronic apparatus of certain of the above-described exemplary illustrations of the present disclosure, the pixels of the first subset and the pixels of the second substrate arranged alternately in at least one direction. Moreover, according to certain of the above-described exemplary illustrations, resolutions of the third sub-pixels and the fourth sub-pixels may each be lower than resolutions of either of the first sub-pixels and the second sub-pixels Therefore, power consumption is reduced and image quality is improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
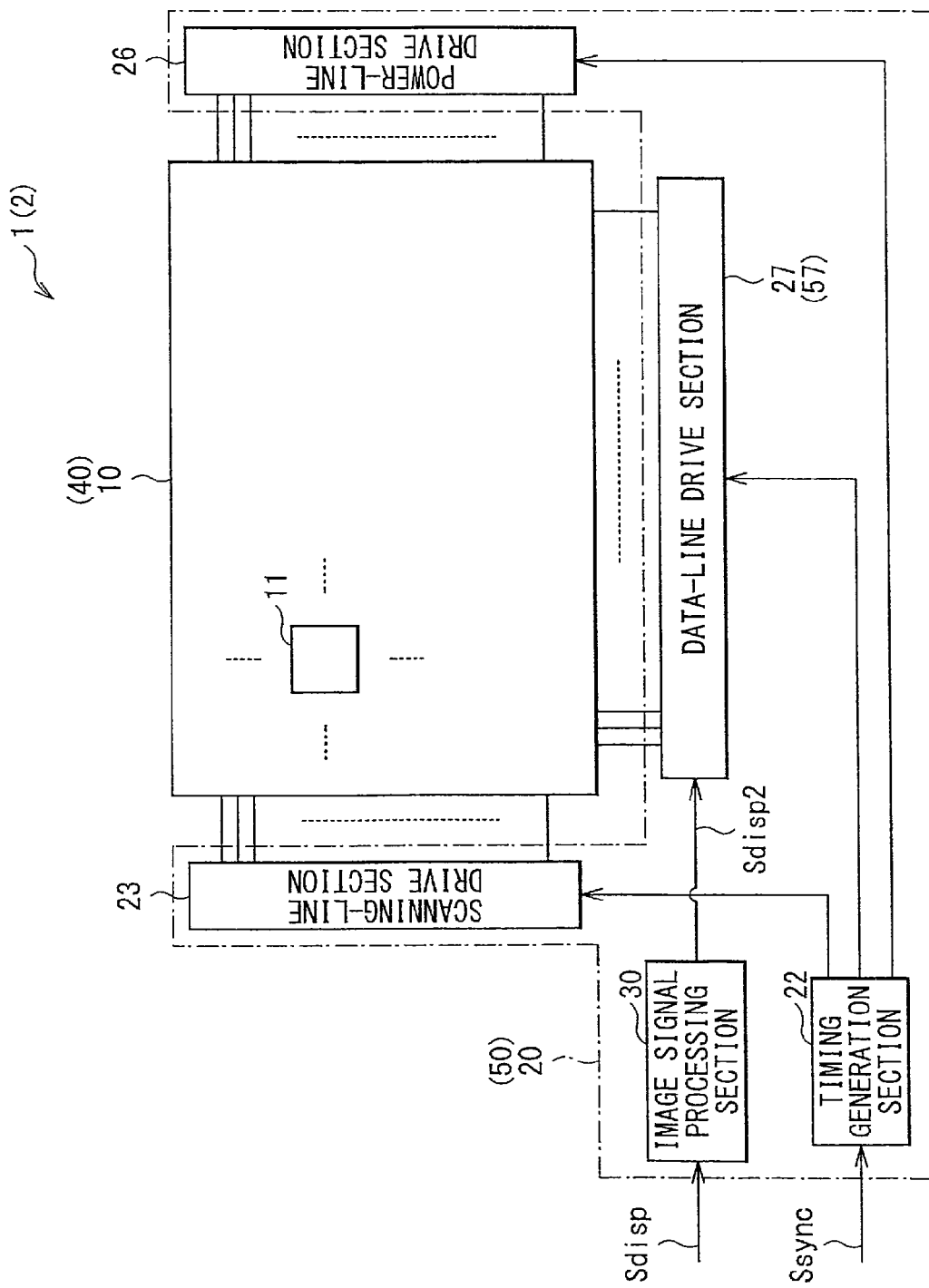
FIG. 1 is a block diagram illustrating a configuration example of a display according to an embodiment of the present disclosure.

Some embodiments of the present disclosure will be described below in detail with reference to the drawings. The description will be given in the following order.
1. First Embodiment
2. Second Embodiment
3. Application Examples 1. First Embodiment Configuration Example FIG. 1 illustrates a configuration example of a display according to a first embodiment. A display 1 is a display of an active-matrix type that uses an organic EL device.

The display 1 includes a display section 10 and a drive section 20. The drive section 20 includes an image signal processing section 30, a timing generation section 22, a scanning-line drive section 23, a power-line drive section 26, and a data-line drive section 27.

The display section 10 includes a plurality of sub-pixels 11 arranged therein. Specifically, four sub-pixels 11R, 11G, 11B, and 11W of red (R), green (G), blue (B), and white (W), respectively, are arranged in the display section 10. The term "sub-pixel 11" is used below as appropriate to refer to any one of the four sub-pixels 11R, 11G, 11B, and 11W.

Figure 2:
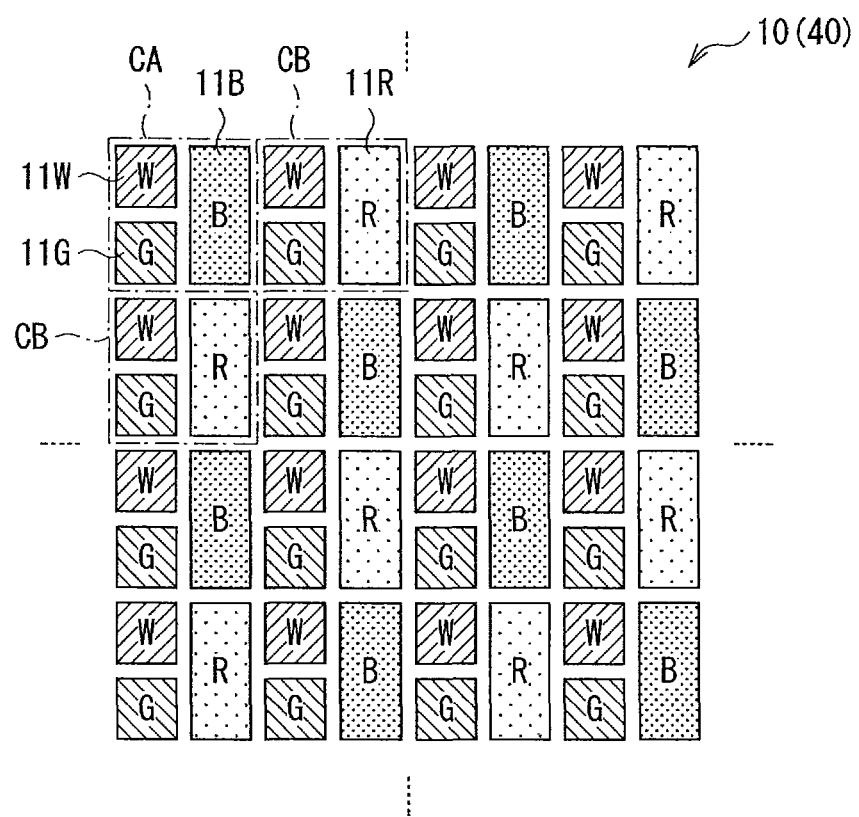
FIG. 2 is a schematic diagram illustrating an arrangement example of sub-pixels in a display section shown in FIG. 1.

FIG. 2 schematically illustrates an example of an arrangement of sub-pixels 11 in the display section 10. In FIG. 2, hatched portions represent openings WIN in the four sub-pixels 11R, 11G, 11B, and 11W. Cells CA each configured of three sub-pixels 11W, 11G, and 11B and cells CB each configured of three sub-pixels 11W, 11G, and 11R are arranged side by side in the display section 10. In other words, the cell CA is configured by not including the red sub-pixel 11R in the sub-pixels 11 of the four colors, and the cell CB is configured by not including the blue sub-pixel 11B in the sub-pixels 11 of the four colors. In this example, the sub-pixel 11W of white (W) is arranged on the upper left, the sub-pixel 11G of green (G) is arranged on the lower left, and the sub-pixel 11B of blue (B) is arranged on the right in the cell CA. In a similar way, in this example, the sub-pixel 11W of white (W) is arranged on the upper left, the sub-pixel 11G of green (G) is arranged on the lower left, and the sub-pixel 11R of red (R) is arranged on the right in the cell CB. Thus, in the display section 10, the number of the sub-pixels 11R and 11B is smaller than the number of the sub-pixels 11W and 11G, and the openings WIN in the sub-pixels 11R and 11B are larger than the openings WIN in the sub-pixels 11W and 11G.

As shown in FIG. 2, the cells CA and the cells CB are arranged alternately in a column direction (a vertical direction) and are arranged alternately in a row direction (a horizontal direction). Therefore, the white sub-pixels 11W and the green sub-pixels 11G are arranged alternately in the column direction. The red sub-pixels 11R and the blue sub-pixels 11B are arranged alternately in the column direction and are arranged alternately in the row direction. In other words, an arrangement pattern of the sub-pixels 11R and an arrangement pattern of the sub-pixels 11B in the display section 10 each form a checkerboard-like pattern.

Figure 3:
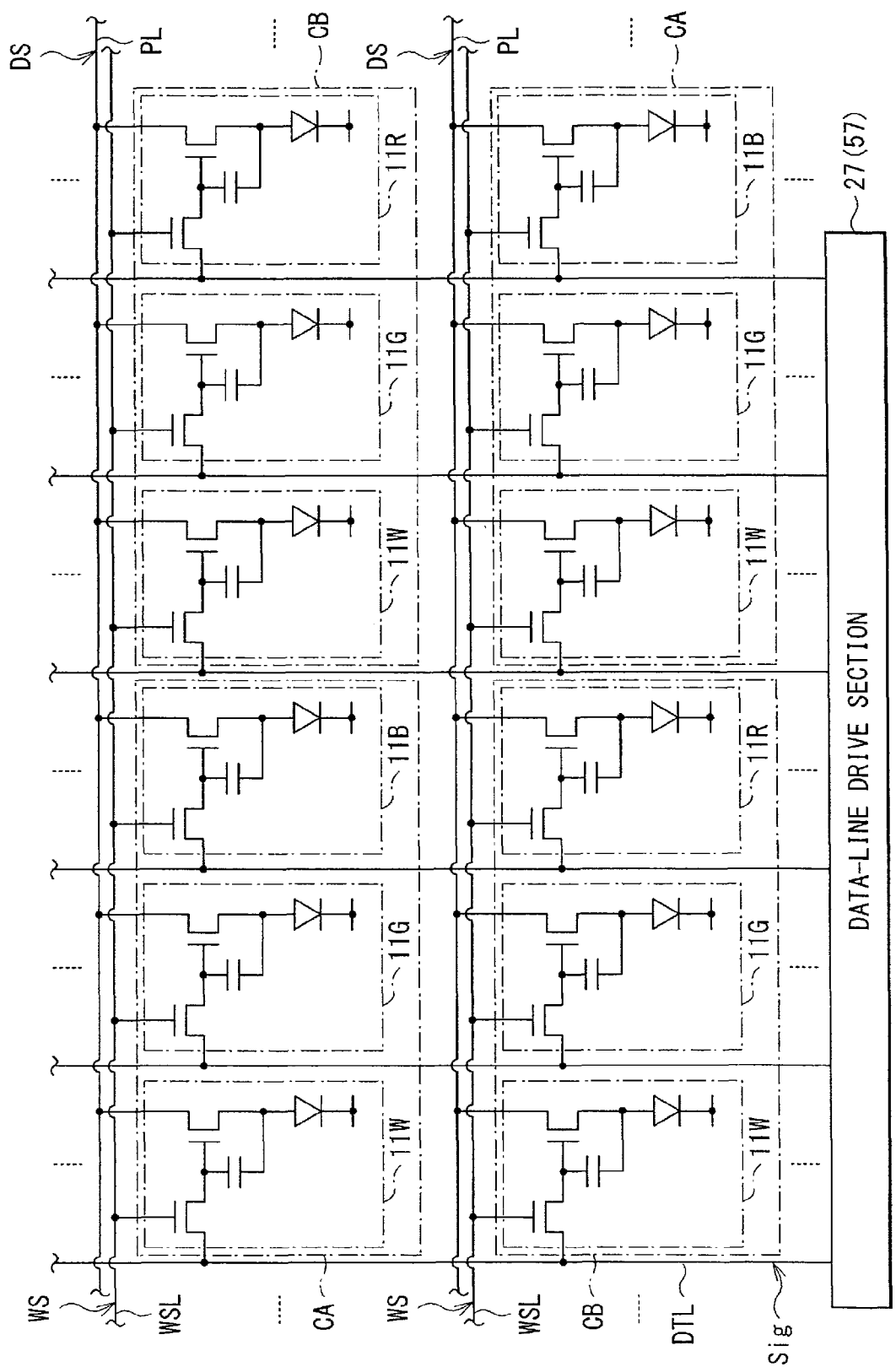
FIG. 3 is a circuit diagram illustrating a configuration example of the display section shown in FIG. 1.

FIG. 3 illustrates an example of a circuit configuration in the display section 10. The display section 10 includes a plurality of scanning lines WSL extending in the row direction, a plurality of power lines PL extending in the row direction, and a plurality of data lines DTL extending in the column direction. One end of the data line DTL is connected to the data-line drive section 27. Although not illustrated, one end of the scanning line WSL is connected to the scanning-line drive section 23, and one end of the power line PL is connected to the power-line drive section 26. Each sub-pixel 11 is arranged at an intersection of the scanning line WSL and the data line DTL. The sub-pixels 11W, 11G, and 11B belonging to one cell CA are connected to the same scanning line WS and to the same power line PL, and are connected to data lines DTL different from one another. Similarly, the sub-pixels 11W, 11G, and 11R belonging to one cell CB are connected to the same scanning line WS and to the same power line PL, and are connected to data lines DTL different from one another.

Figure 4:
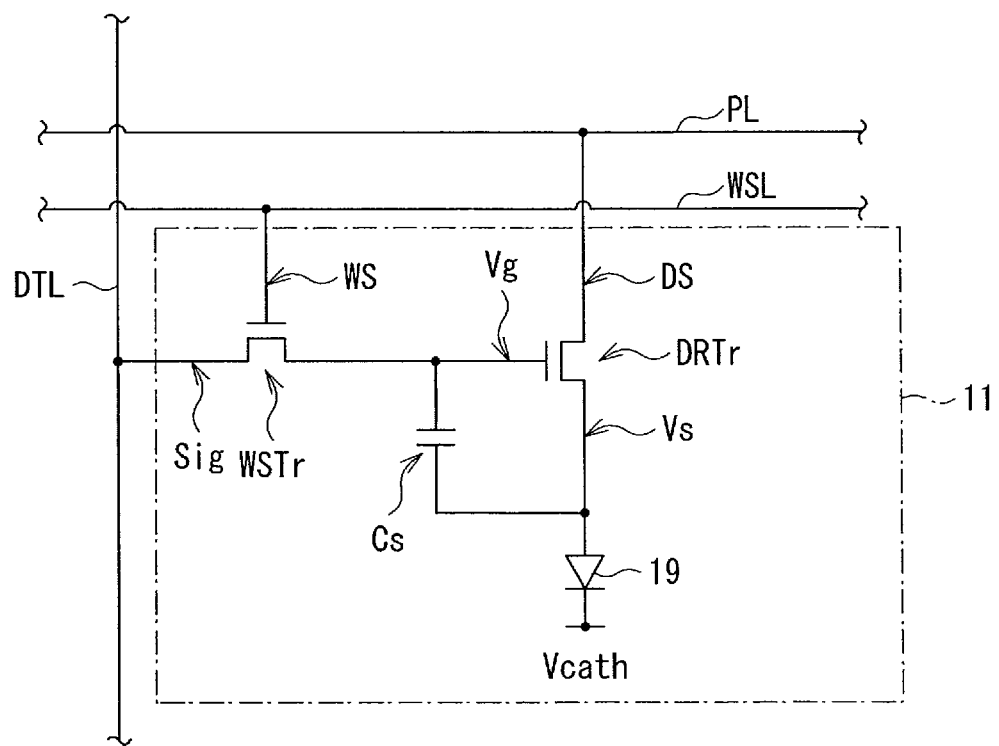
FIG. 4 is a circuit diagram illustrating a configuration example of the sub-pixel shown in FIG. 1.

FIG. 4 illustrates an example of a circuit configuration in the sub-pixel 11. The sub-pixel 11 includes a writing transistor WSTr, a driving transistor DRTr, a light-emitting device 19, and a capacitor Cs. In other words, in this example, the sub-pixel 11 has a so-called "2Tr1C" configuration configured of two transistors (the writing transistor WSTr and the driving transistor DRTr) and one capacitor Cs.

The writing transistor WSTr and the driving transistor DRTr may each be configured, for example, of a TFT (Thin Film Transistor) of an N-channel MOS (Metal Oxide Semiconductor). A gate of the writing transistor WSTr is connected to the scanning line WSL, a source of the writing transistor WSTr is connected to the data line DTL, and a drain of the writing transistor WSTr is connected to a gate of the driving transistor DRTr and one end of the capacitor Cs. The gate of the driving transistor DRTr is connected to the drain of the writing transistor WSTr and the one end of the capacitor Cs, the drain of the driving transistor DRTr is connected to the power line PL, and the source of the driving transistor DRTr is connected to the other end of the capacitor Cs and an anode of the light-emitting device 19.

The one end of the capacitor Cs is connected to the gate of the driving transistor DRTr etc., and the other end of the capacitor Cs is connected to the source of the driving transistor DRTr etc. The light-emitting device 19 is configured of an organic EL device. The anode of the light-emitting device 19 is connected to the source of the driving transistor DRTr and the other end of the capacitor Cs, and a cathode of the light-emitting device 19 is provided with a cathode voltage Vcath from the drive section 20.

Figure 5:
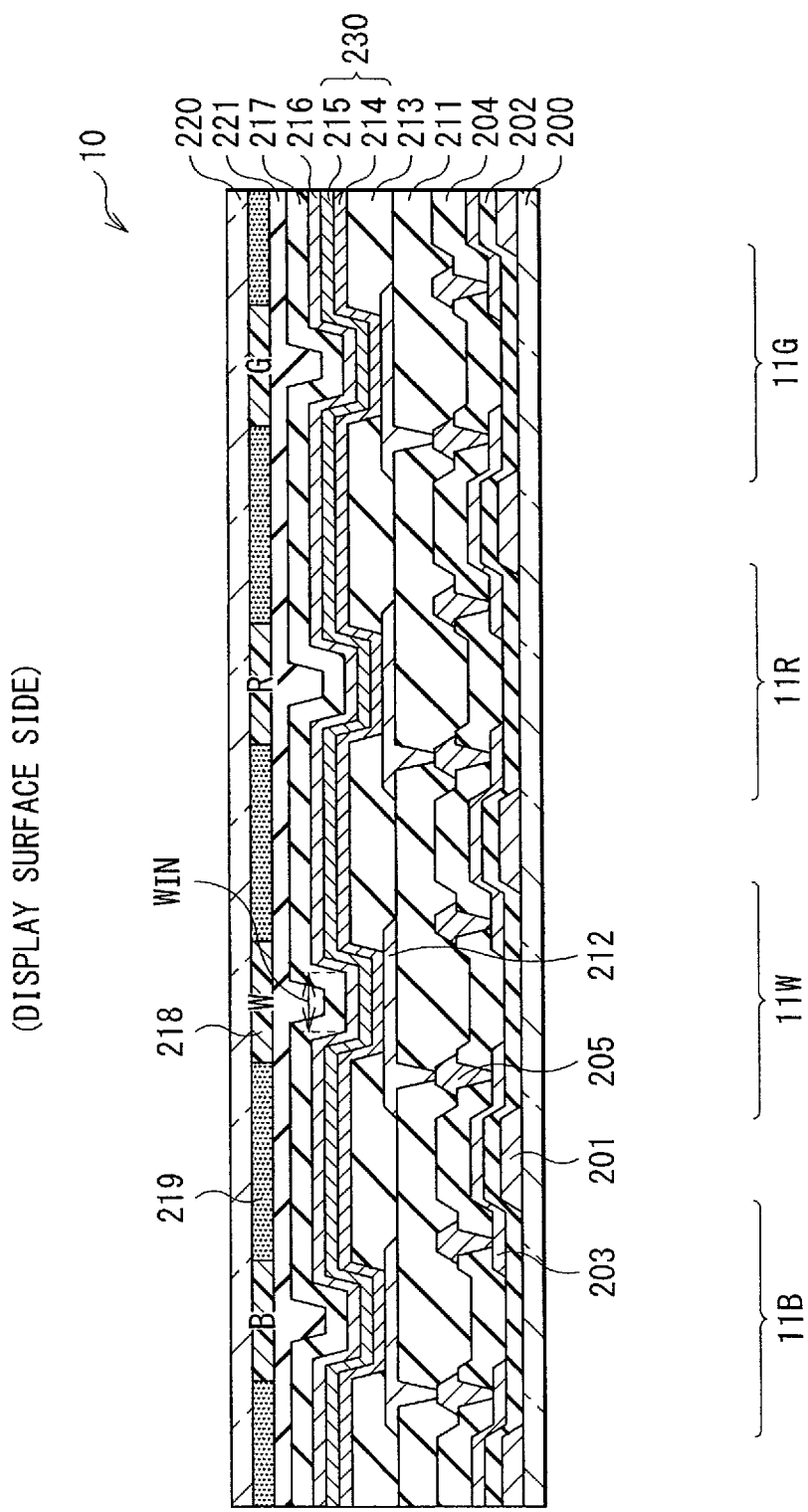
FIG. 5 is a cross-sectional view illustrating a configuration example of the display section shown in FIG. 1.

FIG. 5 illustrates a cross-sectional view of the display section 10. The display section 10 includes a transparent substrate 200, gates 201, polysilicon 203, anodes 212, a light-emitting layer 230, a cathode 216, and a color filter 218.

The transparent substrate 200 is a supporting substrate of the display section 10, and may be made, for example, of glass, plastic, and/or the like. The gate 201 is formed on the transparent substrate 200. The gate 201 may be made, for example, of molybdenum (Mo) and/or the like. An insulating layer 202 is formed on the transparent substrate 200 and the gate 201. The insulating layer 202 may be made, for example, of silicon oxide ($SiO_2$), silicon nitride ($SiN_x$), and/or the like. The polysilicon 203 is formed in a region corresponding to the gate 201, on the insulating layer 202. The gate 201 and the polysilicon 203 configure the driving transistor DRTr and/or the like. It is to be noted that, in this example, the transistor has a so-called bottom gate structure in which the polysilicon 203 is formed above the gate 201. However, the structure of the transistor is not limited thereto, and may be a so-called top gate structure in which the polysilicon is formed below the gate. An insulating layer 204 is formed on the polysilicon 203 and the insulating layer 202. The insulating layer 204 may be made, for example, of a material similar to that of the insulating layer 202. Further, a contact/wiring-line 205 is formed so as to run through the insulating layer 204 in part of the region in which the polysilicon 203 is formed. The wiring line 205 may be configured, for example, of three layers of [titanium (Ti)/aluminum (Al)/titanium (Ti)].

An insulating layer 211 is formed on the insulating layer 204. The insulating layer 211 may be made, for example, of polyimide, acrylic resin, and/or the like. The anode 212 is formed on the insulating layer 211. The anode 212 runs through the insulating layer 211, and is connected to the contact/wiring-line 205 connected to the source of the driving transistor DRTr. The anode 212 may be configured, for example, of ITO/Al alloy, Al alloy, ITO/Ag, ITO/Ag alloy, or the like. In other words, the anode 212 may desirably have light reflection properties. An insulating layer 213 is formed on the anode 212 and the insulating layer 211. The insulating layer 213 may be formed, for example, of a material similar to that of the insulating layer 211. The insulating layer 213 has openings WIN in part of the region in which the anode 212 is formed. The light-emitting layer 230 configured of a yellow light-emitting layer 214 and a blue light-emitting layer 215 is formed uniformly above the anode 212 and the insulating layer 213. The yellow light-emitting layer 214 is an organic EL layer that emits light of yellow (Y). The blue light-emitting layer 215 is an organic EL layer that emits light of blue (B). The yellow light-emitting layer 214 may be made of a material emitting yellow light, or may be made by doping a material emitting light of green (G) with a material emitting light of red (R). The blue light-emitting layer 215 may be made, for example, of a material emitting blue light. The cathode 216 is formed uniformly on the blue light-emitting layer 215. The cathode 216 is a transparent or semi-transparent electrode, and may be made, for example, of magnesium-silver (MgAg), IZO (registered trademark), and/or the like. When the cathode 216 is made of magnesium-silver, the cathode 216 is allowed to be semi-transparent by allowing the cathode 216 to have a thickness, for example, of about several nanometers. When the cathode 216 is made of IZO, the cathode 216 may be desirably formed with a thickness, for example, of several tens of nanometers to several thousands of nanometers. In other words, IZO is a transparent material, and therefore, the cathode 216 is allowed to have relatively-large thickness in order to achieve a desirably-low sheet resistance value. In this example, an insulating layer 217 is formed on the cathode 216. The insulating layer 217 may be made, for example, of silicon nitride ($SiN_x$) and/or the like. The insulating layer 217 is provided for preventing moisture from intruding into the light-emitting layer 230 and thereby preventing change in characteristics such as light emission efficiency. It is to be noted that the insulating layer 217 may not be provided when various issues resulting from the intrusion of moisture are solved using other technologies. A transparent substrate 220 is attached onto the insulating layer 217 with an insulating layer 221 made of resin for sealing in between. On a surface of the transparent substrate 220, the color filter 218, a black matrix 219, etc. are formed. The color filters 218 of red (R), green (G), blue (B), and white (W) are arranged on portions corresponding to the sub-pixels 11R, 11G, 11B, and 11W, respectively.

Such a configuration allows yellow light emitted from the yellow light-emitting layer 214 to be mixed with blue light emitted from the blue light-emitting layer 215, thereby generating white light, and the white light travels in a direction opposite from the transparent substrate 200 which serves as a supporting substrate. In other words, the light-emitting device 19 is of a so-called top emission type. The white light is allowed to travel outside from a display surface through the color filters 218. Specifically, red component, green component, and blue component are separated from the white light by the color filters 218 of red (R), green (G), and blue (B) in the sub-pixels 11R, 11G, and 11B, respectively, and the separated red, green, and blue components are allowed to travel outside from the sub-pixels 11R, 11G, and 11B, respectively. In the sub-pixel 11W, a color gamut of the white light is adjusted by the color filter 218 of white (W). It is to be noted that the color filter 218 of white (W) may not be provided in applications in which necessary image quality (color gamut) is not so high.

Figure 6A:
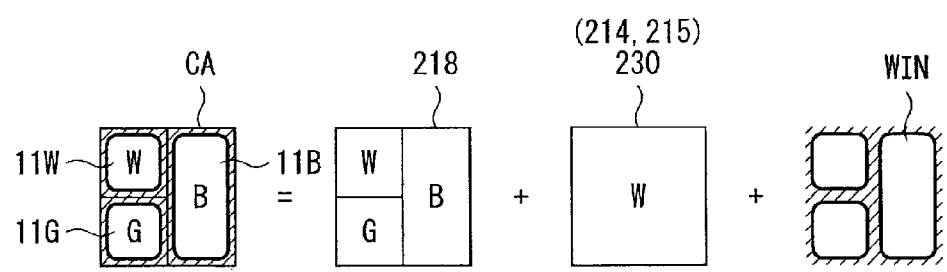
FIG. 6A is a schematic diagram illustrating a configuration example of a cell shown in FIG. 2.
Figure 6B:
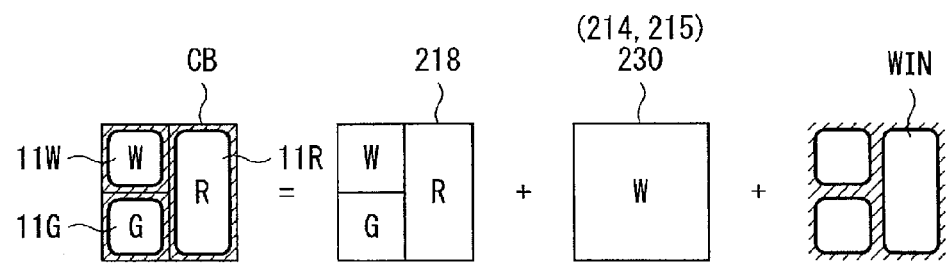
FIG. 6B is a schematic diagram illustrating a configuration example of another cell shown in FIG. 2.

FIG. 6A schematically illustrates a configuration of three sub-pixels 11 in the cell CA. FIG. 6B schematically illustrates a configuration of three sub-pixels 11 in the cell CB. As shown in FIG. 6A, in the three sub-pixels 11W, 11G, and 11B in the cell CA, light of white (W) emitted from the openings WIN in the light-emitting layer 230 (the yellow light-emitting layer 214 and the blue light-emitting layer 215) passes through the color filters 218 of white (W), green (G), and blue (B), respectively. Similarly, as shown in FIG. 6B, in the three sub-pixels 11W, 11G, and 11R in the cell CB, light of white (W) emitted from the openings WIN in the light-emitting layer 230 passes through the color filters 218 of white (W), green (G), and red (R), respectively.

Figure 7:
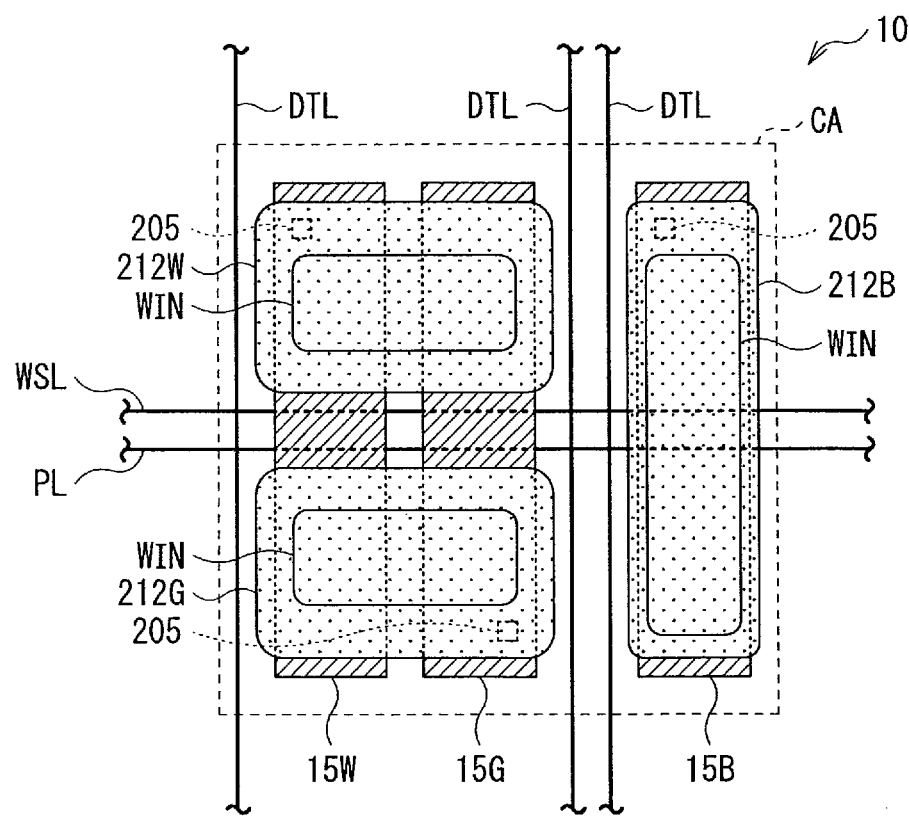
FIG. 7 is a plan view illustrating an example of an arrangement of anodes in the display section shown in FIG. 2.

FIG. 7 illustrates an arrangement of the anodes 212 in the cell CA. Three circuit regions 15W, 15G, and 15B and three anodes 212W, 212G, and 212B are provided in the cell CA.

In the circuit region 15W, devices (the writing transistor WSTr, the driving transistor DRTr, and the capacitor Cs) other than the light-emitting device 19 in the sub-pixel 11W are arranged. Similarly, devices other than the light-emitting device 19 in the sub-pixel 11G are arranged in the circuit region 15G, and devices other than the light-emitting device 19 in the sub-pixel 11B are arranged in the circuit region 15B. The writing transistors WSTr, the driving transistors DRTr, and the capacitor Cs are laid out in a similar manner in each of the circuit regions 15W, 15G, and 15B. In this example, the layout in the circuit region 15G is obtained by rotating the layout in the circuit regions 15W and 15B by 180 degrees and modifying a connection part of the scanning line WSL and the power line PL. It is to be noted that the layout in the circuit region 15G may be obtained by reversing upside-down the layout in the circuit regions 15W and 15B and modifying the connection part of the wiring lines, or may be a layout totally different from the layout in the circuit regions 15W and 15B. However, by using the same layout in a rotated or reversed manner, efficiency in layout operation is improved. In this example, the three circuit regions 15W, 15G, and 15B extend in the extending direction (the column direction) of the data line DTL, and are arranged side by side in a direction (the row direction) orthogonal to the extending direction of the data line DTL, in the cell CA. Specifically, in this example, one data line DTL, the circuit region 15W, the circuit region 15G, two data lines DTL, and the circuit region 15B are arranged in order from left to right in the cell CA. By providing the circuit regions 15 to extend in the column direction in such a manner, for example, a channel length (L) of the driving transistor DRTr is increased. Accordingly, variations in the characteristics of the sub-pixel 11 are suppressed.

Anodes 212W, 212G, and 212B are the anodes 212 in the sub-pixels 11W, 11G, and 11B, respectively. The anodes 212W, 212G, and 212B are connected to the sources of the driving transistors DRTr formed in the circuit regions 15W, 15G, and 15B, respectively, via the contacts 205. In the cell CA, the anode 212W, the anode 212G, and the anode 212B are arranged on the upper left, on the lower left, and on the right, respectively. The anodes 212W, 212G, and 212B are arranged so as not to overlap with the data lines DTL. Further, the light-emitting layer 230 emits white light from the openings WIN on the anodes 212W, 212G, and 212B.

The description above is related to the cell CA, however, the same is applicable to the cell CB. Specifically, three circuit regions 15W, 15G, and 15R and three anodes 212W, 212G, and 212R are provided in the cell CB. Devices other than the light-emitting device 19 in the sub-pixel 11R are arranged in the circuit region 15R. The anode 212R is the anode 212 in the sub-pixel 11R. One data line DTL, the circuit region 15W, the circuit region 15G, two data lines DTL, and the circuit region 15R are arranged in order from left to right in the cell CB. Further, in the cell CB, the anodes 212W, 212G, and 212R are arranged on the upper left, on the lower left, and on the right, respectively. The anodes 212W, 212G, and 212R are arranged so as not to overlap with the data lines DTL.

In FIG. 1, the image signal processing section 30 performs processing such as RGBW conversion and gamma conversion on an image signal Sdisp supplied from the outside, thereby generating an image signal Sdisp2. The image signal Sdisp is an RGB signal having luminance information I of red (R), green (G), and blue (B).

Figure 8:
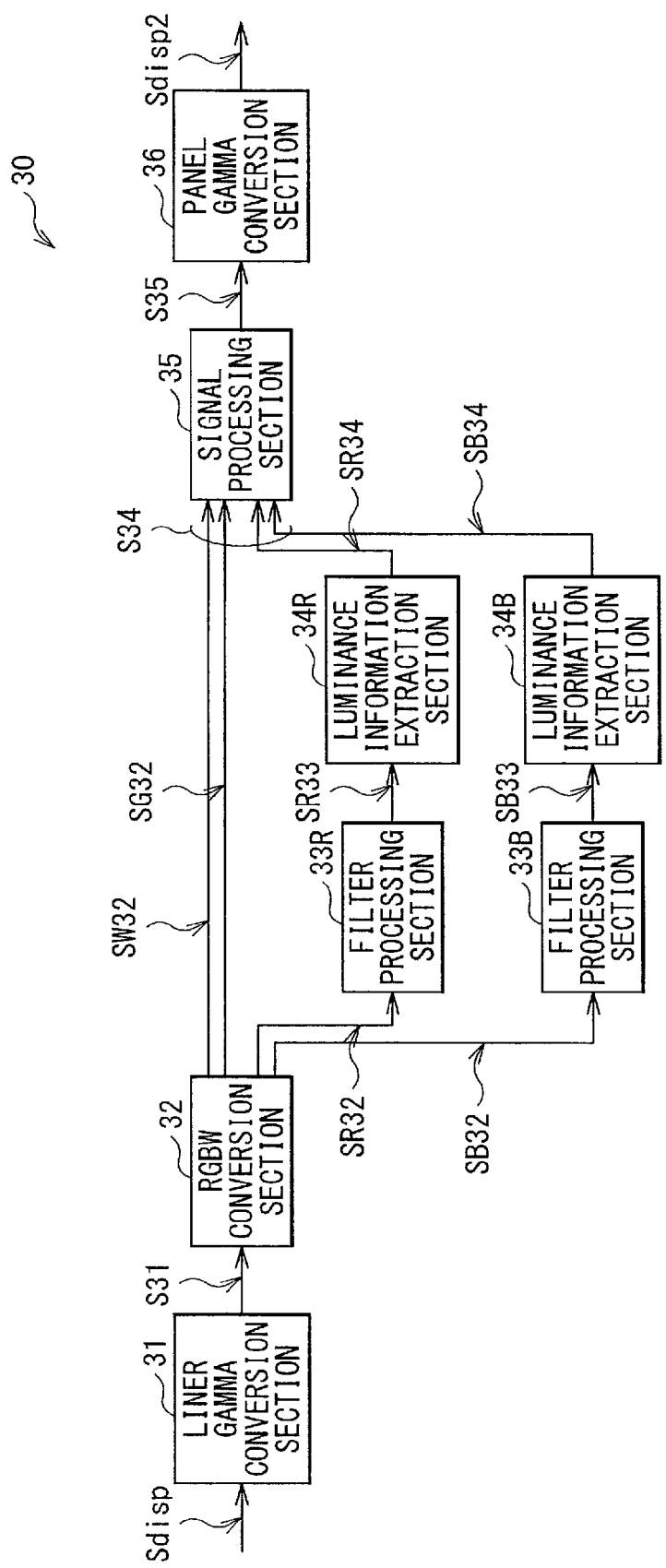
FIG. 8 is a block diagram illustrating a configuration example of an image signal processing section shown in FIG. 1.

FIG. 8 illustrates a configuration example of the image signal processing section 30. The image signal processing section 30 includes a linear gamma conversion section 31, an RGBW conversion section 32, filter processing sections 33R and 33B, luminance information extraction sections 34R and 34B, a signal processing section 35, and a panel gamma conversion section 36.

The linear gamma conversion section 31 converts the inputted image signal Sdisp into an image signal S31 having linear gamma characteristics. Specifically, the image signal supplied from the outside has non-linear gamma characteristics in consideration of characteristics of a general display. Therefore, the linear gamma conversion section 31 converts such non-linear gamma characteristics into linear gamma characteristic in order to allow the processing in the RGBW conversion section 32, the signal processing section 35, and the like to be easy. The gamma conversion section 31 may have, for example, a look-up table and may perform such gamma conversion with the use of the look-up table.

The RGBW conversion section 32 performs RGBW conversion on the image signal S31. Specifically, the RGBW conversion section 32 converts the RGB signal having luminance information I of red, green, and blue into an RGBW signal having luminance information I of red (R), green (G), blue (B), and white (W). Further, the RGBW conversion section 32 outputs the luminance information I of red (R), green (G), blue (B), and white (W) as signals SR32, SG32, SB32, and SW32, respectively.

The filter processing section 33R performs filter processing on the signal SR32. In this example, the filter processing section 33R is configured of a FIR (Finite Impulse Response) filter that serves as a low-pass filter. The filter processing section 33R creates a map of the luminance information I of red (R) based on the inputted signal SR32, and performs the filter processing on the map. Further, the filter processing section 33R outputs the luminance information I which has been subjected to the filter processing as a signal SR33.

The filter processing section 33B performs filter processing on the signal SB32. The filter processing section 33B is configured of a FIR filter that serves as a low-pass filter, as with the filter processing section 33R. The filter processing section 33B creates a map of the luminance information I of blue (B) based on the inputted signal SB32, and performs the filter processing on the map. Further, the filter processing section 33B outputs the luminance information I which has been subjected to the filter processing as a signal SB33.

The luminance information extraction section 34R extracts luminance information I to be displayed on the display section 10 from the luminance information I of red (R) included in the signal SR33.

The luminance information extraction section 34B extracts luminance information I to be displayed on the display section 10 from the luminance information I of blue (B) included in the signal SB33.

Figure 9A:
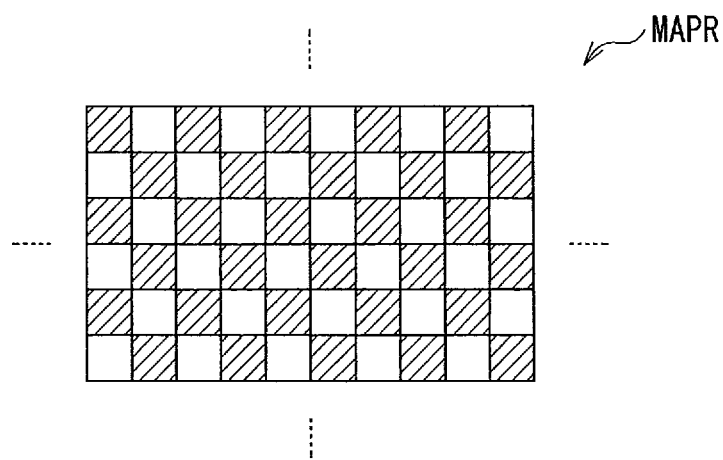
FIG. 9A is an explanatory diagram illustrating an operation example of a luminance information extraction section shown in FIG. 8.
Figure 9B:
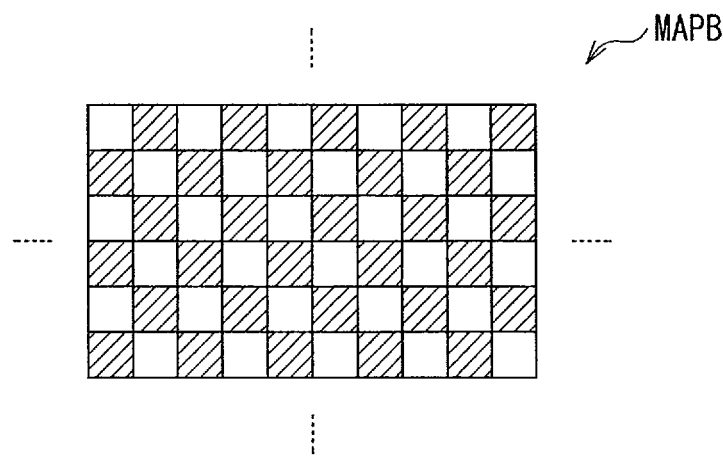
FIG. 9B is another explanatory diagram illustrating an operation example of the luminance information extraction section shown in FIG. 8.

FIG. 9A illustrates an operation example of the luminance information extraction section 34R, and FIG. 9B illustrates an operation example of the luminance information extraction section 34B. The luminance information extraction section 34R generates a map MAPR of the luminance information I of red (R) based on the signal SR33. The luminance information extraction section 34R extracts, from the map MAPR, the luminance information I (the hatched portion in FIG. 9A) at coordinates in accordance with the arrangement pattern (FIG. 2) of the red sub-pixels 11R in the display section 10 as shown in FIG. 9A. In other words, the luminance information extraction section 34R extracts the luminance information I so as to allow the extracted pattern to have a checkerboard-like pattern. The luminance information extraction section 34R outputs the extracted luminance information I as a signal SR34. Similarly, the luminance information extraction section 34B generates a map MAPB of the luminance information I of blue (B) based on the signal SB33. The luminance information extraction section 34B extracts, from the map MAPB, the luminance information I (the hatched portion in FIG. 9B) at coordinates in accordance with the arrangement pattern (FIG. 2) of the blue sub-pixels 11B in the display section 10. The luminance information extraction section 34B outputs the extracted luminance information I as a signal SB34.

In such a manner, the filter processing sections 33R and 33B perform the filter processing on the luminance information I in the image signal processing section 30. The luminance information extraction sections 34R and 34B extract the luminance information I to be displayed on the display section 10 from the luminance information I which has been subjected to the filter processing. Accordingly, in the display 1, resolution of images (acutance of edges) related only to red and blue components is decreased, and the extracted luminance information I of red and blue represents the positions of the sub-pixels 11R and 11B in the display section 10.

The signal processing section 35 performs predetermined signal processing on an image signal S34 configured of the signals SW32, SG32, SR34, and SB34, and outputs the resultant of the processing as an image signal S35. Examples of the predetermined signal processing may include so-called color gamut conversion in which color gamut and color temperature expressed by the image signal S34 are converted into color gamut and color temperature in the display section 10.

The panel gamma conversion section 36 converts the image signal S35 having the linear gamma characteristics into an image signal S36 having non-linear gamma characteristics corresponding to the characteristics of the display section 10 (panel gamma conversion). The panel gamma conversion section 36 may have, for example, a look-up table and may perform such gamma conversion with the use of the look-up table, as with the linear gamma conversion section 31.

In FIG. 1, the timing generation section 22 is a circuit that supplies a control signal to each of the scanning-line drive section 23, the power-line drive section 26, and the data-line drive section 27 based on the synchronization signal Ssync supplied from the outside, and controls the scanning-line drive section 23, the power-line drive section 26, and the data-line drive section 27 to operate in synchronization with one another.

The scanning-line drive section 23 sequentially applies scanning signals WS to the plurality of scanning lines WSL in accordance with the control signal supplied from the timing generation section 22, thereby sequentially selecting the sub-pixels 11.

The power-line drive section 26 sequentially applies power signals DS to the plurality of power lines PL in accordance with the control signal supplied from the timing generation section 22, thereby controlling light emission operation and light extinction operation of the sub-pixels 11. The power signal DS varies between a voltage Vccp and a voltage Vini. As will be described later, the voltage Vini is a voltage for initializing the sub-pixel 11, and the voltage Vccp is a voltage for supplying a current to the driving transistor DRTr and thereby allowing the light-emitting device 19 to emit light.

The data-line drive section 27 generates a signal Sig in accordance with the image signal Sdisp2 supplied from the image signal processing section 30 and the control signal supplied from the timing generation section 22, and applies the generated signal Sig to each data line DTL. The signal Sig includes a pixel voltage Vsig instructing light-emission luminance in each sub-pixel 11 and a voltage Vofs for performing Vth correction which will be described later.

Such a configuration allows the drive section 20 to perform correction (the Vth correction and μ (mobility) correction) for suppressing influence of device variations in the driving transistors DRTr on image quality of the sub-pixels 11, and to write the pixel voltage Vsig onto the sub-pixels 11, as will be described later. Thereafter, the light-emitting device 19 in the sub-pixel 11 emits light with luminance in accordance with the written pixel voltage Vsig.

In this example, the sub-pixels 11G, 11B, and 11R correspond to specific but not limitative examples of "first pixel", "second pixel", and "third pixel" of the present disclosure, respectively. The sub-pixel 11W corresponds to a specific but not limitative example of "non-basic color pixel" in the present disclosure. The sub-pixels 11G, 11W, and 11B configuring the cell CA correspond to specific but not limitative example of "first pixel set" in the present disclosure. The sub-pixels 11G, 11W, and 11R configuring the cell CB correspond to specific but not limitative example of "second pixel set" in the present disclosure. The cell CA corresponds to a specific but not limitative example of "first pixel cell" in the present disclosure. The cell CB corresponds to a specific but not limitative example of "second pixel cell" in the present disclosure. The data line DTL corresponds to a specific but not limitative example of "signal line" in the present disclosure. The signal Sig corresponds to a specific but not limitative example of "pixel signal" in the present disclosure. The driving transistor DRTr corresponds to a specific but not limitative example of "transistor" in the present disclosure.

[Operation and Function]

Next, operation and function of the display 1 according to the present embodiment will be described.

[General Operation Outline]

First, outline of general operation of the display 1 will be described referring to FIG. 1. The image signal processing section 30 performs processing such as RGBW conversion and gamma conversion on the image signal Sdisp supplied from the outside, and generates the image signal Sdisp2. The timing generation section 22 supplies a control signal to each of the scanning-line drive section 23, the power-line drive section 26, and the data-line drive section 27 based on the synchronization signal Ssync supplied from the outside, and controls the scanning-line drive section 23, the power-line drive section 26, and the data-line drive section 27 to operate in synchronization with one another. The scanning-line drive section 23 sequentially applies the scanning signals WS to the plurality of scanning lines WSL in accordance with the control signal supplied from the timing generation section 22, thereby sequentially selecting the sub-pixels 11. The power-line drive section 26 sequentially applies the power signals DS to the plurality of power lines PL in accordance with the control signal supplied from the timing generation section 22, thereby controlling light emission operation and light extinction operation of the sub-pixels 11. The data-line drive section 27 generates the signal Sig that includes the pixel voltage Vsig corresponding to the luminance in each sub-pixel 11 and the voltage Vofs for performing the Vth correction, and applies the generated signal Sig to each data line DTL, in accordance with the image signal Sdisp2 supplied from the image signal processing section 30 and the control signal supplied from the timing generation section 22. The display section 10 displays images based on the scanning signal WS, the power signal DS, and the signal Sig that are supplied from the drive section 20.

[Detailed Operation]

Next, detailed operation of the display 1 will be described.

Figure 10:
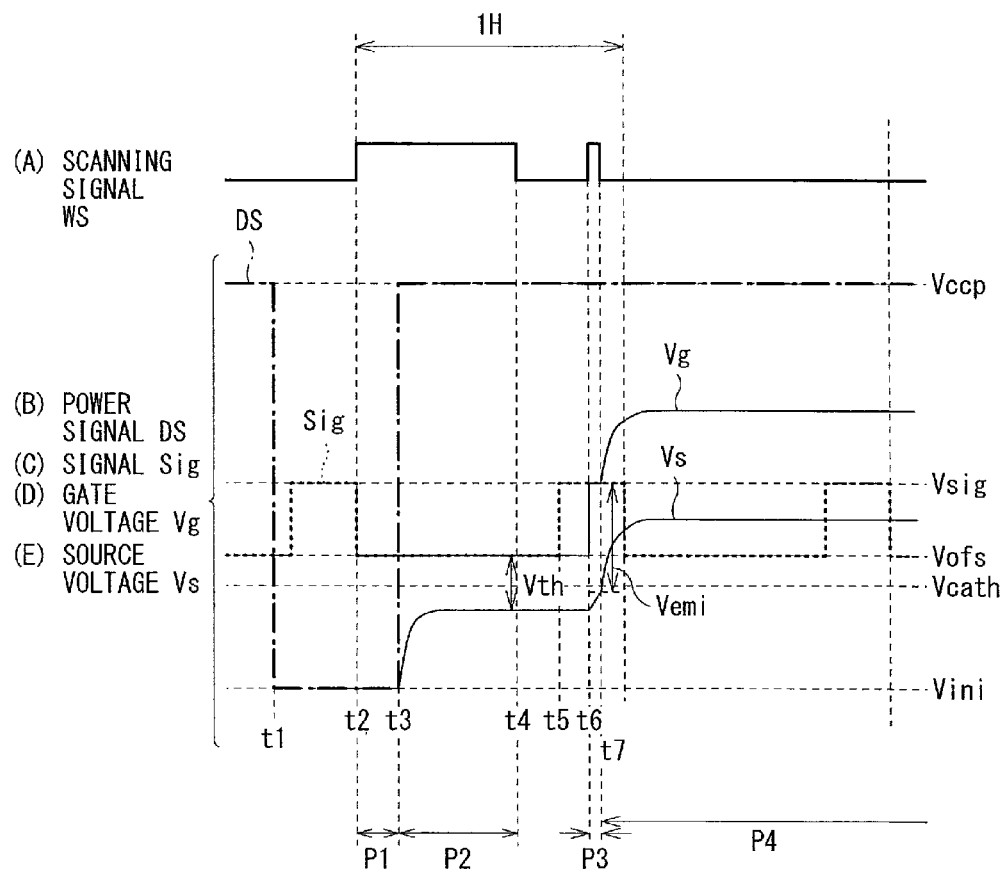
FIG. 10 is a timing waveform diagram illustrating an operation example of the display shown in FIG. 1.

FIG. 10 illustrates a timing diagram of display operation in the display 1. FIG. 10 illustrates an operation example of display drive with respect to one targeted sub-pixel 11. In FIG. 10, Parts (A), (B), (C), (D), and (E) show waveforms of the scanning signal WS, the power signal DS, the signal Sig, the gate voltage Vg of the driving transistor DRTr, and the source voltage Vs of the driving transistor DRTr, respectively.

In one horizontal period (1H), the drive section 20 initializes the sub-pixel 11 (an initialization period P1), performs the Vth correction for suppressing the influence of the device variations in the driving transistors DRTr on image quality (a Vth correction period P2), writes the pixel voltage Vsig onto the sub-pixel 11, and performs the μ (mobility) correction which is different from the Vth correction (a writing/μ-correction period P3). Thereafter, the light-emitting device 19 in the sub-pixel 11 emits light with luminance in accordance with the written pixel voltage Vsig (a light emission period P4). The details thereof will be described below.

First, at a timing t1 prior to the initialization period P1, the power-line drive section 26 allows the power signal DS to vary from the voltage Vccp to the voltage Vini (Part (B) in FIG. 10). Accordingly, the driving transistor DRTr is turned on, and the source voltage Vs of the driving transistor DRTr is set at the voltage Vini (Part (E) in FIG. 10).

Next, in a period from a timing t2 to a timing t3 (the initialization period P1), the drive section 20 initializes the sub-pixel 11. Specifically, at the timing t2, the data-line drive section 27 sets the signal Sig at the voltage Vofs (Part (C) in FIG. 10), and the scanning-line drive section 23 allows the voltage of the scanning signal WS to vary from a low level to a high level (Part (A) in FIG. 10). Accordingly, the writing transistor WSTr is turned on, and the gate voltage Vg of the driving transistor DRTr is set at the voltage Vofs (Part (D) in FIG. 10). Thus, the gate-source voltage Vgs (=Vofs−Vini) of the driving transistor DRTr is set at a voltage higher than a threshold voltage Vth of the driving transistor DRTr, and the sub-pixel 11 is initialized.

Subsequently, in a period from a timing t3 to a timing t4 (the Vth correction period P2), the drive section 20 performs the Vth correction. Specifically, at the timing t3, the power-line drive section 26 allows the power signal DS to vary from the voltage Vini to the voltage Vccp (Part (B) in FIG. 10). Accordingly, the driving transistor DRTr operates in a saturated region, a current Ids flows from the drain to the source, and the source voltage Vs is increased (Part (E) in FIG. 10). At this time, in this example, the source voltage Vs is lower than the voltage Vcath of the cathode of the light-emitting device 19. Therefore, the light-emitting device 19 retains a reverse-bias state, and a current is not flown into the light-emitting device 19. Since the gate-source voltage Vgs is decreased because of the increase in the source voltage Vs, the current Ids is decreased. Due to this negative feedback operation, the current Ids converges toward "0" (zero). In other words, the gate-source voltage Vgs of the driving transistor DRTr converges so as to be equal to the threshold voltage Vth of the driving transistor DRTr (Vgs=Vth).

Subsequently, at the timing t4, the scanning-line drive section 23 allows the voltage of the scanning signal WS to vary from the high level to the low level (Part (A) in FIG. 10). Accordingly, the writing transistor WSTr is turned off. At a timing t5, the data-line drive section 27 sets the signal Sig at the pixel voltage Vsig (Part (C) in FIG. 10).

Subsequently, in a period from a timing t6 to a timing t7 (the writing/μ-correction period P3), the drive section 20 writes the pixel voltage Vsig onto the sub-pixel 11 and performs the μ correction on the sub-pixel 11. Specifically, at the timing t6, the scanning-line drive section 23 allows the voltage of the scanning signal WS to vary from the low level to the high level (Part (A) in FIG. 10). Accordingly, the writing transistor WSTr is turned on, and the gate voltage Vg of the driving transistor DRTr is increased from the voltage Vofs to the pixel voltage Vsig (Part (D) in FIG. 10). At this time, the gate-source voltage Vgs of the driving transistor DRTr becomes higher than the threshold voltage Vth (Vgs>Vth), and the current Ids flows from the drain to the source. Therefore, the source voltage Vs of the driving transistor DRTr is increased (Part (E) in FIG. 10). Due to such negative feedback operation, the influence of the device variations in the driving transistors DRTr is suppressed (the μ correction), and the gate-source voltage Vgs of the driving transistor DRTr is set to a voltage Vemi in accordance with the pixel voltage Vsig. It is to be noted that a method of such μ correction is described, for example, in Japanese Unexamined Patent Application Publication No. 2006-215213.

Subsequently, in a period beginning from a timing t7 (the light emission period P4), the drive section 20 allows the sub-pixel 11 to emit light. Specifically, at the timing t7, the scanning-line drive section 23 allows the voltage of the scanning signal WS to vary from the high level to the low level (Part (A) in FIG. 10). Accordingly, the writing transistor WSTr is turned off, and the gate of the driving transistor DRTr becomes in a floating state. Therefore, a voltage between terminals of the capacitor Cs, that is, the gate-source voltage Vgs of the driving transistor DRTr is maintained thereafter. The source voltage Vs of the driving transistor DRTr is increased (Part (E) in FIG. 10) as the current Ids flows into the driving transistor DRTr, and the gate voltage Vg of the driving transistor DRTr is also increased accordingly (Part (D) in FIG. 10). When the source voltage Vs of the driving transistor DRTr becomes higher than the sum (Vel+Vcath) of a threshold voltage Vel of the light-emitting device 19 and the voltage Vcath, a current flows between the anode and the cathode of the light-emitting device 19, and thereby, the light-emitting device 19 emits light. In other words, the source voltage Vs is increased by an amount in accordance with the device variations in the light-emitting devices 19, and the light-emitting device 19 emits light.

Subsequently, it transfers from the light emission period P4 to the writing period P1 after a predetermined period (one frame period) elapses in the display 1. The drive section 20 drives the display section 10 so as to repeat the above-described series of operation.

[Concerning Image Quality and Power Consumption]

Some techniques are used in order to reduce power consumption in the display 1. Description will be given in detail below of those techniques referring to some comparative examples.

Comparative Example 1

As shown in FIG. 2, in the display 1, the cell CA is configured by not including the sub-pixel of red (R) in the sub-pixels of the four colors, and the cell CB is configured by not including the sub-pixel of blue (B) in the sub-pixels of the four colors. Therefore, power consumption is reduced while suppressing degradation in image quality in the display 1 compared to a display 1R which will be described below.

Figure 11:
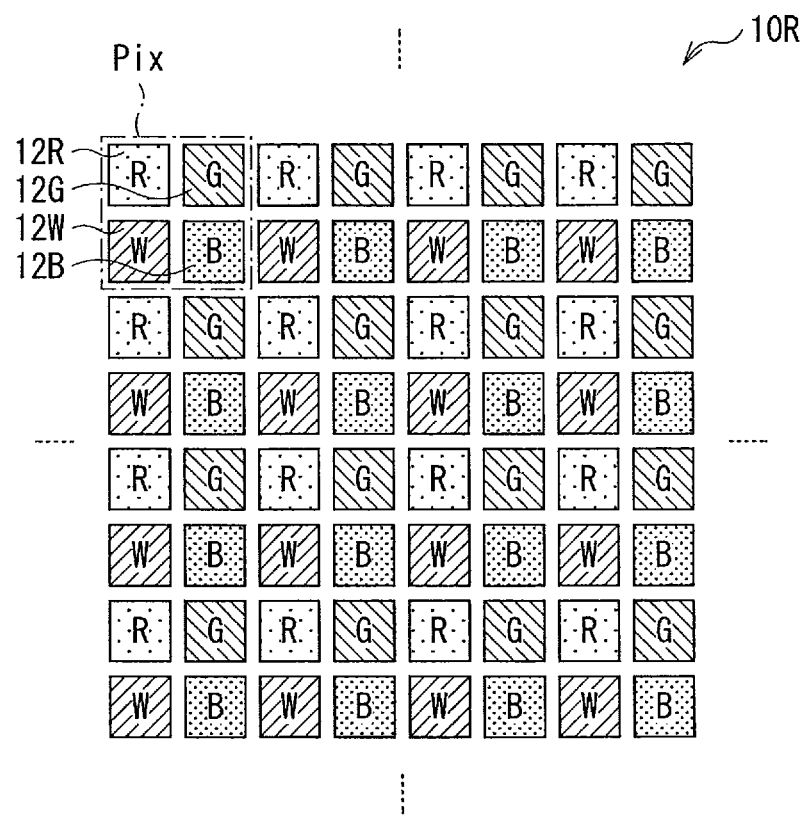
FIG. 11 is a schematic diagram illustrating an arrangement of sub-pixels in a display section according to a comparative example.

FIG. 11 illustrates a configuration example of a display section 10R in the display 1R according to Comparative example 1. The display section 10R includes a plurality of pixels Pix arranged in a matrix. Each pixel Pix includes four sub-pixels 12 (12R, 12G, 12B, and 12W) of red (R), green (G), blue (B), and white (W). In this example, these four sub-pixels 12R, 12G, 12B, and 12W are arranged in two rows and two columns in the pixel Pix. Specifically, the sub-pixel 12R of red (R), the sub-pixel 12G of green (G), the sub-pixel 12W of white (W), and the sub-pixel 12B of blue (B) are arranged on the upper left, on the upper right, on the lower left, and on the lower right in the pixel Pix, respectively.

The pixel Pix (FIG. 11) according to Comparative example 1 corresponds to the cell CA or CB (FIG. 2) in the present embodiment. Specifically, the cell CA in the present embodiment corresponds to a pixel obtained by removing the red sub-pixel 12R from the pixel Pix according to Comparative example 1. The cell CB in the present embodiment corresponds to a pixel obtained by removing the blue sub-pixel 12B from the pixel Pix according to Comparative example 1.

Figure 12:
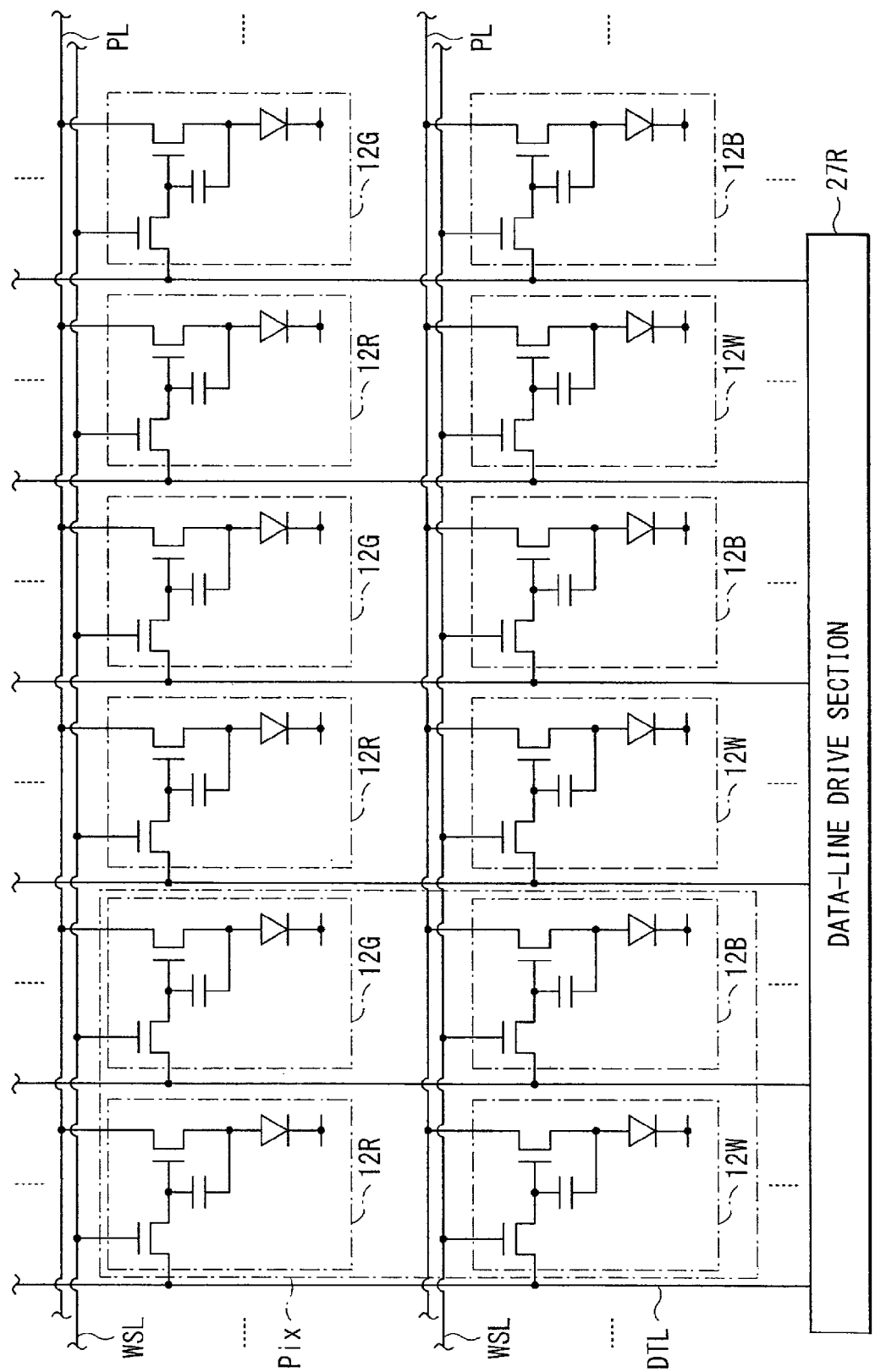
FIG. 12 is a circuit diagram illustrating a configuration example of a display section shown in FIG. 11.

FIG. 12 illustrates an example of a circuit configuration in the display section 10R according to Comparative example 1. In the display section 10R, the sub-pixel 12R and the sub-pixel 12G belonging to one pixel Pix are connected to the same scanning line WS (for example, the k-th scanning line WS(k)) and to the same power line PL (for example, the k-th power line PL(k)). Further, the sub-pixel 12W and the sub-pixel 12B belonging to that pixel Pix are connected to the same scanning line WS (for example, the (k+1)th scanning line WS(k+1)) and to the same power line PL (for example, the (k+1)th power line PL(k+1)).

Further, the sub-pixel 12R and the sub-pixel 12W belonging to one pixel Pix are connected to the same data line DTL (for example, the j-th data line DTL(j)), and the sub-pixel 12G and the sub-pixel 12B belonging to that pixel Pix are connected to the same data line DTL (for example, the (j+1)th data line DTL(j+1)).

In the display 1R according to Comparative example 1, when performing scanning drive, it is necessary to drive the sub-pixels 12R and 12G in a period different from a period in which the sub-pixels 12B and 12W are driven, in the four sub-pixels 12 configuring one pixel Pix. Specifically, for example, the sub-pixels 12R and 12G may be driven in a first half of one horizontal period, and the sub-pixels 12B and 12W may be driven in a second half of the one horizontal period. Therefore, it is necessary for the data-line drive section 27R to supply the pixel voltages Vsig to a larger number of sub-pixels 12, for example, in one frame period. In other words, drive frequency at the time of driving the data lines DTL is increased. Accordingly, power consumption may be increased.

Moreover, in the display 1R according to Comparative example 1, six wiring lines (two scanning lines WS, two power lines PL, and two data lines DTL) are necessary for one pixel Pix. Therefore, power to drive these wiring lines is necessary in the display 1R. Accordingly, power consumption may be increased.

Moreover, in the display 1R according to Comparative example 1, one pixel Pix includes four sub-pixels 12. Therefore, the number of the sub-pixels 12 in the display section 10R is increased. Accordingly, an area of each sub-pixel 12 is reduced, and therefore, the opening ratio is decreased. Specifically, for example, a size of the anode may be limited because of design rules related to anode intervals or the like, and a size of the opening WIN may be also limited because of design rules related to a distance between an edge of the anode and an edge of the opening WIN. Therefore, the opening WIN is not allowed to be large, and the opening ratio is decreased. In a case with such low opening ratio, current density in the light-emitting layer 230 for achieving the same light-emission luminance is higher and image quality may be degraded, compared to a case with high opening ratio. In other words, in the organic EL layer configuring the light-emitting layer 230, degradation with time (so-called screen burn-in) is caused more easily as the current density is higher, in general. Therefore, increase in current density may degrade image quality.

Moreover, in the display 1R according to Comparative example 1, the drive frequency is increased as described above. Therefore, it may be difficult to secure sufficient time for writing the pixel voltage Vsig onto the sub-pixel 12, and image quality may be degraded.

On the other hand, in the display 1 according to the present embodiment, as shown in FIGS. 2 and 3, the red sub-pixel 11R is not included to configure the cell CA, and the three sub-pixels 11W, 11G, and 11B belonging to one cell CA are connected to the same scanning line WSL and the like. Also, the blue sub-pixel 11B is not included to configure the cell CB, and the three sub-pixels 11W, 11G, and 11R belonging to one cell CB are connected to the same scanning line WSL and the like. Accordingly, the three sub-pixels 11W, 11G, and 11B belonging to the cell CA are driven together in one horizontal period. Similarly, the three sub-pixels 11W, 11G, and 11R belonging to the cell CB are driven together in one horizontal period. Therefore, it may be necessary for the data-line drive section 27, for example, only to supply the pixel voltages Vsig to the sub-pixels 11 of the number half of the number of the sub-pixels 12 in Comparative example 1 in one frame period. In other words, in the display 1, the drive frequency at the time of driving the data lines DTL is decreased, and therefore, power consumption is reduced.

Moreover, in the display 1 according to the present embodiment, five wiring lines (one scanning line WS, one power line PL, and three data lines DTL) for each of the cells CA and CB are necessary. In other words, the number of the wiring lines necessary in the display 1 according to the present embodiment is less than that in Comparative example 1 (in which six wiring lines are necessary). Therefore, drive power for these wiring lines can be smaller, and accordingly, power consumption is reduced.

Moreover, in the display 1 according to the present embodiment, the red sub-pixel 11R is not included to configure the cell CA, and the blue sub-pixel 11B is not included to configure the cell CB. Therefore, power consumption is reduced while suppressing degradation in image quality. Specifically, in the display 1, the number of the red sub-pixels 11R and the blue sub-pixels 11B is reduced in order to reduce power consumption as described above. Therefore, resolution of the sub-pixels 11R of red (R) and the sub-pixels 11B of blue (B) is decreased, compared to resolution of the sub-pixels 11W of white (W) and the sub-pixels 11G of green (G). However, it is known that human do not perceive degradation in image quality even when the resolution of so-called chromaticity components of red (R), blue (B), etc. is decreased. Specifically, when color is separated into luminance component and chromaticity component, human perceives degradation in image quality when the resolution of the luminance component is decreased, but does not perceive degradation in image quality much when the resolution of the chromaticity component is decreased. Out of the four colors (red, green, blue, and white) emitted by the sub-pixel 11, white (W) and green (G) largely contribute to the luminance component, and on the other hand, red (R) and blue (B) do not contribute much to the luminance component. In the display 1, the number of the red sub-pixels 11R and the blue sub-pixels 11B which contribute less to the luminance component is decreased as described above. Therefore, power consumption is reduced while suppressing degradation in image quality.

Moreover, in the display 1 according to the present embodiment, the number of the sub-pixels 11 is reduced. Therefore, each sub-pixel 11 is allowed to be larger, and the opening ratio in the sub-pixels 11R and 11B is allowed to be increased. Accordingly, degradation with time (so-called screen burn-in) in the light-emitting layer is suppressed, and therefore, image quality is improved. Moreover, the drive frequency is decreased as described above. Therefore, for example, sufficient time for writing the pixel voltage Vsig onto the sub-pixel 11 is secured. Accordingly, possibility of causing degradation in image quality is reduced.

Comparative Example 2

In the display 1, the cells CA and CB each include the white sub-pixel 11W as shown in FIG. 2. Therefore, power consumption is reduced and image quality is improved, compared to a display 1S according to Comparative example 2 which will be described below.

Figure 13:
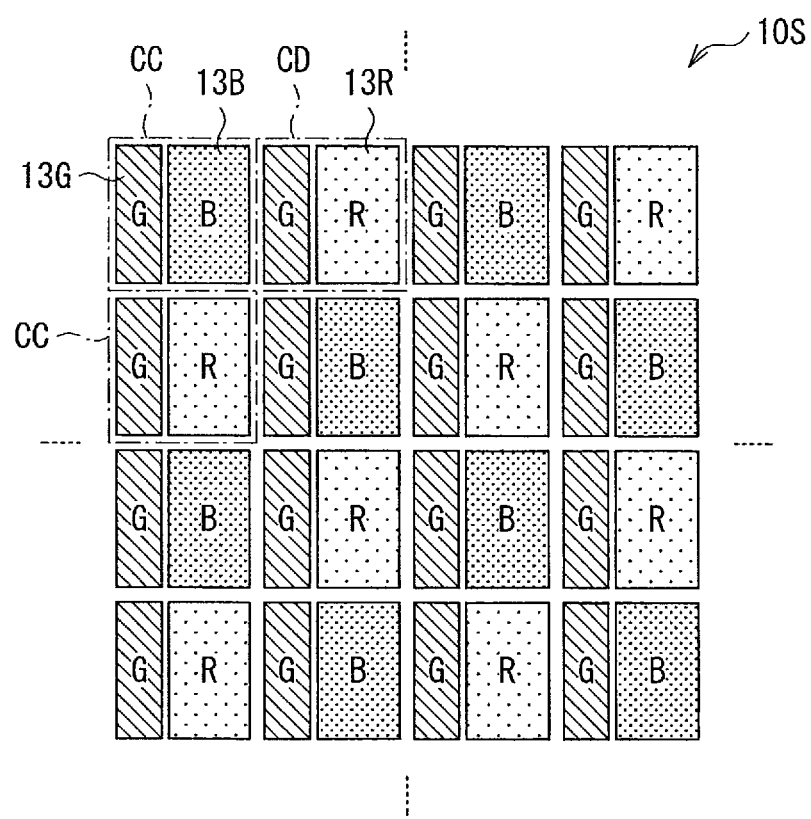
FIG. 13 is a schematic diagram illustrating an arrangement of sub-pixels in a display section according to another comparative example.

FIG. 13 illustrates an example of an arrangement of sub-pixels 13 in a display section 10S in the display 1S according to Comparative example 2. The display section 10S includes three sub-pixels 13 (13R, 13G, and 13B) of red (R), green (G), and blue (B). In other words, the display section 10S does not include any sub-pixel of white (W). In the display section 10S, cells CC each configured of the sub-pixels 13G and 13B and cells CD each configured of the sub-pixels 13G and 13R are arranged side by side. The cells CC and the cells CD are arranged alternately in the column direction (the vertical direction) and are arranged alternately in the row direction (the horizontal direction).

The display 1S according to Comparative example 2 does not include any white sub-pixel 11W. Therefore, for example, when white is displayed, it is necessary to allow the three sub-pixels 13R, 13G, and 13B to emit light. Therefore, power consumption may be increased in the display 1S.

On the other hand, in the display 1 according to the present embodiment, the sub-pixel 11W emitting light of white (W) is provided in addition to the three sub-pixels 11R, 11G, and 11B emitting light of red (R), green (G), and blue (B), respectively, as shown in FIG. 2. Accordingly, for example, when white is displayed, it is necessary to allow only one sub-pixel 11W to emit light. Therefore, power consumption is reduced.

Moreover, in the display 1 according to the present embodiment, the cells CA and CB each includes the white sub-pixel 11W. Therefore, image quality is improved compared to in the display 1S according to Comparative example 2. Specifically, the white light emitted by the sub-pixel 11W includes red, green, and blue components. Therefore, although the cell CA does not include any red sub-pixel 11R, the white sub-pixel 11W emits light having the red component. Further, although the cell CB does not include any blue sub-pixel 11B, the white sub-pixel 11W emits light having the blue component. Accordingly, in the display 1, the resolution of the red and blue components is improved equivalently, and therefore, image quality is improved, compared to the display 1S according to Comparative example 2.

Comparative Example 3

Moreover, in the display 1, the anodes 212 are arranged so as not to overlap with the data lines DTL as shown in FIG. 7. Therefore, degradation in image quality is suppressed compared to a display 1T according to Comparative example 3 which will be described below.

Figure 14:
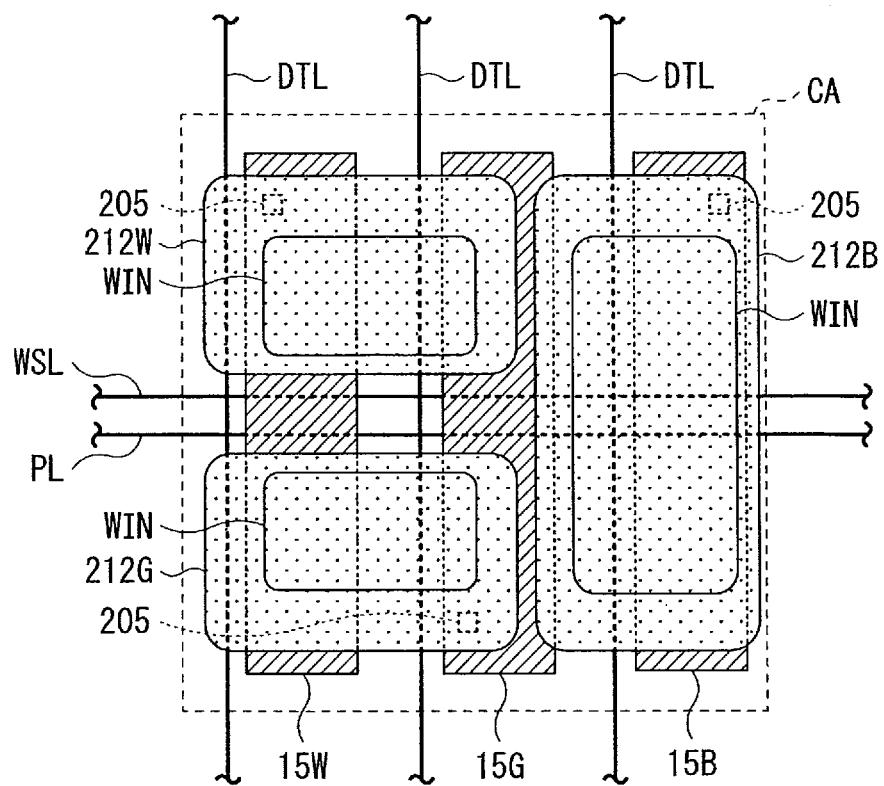
FIG. 14 is a plan view illustrating an arrangement of anodes according to another comparative example.

FIG. 14 illustrates an arrangement of the anodes 212 in the cell CA in the display 1T according to Comparative example 3. In this example, the data line DTL, the circuit region 15W, the data line DTL, the circuit region 15G, the data line DTL, and the circuit region 15B are arranged in order from left to right in the cell CA. The anode 212W of the sub-pixel 11W is arranged so as to overlap with two data lines DTL. The anode 212G of the sub-pixel 11G is arranged so as to overlap with two data lines DTL. The anode 212B of the sub-pixel 11B is arranged so as to overlap one data line DTL.

In the display 1T according to Comparative example 3, the anode 212W overlaps with two data lines DTL. Therefore, the signals Sig in these data lines DTL may be transferred as a noise to the anode 212W because of coupling. Similarly, the anode 212G overlaps with two data lines DTL, and therefore, the signals Sig in these data lines DTL may be transferred as a noise to the anode 212G because of coupling. Further, the anode 212B overlaps with one data line DTL, and therefore, the signal Sig in the data line DTL may be transferred as a noise to the anode 212B because of coupling. In particular, in the display 1T, the number of overlapped data lines DTL is different between the anodes 212. Therefore, the influence of the noise is non-uniform, and image quality may be degraded.

On the other hand, in the display 1 according to the present embodiment, the anodes 212 are arranged so as not to overlap with the data lines DTL as shown in FIG. 7. Therefore, possibility of the noise to be transferred to the anodes 212 is reduced, and image quality is improved.

Effects

In the present embodiment, the four sub-pixels of red, green, blue, and white are provided, and the numbers of the red and blue sub-pixels are smaller than those of the white and green sub-pixels as described above. Therefore, power consumption is reduced while suppressing degradation in image quality.

Moreover, in the present embodiment, the number of the sub-pixels is reduced. Therefore, the opening ratio in the sub-pixels is increased. Accordingly, degradation with time in the light-emitting layer is suppressed, and image quality is improved.

Moreover, in the present embodiment, the anodes are arranged so as not to overlap with the data lines. Therefore, image quality is improved.

[Modification 1-1]

In the above-described embodiment, the three sub-pixels 11W, 11G, and 11B configure the cell CA, and the three sub-pixels 11W, 11G, and 11R configure the cell B as shown in FIG. 2. However, this is not limitative.

For example, a sub-pixel 11Y of yellow (Y) may be used instead of the sub-pixel 11W of white (W). In this case, three sub-pixels 11Y, 11G, and 11B configure the cell CA, and three sub-pixels 11Y, 11G, and 11R configure the cell CB. Yellow light emitted by the sub-pixel 11Y includes red and green components. Therefore, although the cell CA does not include any red sub-pixel 11R, the yellow sub-pixel 11Y emits light having the red component in the cell CA. Therefore, in the display according to the present modification, the resolution of the red component is improved equivalently, and image quality is improved, compared to the display 1S according to Comparative example 2.

Alternatively, for example, a sub-pixel 11M of magenta (M) may be used instead of the sub-pixel 11W of white (W). In this case, three sub-pixels 11M, 11G, and 11B configure the cell CA, and three sub-pixels 11M, 11G, and 11R configure the cell CB. Magenta light emitted by the sub-pixel 11M includes red and blue components. Therefore, although the cell CA does not include any red sub-pixel 11R, the magenta sub-pixel 11M emits light having the red component in the cell CA. Also, although the cell CB does not include any blue sub-pixel 11B, the magenta sub-pixel 11M emits light having the blue component in the cell CB. Therefore, in the display according to the present modification, the resolution of the red and blue components is improved equivalently, and image quality is improved, compared to the display 1S according to Comparative example 2.

Alternatively, for example, a sub-pixel 11C of cyan (C) may be used instead of the sub-pixel 11W of white (W). In this case, three sub-pixels 11C, 11G, and 11B configure the cell CA, and three sub-pixels 11C, 11G, and 11R configure the cell CB. Cyan light emitted by the sub-pixel 11C includes green and blue components. Therefore, although the cell CB does not include any blue sub-pixel 11B, the cyan sub-pixel 11C emits light having the blue component in the cell CB. Therefore, in the display according to the present modification, the resolution of the blue component is improved equivalently, and image quality is improved, compared to the display 1S according to Comparative example 2.

[Modification 1-2]

Figure 15:
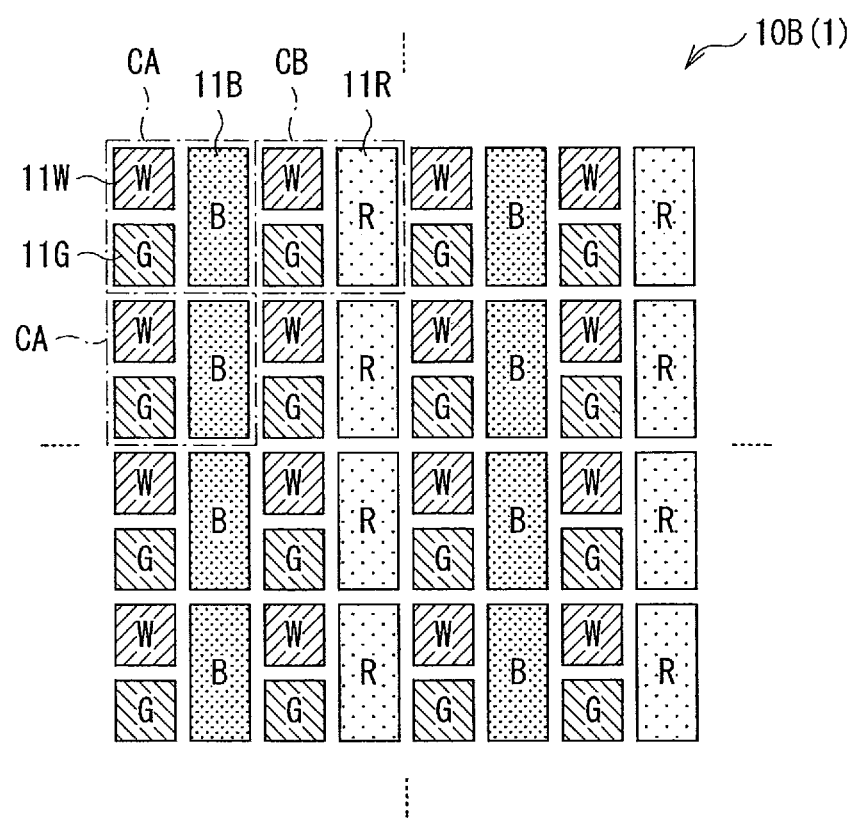
FIG. 15 is a schematic diagram illustrating a configuration example of a display section according to a modification of a first embodiment.
Figure 16:
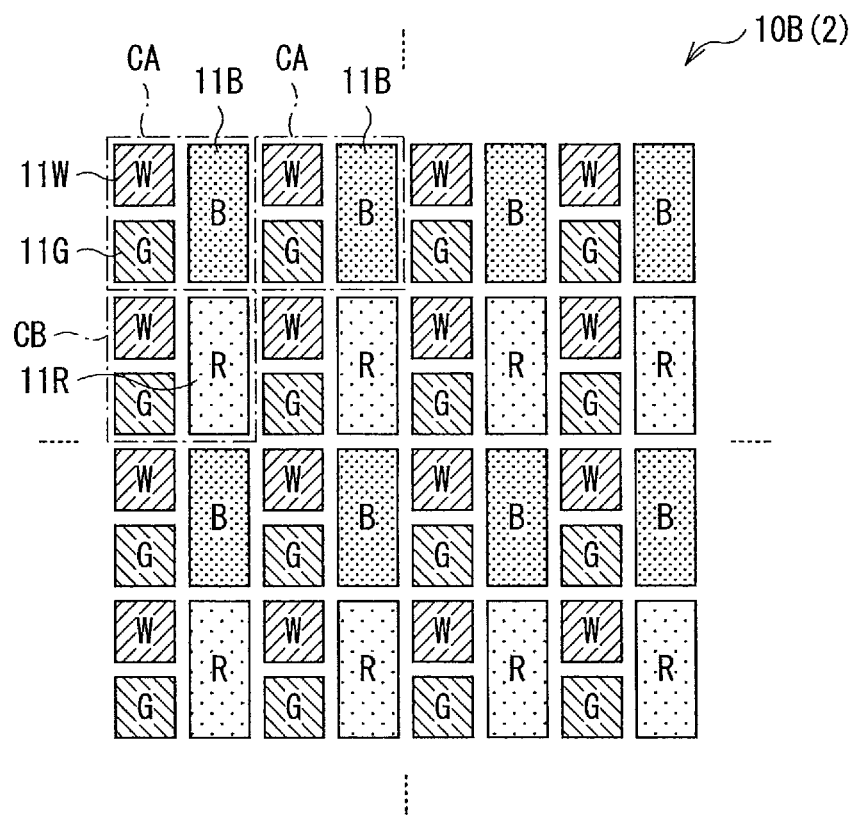
FIG. 16 is a schematic diagram illustrating an arrangement example of sub-pixels according to another modification of the first embodiment.

In the above-described embodiment, the cells CA and the cells CB are arranged alternately in the column direction (the vertical direction) and are arranged alternately in the row direction (the horizontal direction) as shown in FIG. 2. However, this is not limitative. Alternatively, for example, as in a display section 10B(1) shown in FIG. 15, the cells CA and the cells CB may be arranged alternately in the row direction (the horizontal direction), and the same type of cells may be arranged repeatedly in the column direction (the vertical direction). Alternatively, for example, as in a display section 10B(2) shown in FIG. 16, the cells CA and the cells CB may be arranged alternately in the column direction (the vertical direction), and the same type of cells may be arranged repeatedly in the row direction (the horizontal direction).

Figure 17:
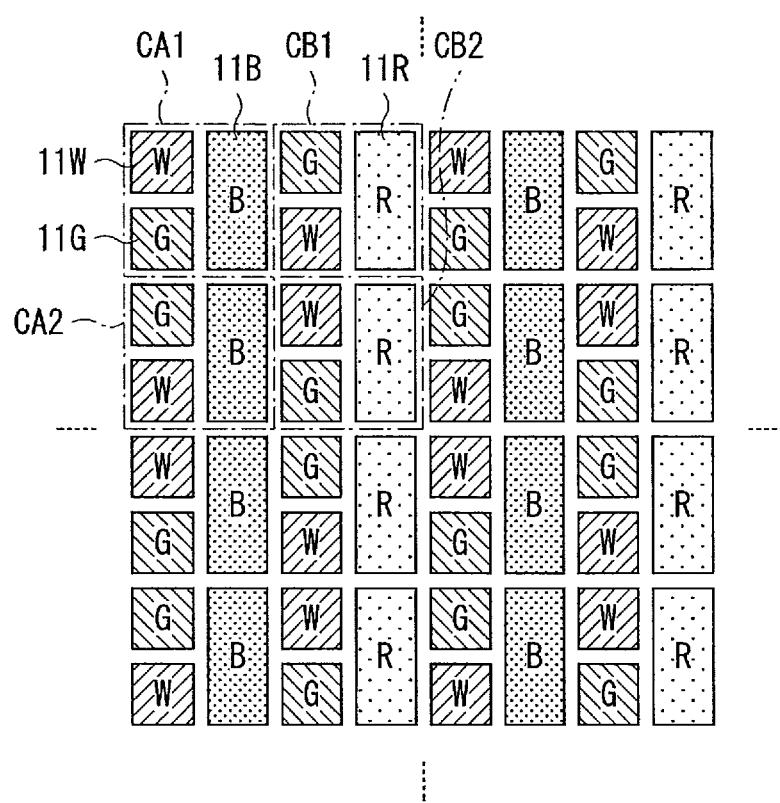
FIG. 17 is a schematic diagram illustrating an arrangement example of sub-pixels according to another modification of the first embodiment.

Moreover, in the above-described embodiment, all of the cells CA have the same arrangement of the sub-pixels 11W, 11G, and 11B, and all of the cells CB have the same arrangement of the sub-pixels 11W, 11G, and 11R. However, this is not limitative. For example, as in a display section 10B(3) as shown in FIG. 17, the adjacent cells CA may have different arrangements of the sub-pixels 11W, 11G, and 11B from each other, and the adjacent cells CB may have different arrangements of the sub-pixels 11W, 11G, and 11R from each other. In the display section 10B(3), cells CA (CA1 and CA2) each configured of three sub-pixels 11W, 11G, and 11B and cells CB (CB1 and CB2) each configured of three sub-pixels 11W, 11G, and 11R are arranged side by side. In this example, in the cell CA1, the sub-pixel 11W of white (W), the sub-pixel 11G of green (G), and the sub-pixel 11B of blue (B) are arranged on the upper left, on the lower left, and on the right, respectively. Further, in the cell CA2, the sub-pixel 11G of green (G), the sub-pixel 11W of white (W), and the sub-pixel 11B of blue (B) are arranged on the upper left, on the lower left, and on the right, respectively. Similarly, in the cell CB1, the sub-pixel 11G of green (G), the sub-pixel 11W of white (W), and the sub-pixel 11R of red (R) are arranged on the upper left, on the lower left, and on the right, respectively. Further, in the cell CB2, the sub-pixel 11W of white (W), the sub-pixel 11G of green (G), and the sub-pixel 11R of red (R) are arranged on the upper left, on the lower left, and on the right, respectively.

[Modification 1-3]

In the above-described embodiment, the opening areas AR, AG, AB, and AW of the openings WIN in the sub-pixels 11R, 11G, 11B, and 11W may desirably have the following relationships.

$$AW \leq AG < AR = AB \quad (1)$$

$$AW \leq AG < AR < AB \quad (2)$$

$$AW \leq AG < AB < AR \quad (3)$$

Figure 18:
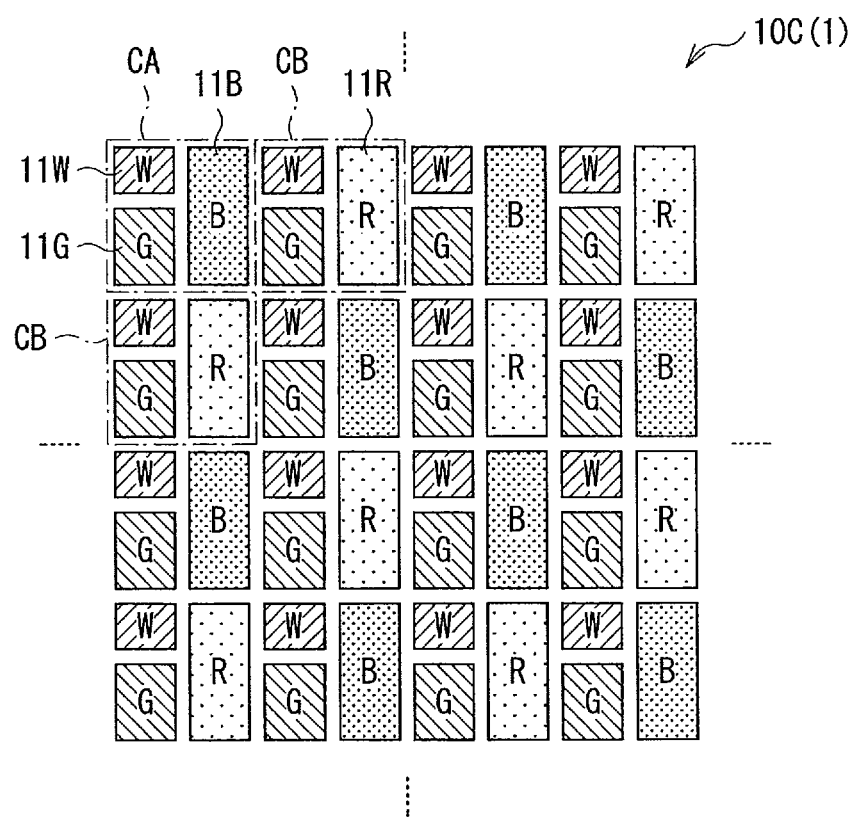
FIG. 18 is a schematic diagram illustrating an arrangement example of sub-pixels according to another modification of the first embodiment.
Figure 19:
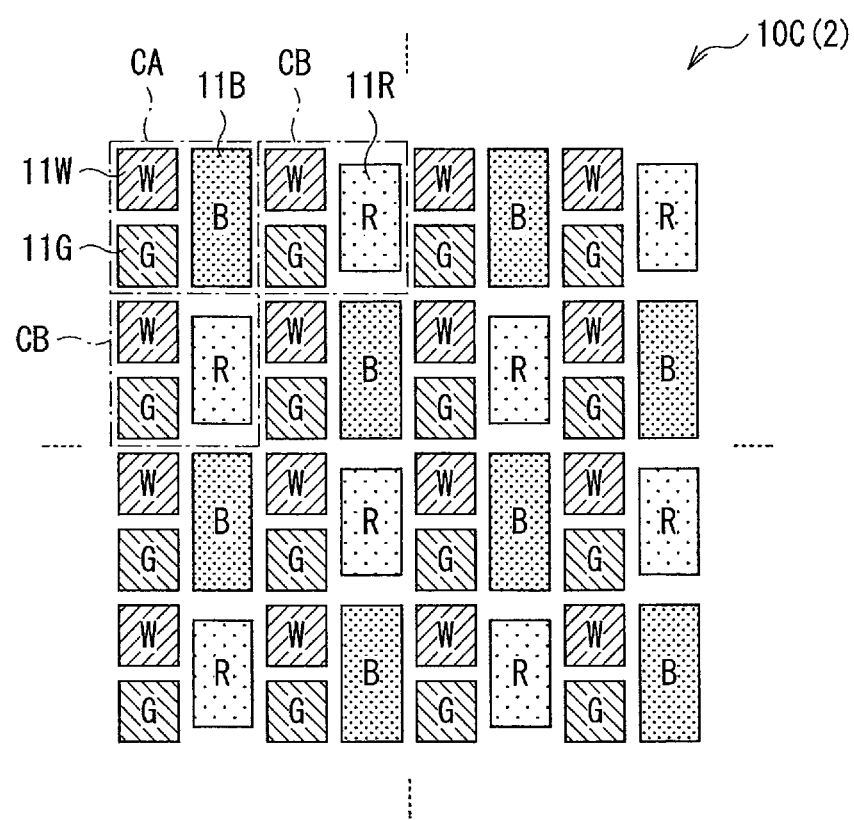
FIG. 19 is a schematic diagram illustrating an arrangement example of sub-pixels according to another modification of the first embodiment.
Figure 20:
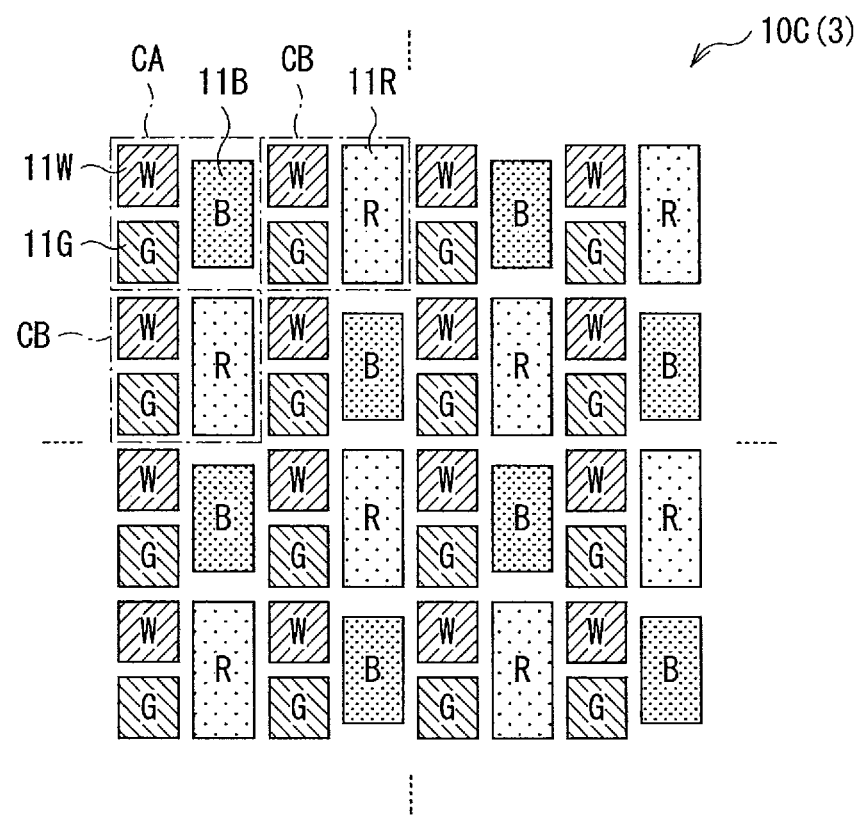
FIG. 20 is a schematic diagram illustrating an arrangement example of sub-pixels according to another modification of the first embodiment.
Figure 21:
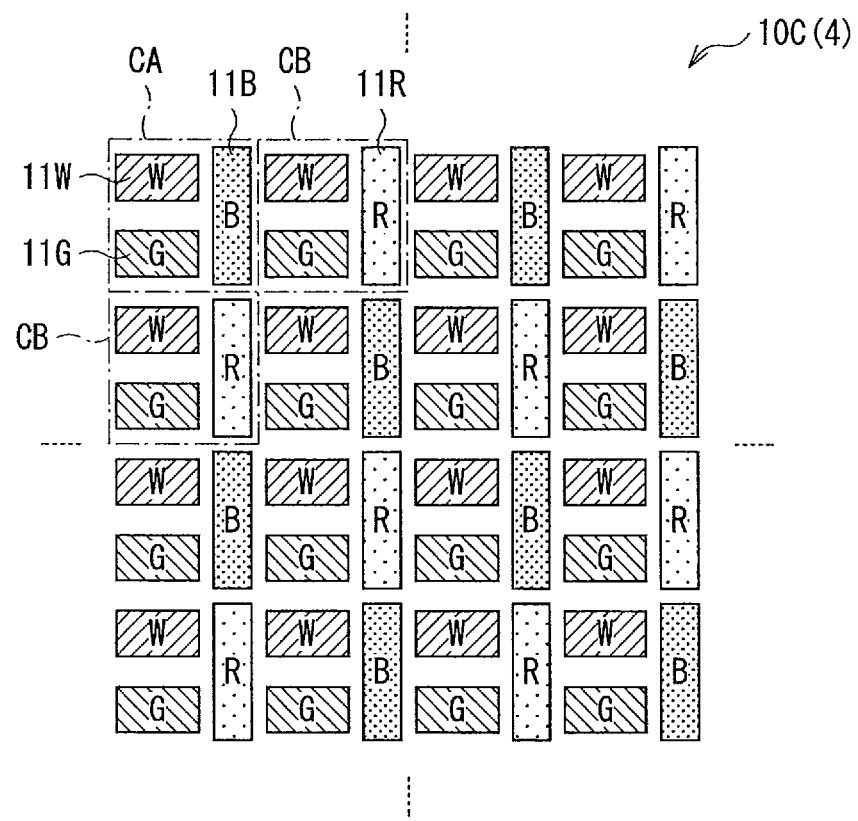
FIG. 21 is a schematic diagram illustrating an arrangement example of sub-pixels according to another modification of the first embodiment.

Specifically, for example, the opening area AW in the sub-pixel 11W may be smaller than the opening area AG in the sub-pixel 11G as in a display section 10C(1) shown in FIG. 18. Alternatively, for example, the opening area AR in the sub-pixel 11R may be smaller than the opening area AB in the sub-pixel 11B as in a display section 10C(2) shown in FIG. 19. Alternatively, for example, the opening area AB in the sub-pixel 11B may be smaller than the opening area AR in the sub-pixel 11R as in a display section 10C(3) shown in FIG. 20. Alternatively, for example, as in a display section 10C(4) shown in FIG. 21, the opening area AW in the white sub-pixel 11W and the opening area AG of the green sub-pixel 11G may be larger than those in the above-described modifications, and the opening area AR in the red sub-pixel 11R and the opening area AB in the blue sub-pixels 11B may be smaller than those in the above-described modifications. The magnitude relationship between the opening area AR in the sub-pixel 11R and the opening area AB in the sub-pixel 11B may be determined, for example, in consideration of light-emission efficiency in the sub-pixels 11R and 11B, and/or the like.

In the above-described Expressions (1) to (3), the opening area AW in the white sub-pixel 11W is equal to or smaller than the opening area AG in the green sub-pixel 11G (AW≤AG). One reason for this is that the light-emitting layer 230 emits white light, and the emitted white light travels to the outside through the color filters 218 of red, green, blue, and white, as shown in FIG. 5. In other words, generally, luminance after the light has passed through the color filter 218 of green (G) is equal to or lower than luminance after the light has passed through the color filter 218 of white (W). Therefore, in order to compensate the difference in luminance, the opening area AW is allowed to be equal to or smaller than the opening area AG.

Moreover, in the above-described Expressions (1) to (3), the opening area AG in the green sub-pixel 11G is smaller than the opening area AR in the red sub-pixel 11R (AG<AR), and is smaller than the opening area AB in the blue sub-pixel 11B (AG<AB). This may be a result of considering the general fact that the green component is larger than the red and blue components in the white light emitted by the light-emitting layer 230. In order to compensate the difference, the opening area AG is smaller than the opening areas AR and AB.

[Modification 1-4]

Figure 22:
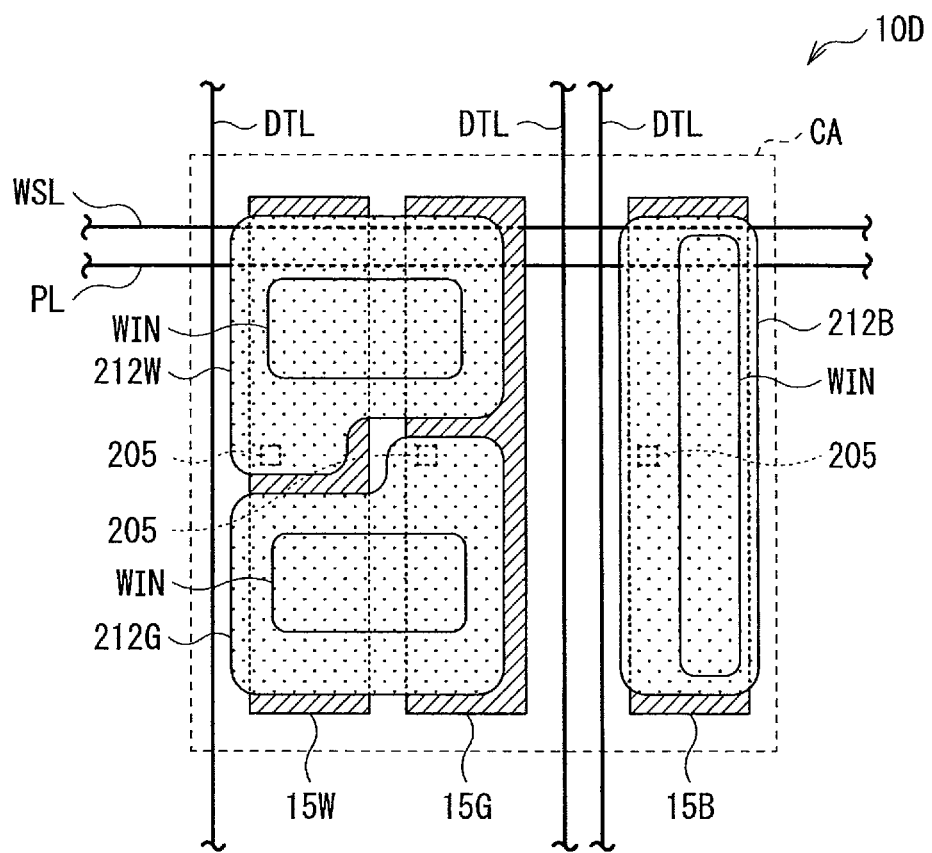
FIG. 22 is a plan view illustrating an arrangement example of anodes according to another modification of the first embodiment.

In the above-described embodiment, the contact 205 is provided around an upper end or a lower end in each of the circuit regions 15W, 15G, and 15B as shown in FIG. 7. However, this is not limitative. Alternatively, for example, as in a display section 10D shown in FIG. 22, the contact 205 may be provided around the middle portion of each of the circuit regions 15W, 15G, and 15B. In this case, the circuit regions 15W, 15G, and 15B may have the same layout of the writing transistor WSTr, the driving transistor DRTr, and the capacitor Cs. Therefore, design efficiency is improved, and the characteristics variations between the sub-pixels 11 are suppressed.

[Modification 1-5]

In the above-described embodiment, the anodes 212 are arranged so as not to overlap with the data lines DTL as shown in FIG. 7. However, this is not limitative. Alternatively, for example, as in a display section 10E shown in FIG. 23, each of the anodes 212 (212W, 212G, and 212B) may be arranged so as to overlap with one data line DTL. In this configuration, the signals Sig in the data lines DTL may be transferred as a noise to the anodes 212W, 212G, and 212B because of coupling. However, unlike the case of Comparative example 3, each of the anodes 212W, 212G, and 212B are arranged so as to overlap with one data line DTL. Therefore, the influence of the noise is uniform. Accordingly, degradation in image quality is suppressed.

[Modification 1-6]

Figure 24:
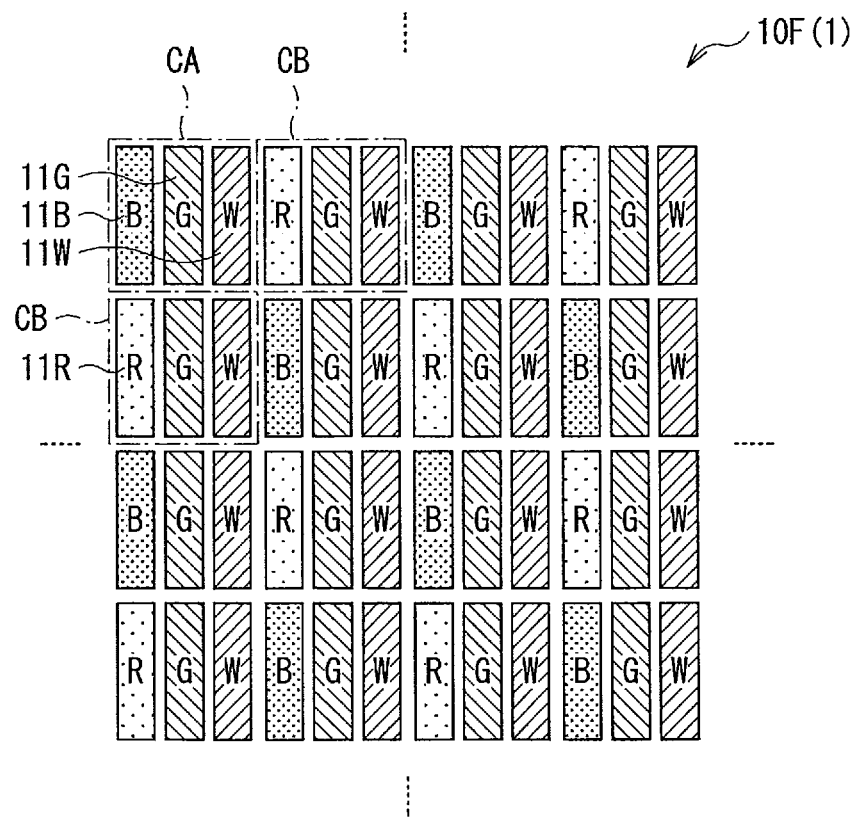
FIG. 24 is a schematic diagram illustrating an arrangement example of sub-pixels according to another modification of the first embodiment.
Figure 25:
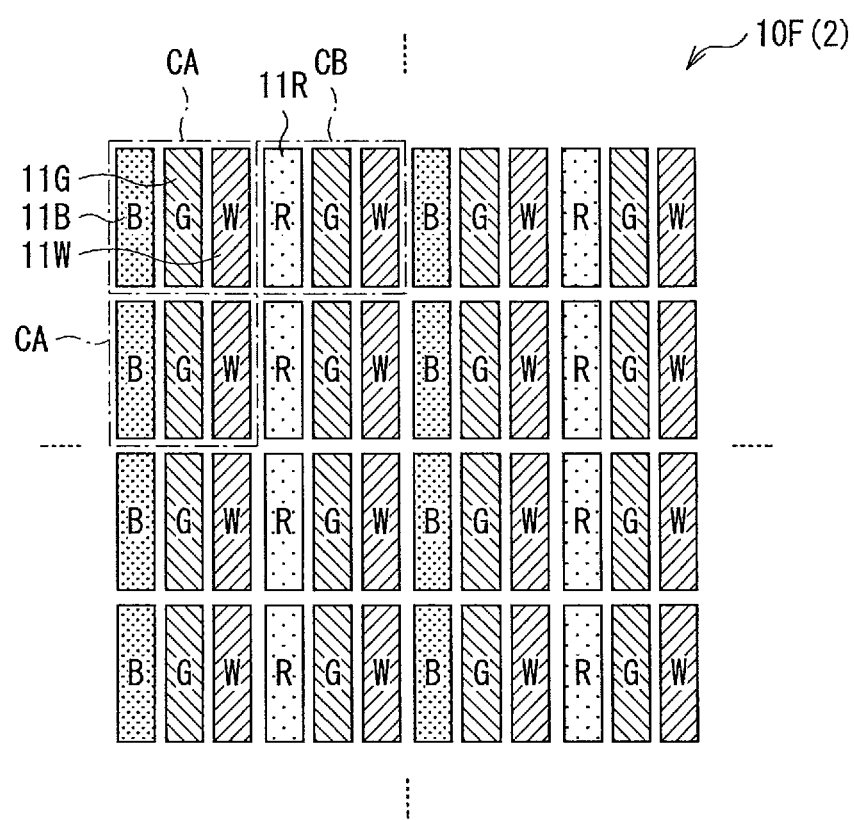
FIG. 25 is a schematic diagram illustrating an arrangement example of sub-pixels according to another modification of the first embodiment.
Figure 26:
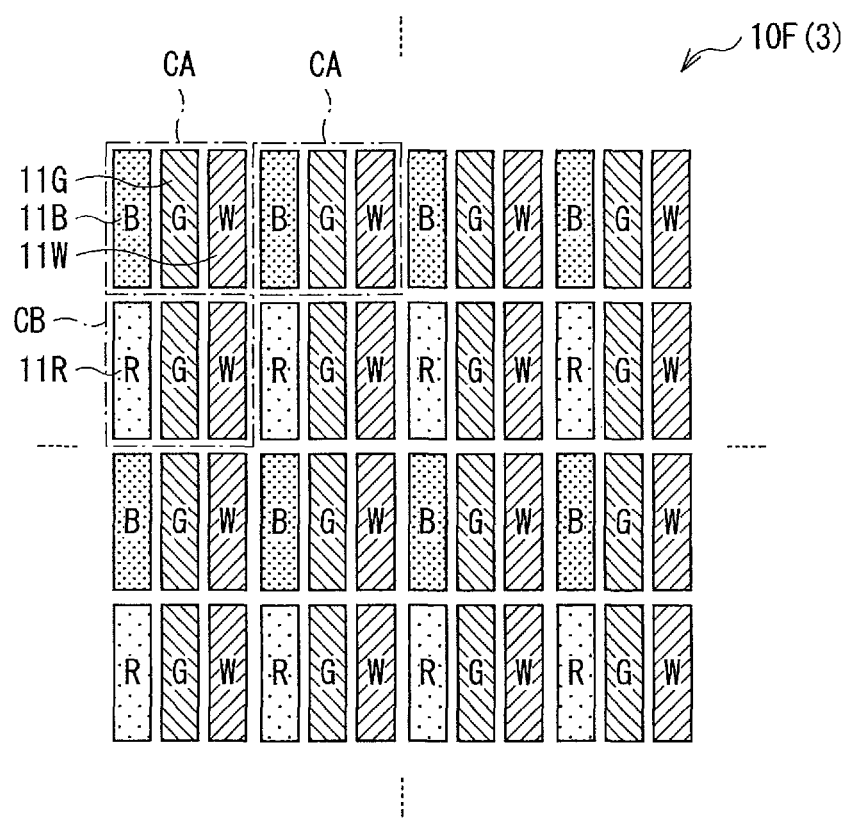
FIG. 26 is a schematic diagram illustrating an arrangement example of sub-pixels according to another modification of the first embodiment.

In the above-described embodiment, the sub-pixels 11W and 11G are arranged side by side in the column direction (the vertical direction) in the cells CA and CB as shown in FIG. 2. However, this is not limitative. Alternatively, for example, as in display sections 10F(1) to 10F(3) shown in FIGS. 24 to 26, the sub-pixels 11W and 11G may be arranged side by side in the row direction (the horizontal direction). In this example, the sub-pixel 11B, the sub-pixel 11G, and the sub-pixel 11W are arranged in order from the left in the cell CA, and the sub-pixel 11R, the sub-pixel 11G, and the sub-pixel 11W are arranged in order from the left in the cell CB. In the display section 10F(1) shown in FIG. 24, the cells CA and the cells CB are arranged alternately in the column direction, and are arranged alternately in the row direction. In the display section 10F(2) shown in FIG. 25, the cells CA and the cells CB are arranged alternately in the row direction, and the same type of cells are arranged repeatedly in the column direction. In the display section 10F(3) shown in FIG. 26, the cells CA and the cells CB are arranged alternately in the column direction, and the same type of cells are arranged repeatedly in the row direction.

Figure 27:
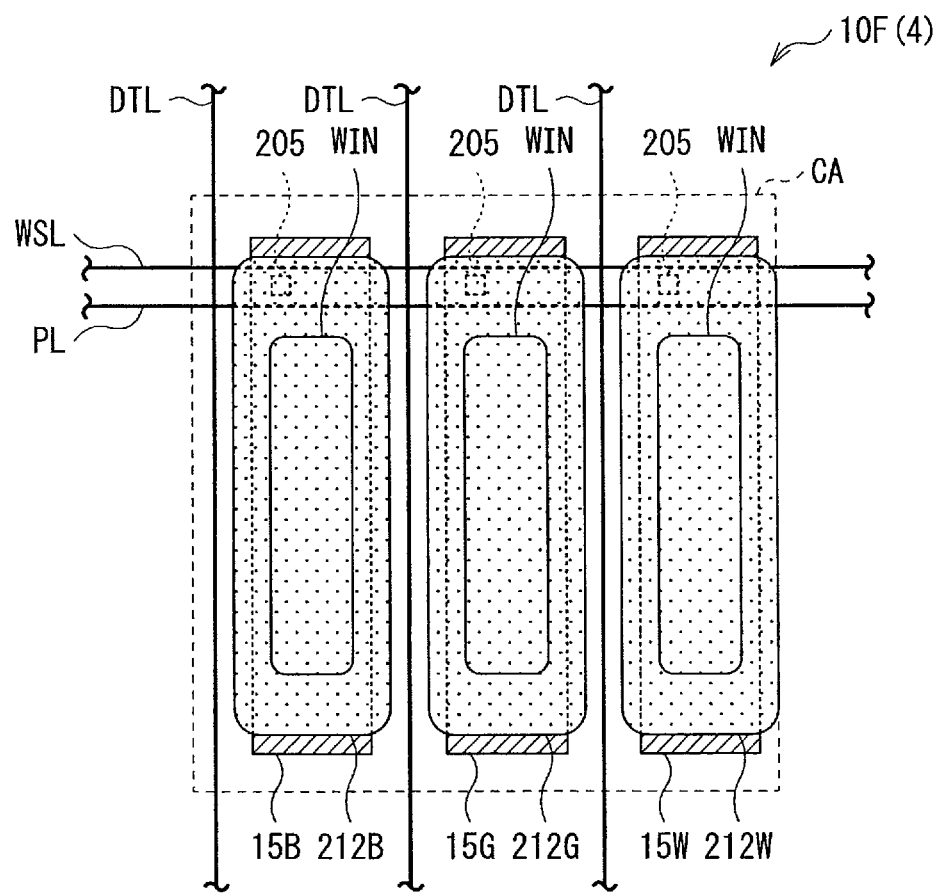
FIG. 27 is a plan view illustrating an arrangement example of anodes according to another modification of the first embodiment.
Figure 28:
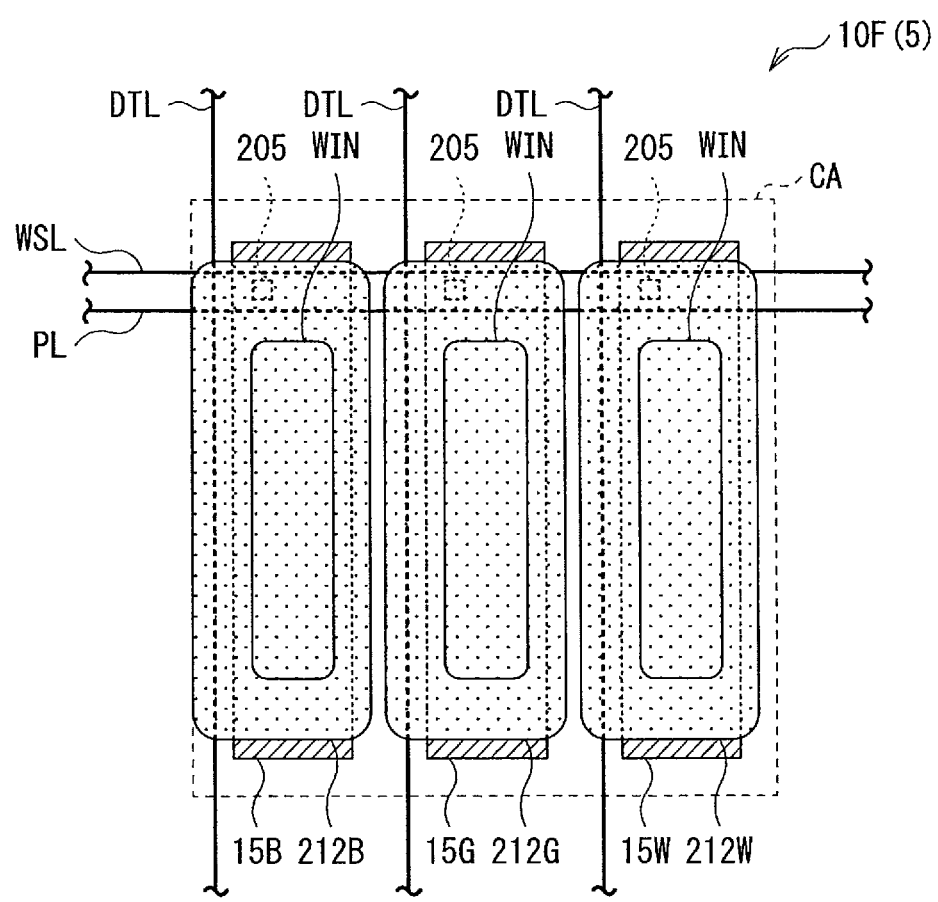
FIG. 28 is a plan view illustrating an arrangement example of anodes according to another modification of the first embodiment.

Also in the display sections 10F(1) to 10F(3), the anodes 212 may be desirably arranged so as not to overlap with the data lines DTL as shown in FIG. 27. Alternatively, each of the anodes 212 (212W, 212G, and 212B) may be arranged so as to overlap with one data line DTL as shown in FIG. 28.

[Modification 1-7]

Figure 29:
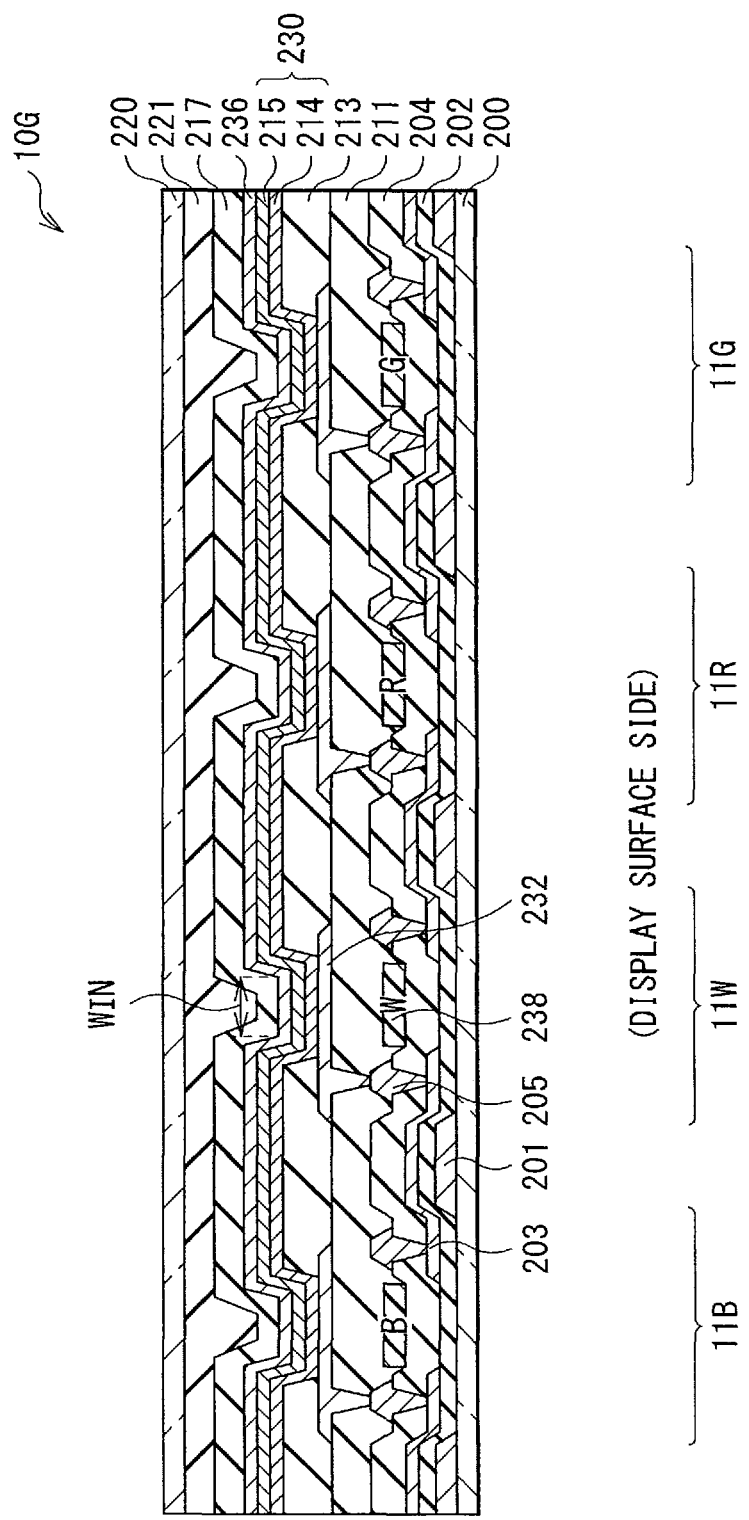
FIG. 29 is a cross-sectional view illustrating a configuration example of a display section according to another modification of the first embodiment.

In the above-described embodiment, the display section 10 is configured of the light-emitting device 19 of a top emission type. However, this is not limitative. Alternatively, for example, as in a display section 10G shown in FIG. 29, the display section may be configured of a light-emitting device 19G of a so-called bottom emission type. The display section 10G includes an anode 232, a cathode 236, and a color filter 238. The anode 232 may be made, for example, of indium tin oxide (ITO). In other words, the anode 232 is transparent or semi-transparent. The anode 232 may be formed having a thickness, for example, of several tens of nanometers to several hundreds of nanometers. The cathode 236 has light reflection characteristics, and may be made, for example, of magnesium silver (MgAg). The cathode 236 may be formed having a thickness, for example, of several tens of nanometers to several hundreds of nanometers. The color filter 238 is formed in a region, on the insulating layer 204, corresponding to the opening WIN. Such a configuration allows yellow light emitted from the yellow light-emitting layer 214 to be mixed with blue light emitted from the blue light-emitting layer 215, thereby generating white light, and the generated white light travels in a direction toward the transparent substrate 200 which serves as a supporting substrate. The white light is allowed to travel outside from the display surface through the color filters 238 of red (R), green (G), blue (B), and white (W).

[Modification 1-8]

In the above-described embodiment, the light-emitting layer 230 (the yellow light-emitting layer 214 and the blue light-emitting layer 215) emits white light as synthesized light, and the synthesized white light is allowed to travel outside through the color filters 218 of red, green, blue, and white, as shown in FIGS. 6A and 6B. However, this is not limitative.

Figure 30A:
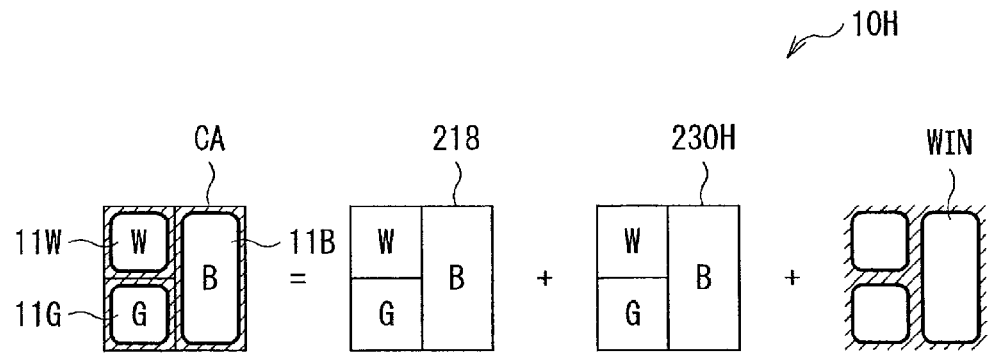
FIG. 30A is a schematic diagram illustrating a configuration example of a cell according to another modification of the first embodiment.
Figure 30B:
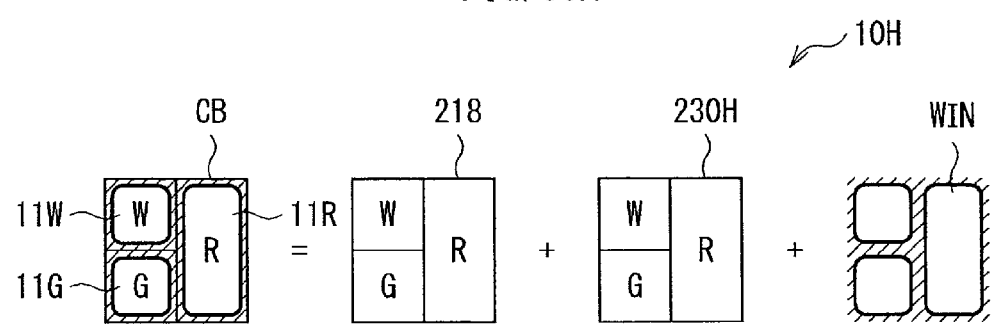
FIG. 30B is a schematic diagram illustrating a configuration example of another cell according to another modification of the first embodiment.

For example, as in a display section 10H shown in FIGS. 30A and 30B, the light-emitting layer 230H emitting light of red (R), green (G), blue (B), and white (W) may be provided in regions corresponding to the sub-pixels 11R, 11G, 11B, and 11W, respectively, instead of the light-emitting layer 230. In this case, the light of the respective colors emitted from the light-emitting layer 230H is allowed to travel outside through the color filters 218 of red (R), green (G), blue (B), and white (W), respectively. In this example, the color filter 218 is provided to adjust color gamut of each color. It is to be noted that the color filters 218 may not be provided in applications and the like in which image quality (color gamut) is not so high.

Figure 31A:
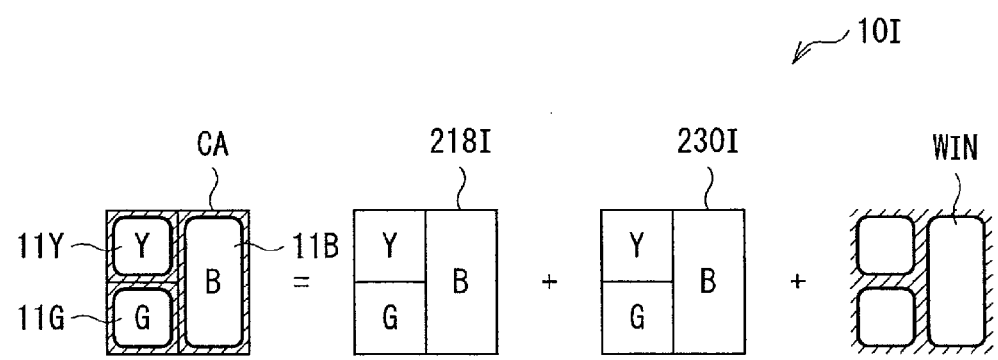
FIG. 31A is a schematic diagram illustrating a configuration example of a cell according to another modification of the first embodiment.
Figure 31B:
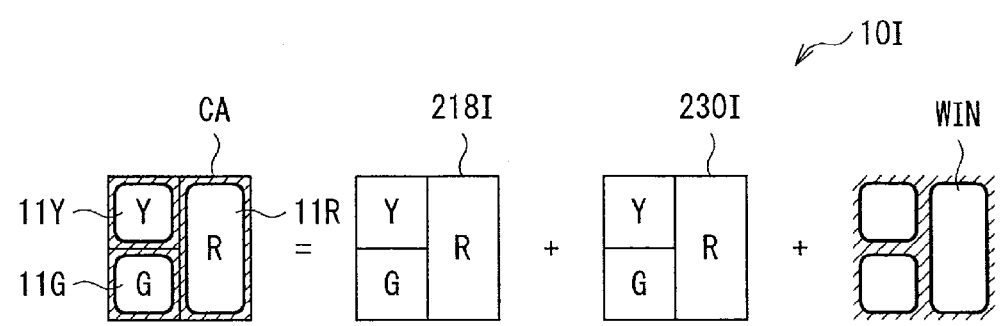
FIG. 31B is a schematic diagram illustrating a configuration example of another cell according to another modification of the first embodiment.

In a case where the sub-pixel 11Y of yellow (Y) is provided instead of the sub-pixel 11W of white (W) as in the display section according to Modification 1-1, for example, configurations shown in FIGS. 31A and 31B may be adopted. A display section 10I includes a light-emitting layer 230I and a color filter 218I. The light-emitting layer 230I emits light of red (R), green (G), blue (B), and yellow (Y) in regions corresponding to the sub-pixels 11R, 11G, 11B, and 11Y, respectively. The color filter 218I includes color filters of red (R), green (G), blue (B), and yellow (Y) in the regions corresponding to the sub-pixels 11R, 11G, 11B, and 11Y, respectively. In the display section 10I, the light of each color emitted from the light-emitting layer 230I is allowed to travel outside through the color filter 218I of each color. The color filter 218I may not be provided either in this example.

Figure 32A:
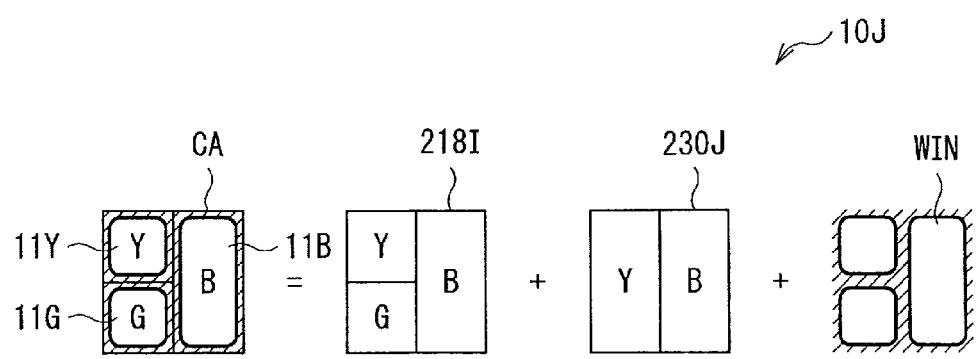
FIG. 32A is a schematic diagram illustrating a configuration example of a cell according to another modification of the first embodiment.
Figure 32B:
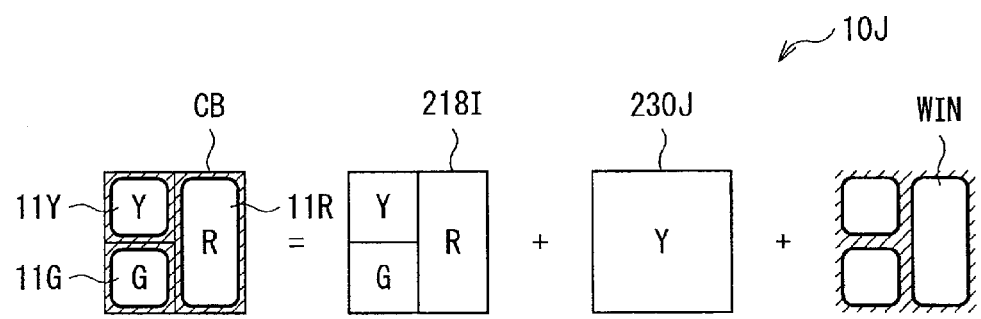
FIG. 32B is a schematic diagram illustrating a configuration example of another cell according to another modification of the first embodiment.

Alternatively, as in a display section 10J shown in FIGS. 32A and 32B, a light-emitting layer 230J may be provided that emits light of yellow (Y) in regions corresponding to the sub-pixels 11R, 11G, and 11Y, and emits light of blue (B) in a region corresponding to the sub-pixel 11B. In this case, the light of yellow (Y) emitted from the light-emitting layer 230J passes through the color filters 218I of red (R), green (G), and yellow (Y), and thereby, is separated into the respective color components to be allowed to travel outside. The light of blue (B) emitted from the light-emitting layer 230J is allowed to travel outside through the color filter 218I of blue (B). In this example, the color filters 218I of blue (B) and yellow (Y) may not be provided.

[Modification 1-9]

Figure 33:
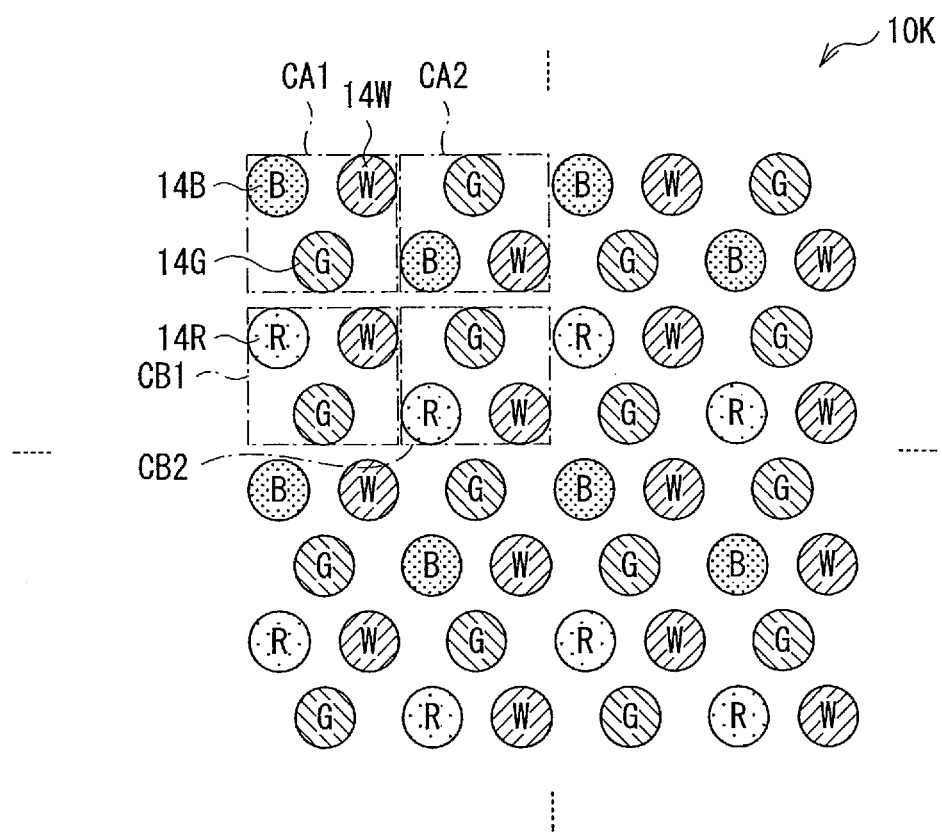
FIG. 33 is a schematic diagram illustrating an arrangement example of sub-pixels according to another modification of the first embodiment.

In the above-described embodiment, the opening WIN in the sub-pixel 11 has a shape close to a rectangle, as shown in FIGS. 2, 7, etc. However, this is not limitative. Alternatively, for example, as in a display section 10K shown in FIG. 33, the opening WIN in the sub-pixel 14 may have a circular shape. The display section 10K includes sub-pixels 14R, 14G, 14B, and 14W of red (R), green (G), blue (B), and white (W). In the display section 10K, cells CA (CA1 and CA2) each configured of the three sub-pixels 14W, 14G, and 14B and cells CB (CB1 and CB2) each configured of the three sub-pixels 14W, 14G, and 14R are arranged side by side. In each of the cells CA1, CA2, CB1, and CB2, the three sub-pixels 14 are arranged to be adjacent to one another. In other words, the three sub-pixels 14 are arranged so that lines connecting the centers of the three sub-pixels 14 to form the respective sides of an equilateral triangle. Specifically, in the cell CA1, the sub-pixel 14W of white (W), the sub-pixel 14G of green (G), and the sub-pixel 14B of blue (B) are arranged on the upper right, at the bottom, and on the upper left, respectively. Further, in the cell CA2, the sub-pixel 14W of white (W), the sub-pixel 14G of green (G), and the sub-pixel 14B of blue (B) are arranged on the lower right, at the top, and on the lower left, respectively. Further, in the cell CB1, the sub-pixel 14W of white (W), the sub-pixel 14G of green (G), and the sub-pixel 14R of red (R) are arranged on the upper right, at the bottom, and on the upper left, respectively. Further, in the cell CB2, the sub-pixel 14W of white (W), the sub-pixel 14G of green (G), and the sub-pixel 14R of red (R) are arranged on the lower right, at the top, and on the lower left, respectively. In the row direction (the horizontal direction), the cells CA1 and the cells CA2 are arranged alternately, and the cells CB1 and the cells CB2 are arranged alternately. Further, in the column direction (the vertical direction), the cells CA1 and the cells CB1 are arranged alternately, and the cells CA2 and the cells CB2 are arranged alternately. In such a manner, the sub-pixels 14 are arranged to have a so-called closest packing arrangement in the display section 10K. Also when the opening WIN has a circular shape in such a manner, effects similar to those in the above-described embodiment is obtained. It is to be noted that the opening WIN has a circular shape in this example. However, this is not limitative. Alternatively, for example, the opening WIN may have an elliptical shape.

[Modification 1-10]

In the above-described embodiments and the like, some techniques may be used for the shape of the opening WIN, the materials of the insulating layers 213 and 217, etc., and thereby, efficiency of extracting light emitted from the light-emitting layer 230 to the outside may be improved. The present modification will be described in detail below. It is to be noted that the shape of the opening WIN in the sub-pixel is described as a circle in this example. However, this is not limitative, and the shape of the opening WIN may be an elliptical shape, a shape close to a rectangle, or the like.

Figure 34:
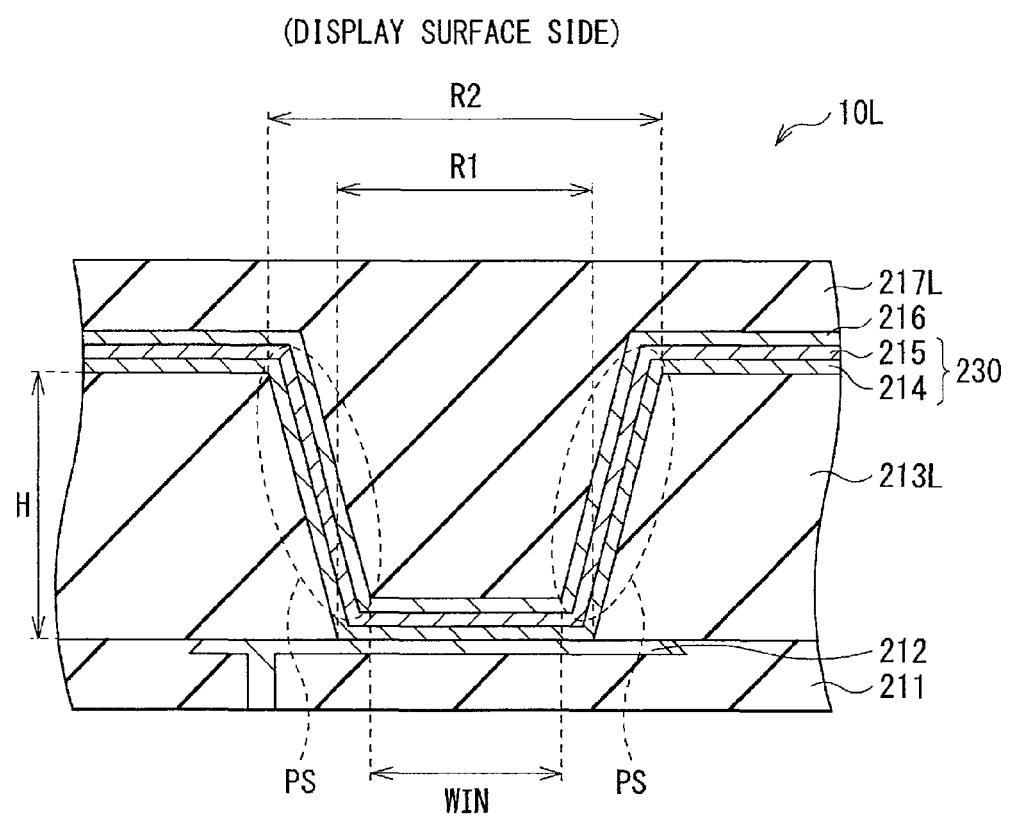
FIG. 34 is an explanatory diagram illustrating a configuration example of an opening according to another modification of the first embodiment.

FIG. 34 illustrates a cross-sectional structure of main part of a display section 10N according to the present modification. The display section 10L includes insulating layers 213L and 217L. The insulating layers 213L and 217L correspond to the insulating layers 213 and 217 in the above-described embodiments, respectively. As shown in FIG. 34, ends of the insulating layer 213L are sloped (sloped portions PS). In the display section 10L, the sloped portions PS reflects the light emitted from the opening WIN in the light-emitting layer 230. Therefore, efficiency of extracting light to the outside is improved.

More in detail, the display section 10L is configured as follows. Specifically, refractive indices n1 and n2 satisfy the following expressions, where n1 is a refractive index of the insulating layer 217L, and n2 is a refractive index of the insulating layer 213L.

$$1.1 \leq n1 \leq 1.8 \tag{4}$$

$$n1 - n2 \geq 0.20 \tag{5}$$

Further, height H, diameters R1 and R2 are set so as to satisfy the following expressions, where H is a height of the insulating layer 213L, R1 is a diameter of the opening portion in the insulating layer 213L on the anode electrode 212 side, and R2 is a diameter of the opening portion in the insulating layer 213L on the display surface side.

$$0.5 \leq R1/R2 \leq 0.8 \tag{6}$$

$$0.5 \leq H/R1 \leq 2.0 \tag{7}$$

Figure 35:
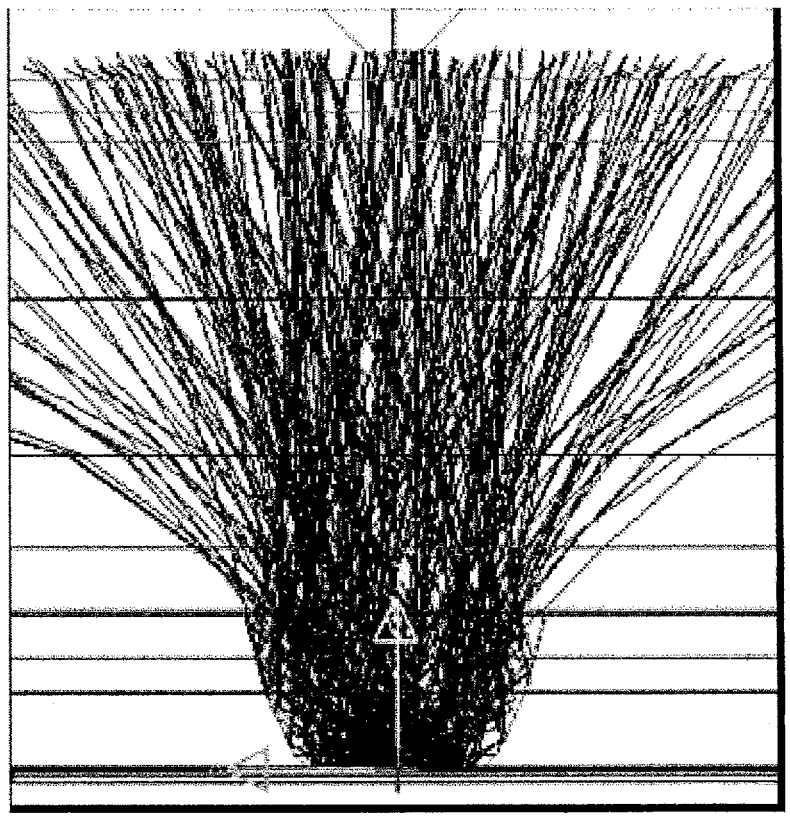
FIG. 35 is an explanatory diagram illustrating light beams in the opening shown in FIG. 34.

FIG. 35 illustrates an example of a simulation result of light beams in the display section 10L. In the display section 10L, the light emitted from the opening WIN in the light-emitting layer 230 is reflected in the sloped portions PS and is emitted toward the front of the display section 10L as shown in FIG. 35. In other words, for example, when the light is not reflected in the sloped portions PS, the light is weakened in the display section 10L, or is shielded by the black matrix 219, and may not be emitted to the outside. In the display section 10L, the sloped portions PS reflect the light. Therefore, efficiency of extracting light to the outside is improved.

Figure 36:
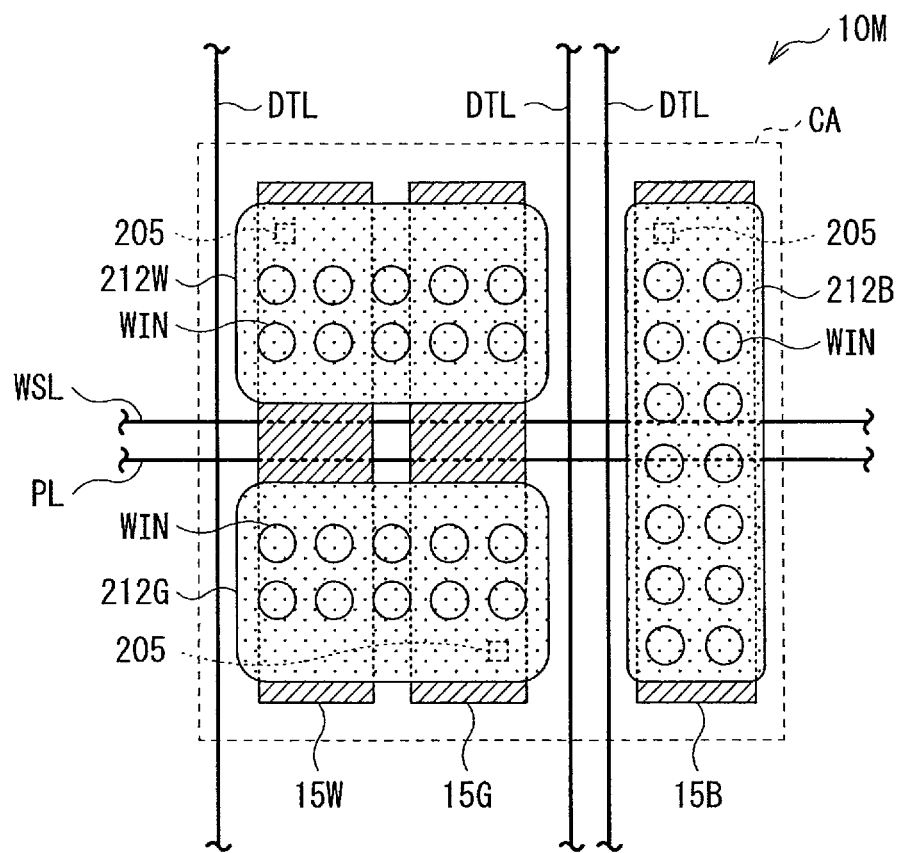
FIG. 36 is a plan view illustrating an arrangement example of openings according to another modification of the first embodiment.
Figure 37:
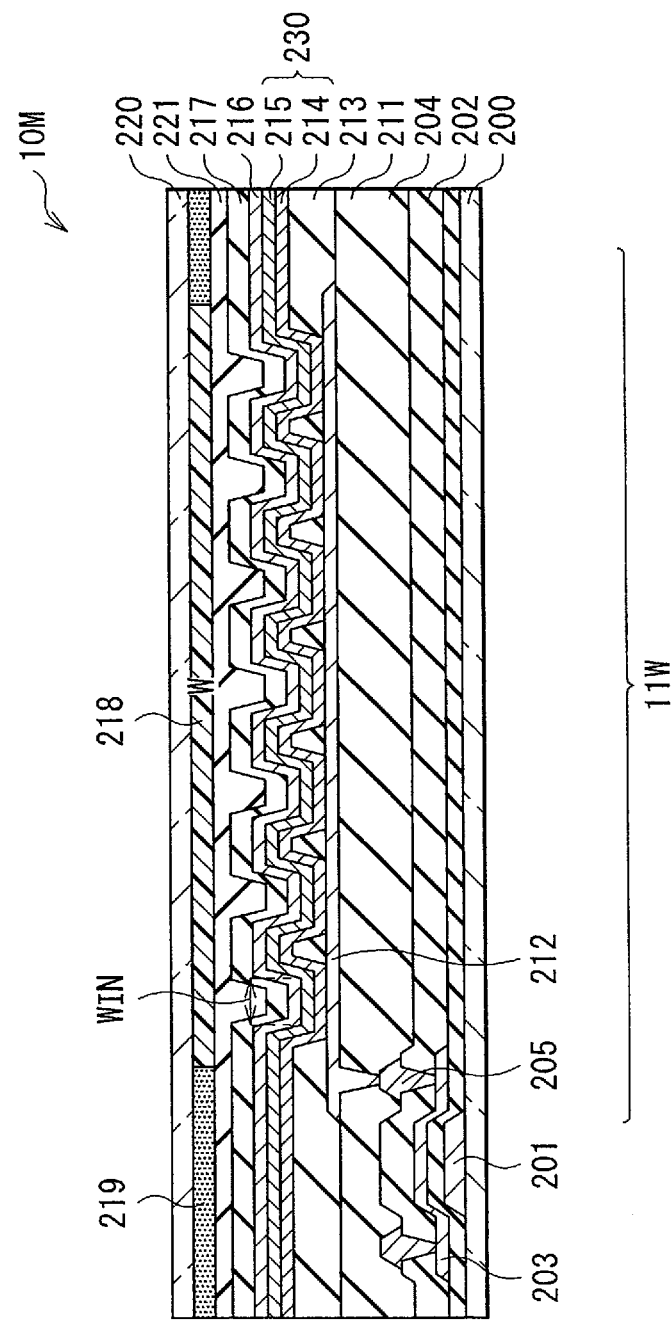
FIG. 37 is a cross-sectional view illustrating a configuration example of a display section shown in FIG. 36.

In the display section 10L according to the present modification, one opening WIN is provided in one sub-pixel 11. However, this is not limitative. Alternatively, as in a display section 10M shown in FIGS. 36 and 37, a plurality of openings WIN may be provided in one sub-pixel 11. In this case, by effectively using the sloped portions PS in the respective openings WIN, efficiency of extracting light to the outside is improved.

[Modification 1-11]

In the above-described embodiment, three sub-pixels 11 in each cell CA or CB are connected to different data lines DTL from one another as shown in FIG. 3. However, this is not limitative. The present modification will be described below in detail.

Figure 38:
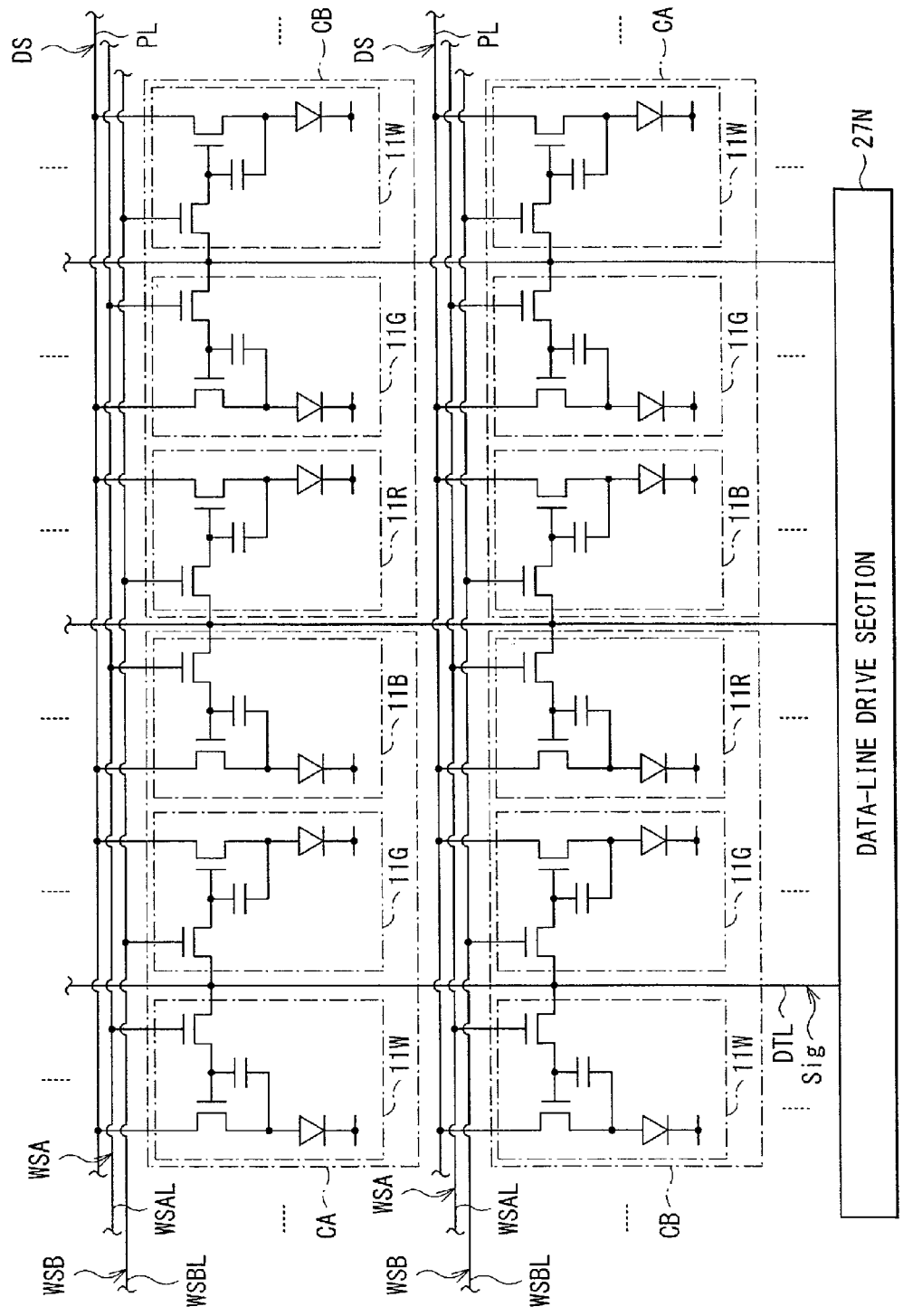
FIG. 38 is a circuit diagram illustrating a configuration example of a display section according to another modification of the first embodiment.

FIG. 38 illustrates an example of a circuit configuration of a display section 10N according to the present modification. The display section 10N includes a plurality of scanning lines WSAL and WSBL extending in the row direction. In this example, the data lines DTL are provided so that one data line DTL is provided for two sub-pixels 11 in the row direction (the horizontal direction). One of the two sub-pixels 11 is connected to the scanning line WSAL and the other is connected to the scanning line WSBL. One end of the data line DTL is connected to a data-line drive section 27N. One end of each of the scanning lines WSAL and WSBL is connected to a scanning-line drive section 23N which is not illustrated. One end of the power line PL is connected to a power-line drive section 26N which is not illustrated. The scanning-line drive section 23N applies a scanning signal WSA to the scanning line WSAL, and applies a scanning signal WSB to the scanning line WSBL. The data-line drive section 27N generates the signal Sig including the pixel voltage Vsig of the two sub-pixels 11 and the voltage Vofs for performing the Vth correction, and applies the generated signal Sig to each data line DTL.

In the display section 10N according to the present modification, four and a half wiring lines (two scanning lines WS, one power line PL, and one and a half data lines DTL) are necessary for each cell CA or CB. In other words, the number of the wiring lines is further reduced compared to the case of the above-described embodiment (in which five wiring lines are necessary). Therefore, power consumption is reduced.

Figure 39:
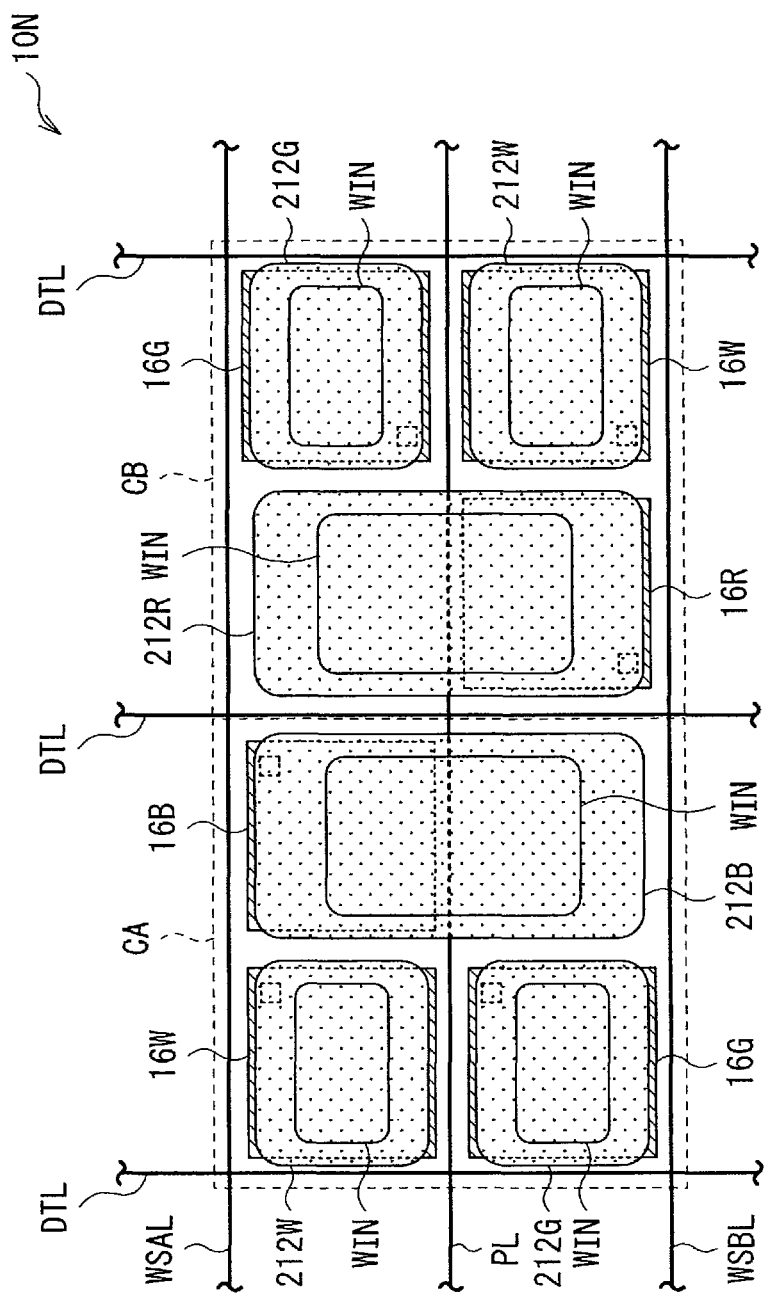
FIG. 39 is a plan view illustrating an arrangement example of anodes in the display section shown in FIG. 38.

FIG. 39 illustrates an arrangement of the anodes 212 in the display section 10N. The cell CA includes three circuit regions 16W, 16G, and 16B, and the cell CB includes three circuit regions 16W, 16G, and 16R. In this example, the circuit region 16W, the circuit region 16G, the circuit region 16B, the anode 212W, the anode 212G, and the anode 212B are arranged on the upper left, on the lower left, on the upper right, on the upper left, on the lower left, and on the right in the cell CA, respectively. Further, the circuit region 16W, the circuit region 16G, the circuit region 16R, the anode 212W, the anode 212G, and the anode 212R are arranged on the lower right, on the upper right, on the lower left, on the lower right, on the upper right, and on the left in the cell CB, respectively.

In such a manner, the anodes 212 are arranged so as not to overlap with the data lines DTL also in the display section 10N according to the present modification. Therefore, possibility of the noise to be transferred to the anodes 212 is reduced. Accordingly, image quality is improved.

Next, the sub-pixel 11W connected to the scanning line WSAL and the sub-pixel 11G connected to the scanning line WSBL will be referred as an example of two sub-pixels 11 that are connected to the same data line DTL and are adjacent to each other in the row direction (the horizontal direction), and thereby, display operation of these sub-pixels 11W and 11G will be described below in detail.

Figure 40:
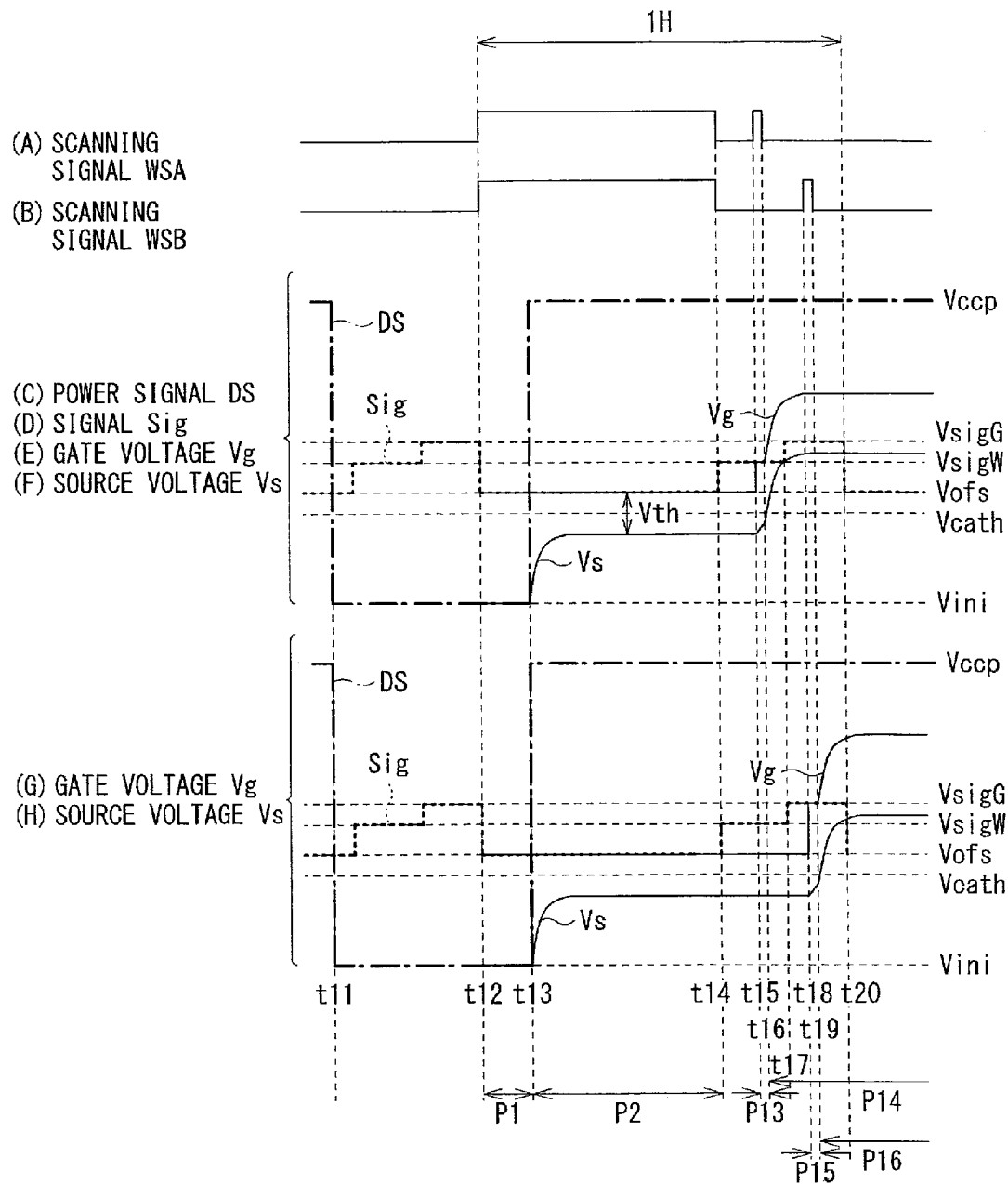
FIG. 40 is a timing waveform diagram illustrating an operation example of the display section shown in FIG. 38.

FIG. 40 illustrates a timing diagram of operation of the sub-pixels 11W and 11G. Parts (A), (B), (C), (D), (E), (F), (G), and (H) show waveforms of the scanning signal WSA, the scanning signal WSB, the power signal DS, the signal Sig, the gate voltage Vg of the driving transistor DRTr in the sub-pixel 11W, the source voltage Vs of the driving transistor DRTr in the sub-pixel 11W, the gate voltage Vg of the driving transistor DRTr in the sub-pixel 11G, and the source voltage Vs of the driving transistor DRTr in the sub-pixel 11G. In Parts (C) to (F) in FIG. 40, the respective waveforms are shown with the use of the same voltage axis. Similarly, in Parts (G) and (H) in FIG. 40, the respective waveforms are shown with the use of the same voltage axis. It is to be noted that, for the sake of convenience in description, the waveforms same as those of the power signal DS (Part (C) in FIG. 40) and the signal Sig (Part (D) in FIG. 40) are shown on the same voltage axis in Parts (G) and (H) in FIG. 40.

As in the case of the above-described embodiment, a drive section 20N according to the present modification initializes the sub-pixels 11W and 11G in a period from a timing t12 to a timing t13 (the initialization period P1), and performs the Vth correction in a period from the timing t13 to a timing t14 (the Vth correction period P2).

Next, at the timing t14, the scanning-line drive section 23N allows the respective voltages of the scanning signals WSA and WSB to vary from the high level to the low level (Parts (A) and (B) in FIG. 40). Accordingly, the writing transistor WSTr in each of the sub-pixels 11W and 11G is turned off. At the same time, the data-line drive section 27N sets the signal Sig at the pixel voltage VsigW (Part (D) in FIG. 40).

Next, in the period from a timing t15 to a timing t16 (a writing/μ-correction period P13), the drive section 20N writes a pixel voltage VsigW onto the sub-pixel 11W and performs the μ correction on the sub-pixel 11W. Specifically, at the timing t15, a scanning-line drive section 23N allows the voltage of the scanning signal WSA to vary from a low level to a high level (Part (A) in FIG. 40). Accordingly, the pixel voltage VsigW is written onto the sub-pixel 11W and the μ correction is performed on the sub-pixel 11W as in the above-described embodiment.

Subsequently, in a period beginning from the timing t16 (a light emission period P14), the drive section 20N allows the sub-pixel 11W to emit light. Specifically, at the timing t16, the scanning-line drive section 23N allows the voltage of the scanning signal WSA to vary from the high level to the low level (Part (A) in FIG. 40). Accordingly, the light-emitting device 19 in the sub-pixel 11W emits light as in the case of the above-described embodiment.

Subsequently, at the timing t17, the data-line driving section 27N sets the signal Sig at the pixel voltage VsigG (Part (D) in FIG. 40).

Subsequently, in a period from a timing t18 to a timing t19 (a writing/μ-correction period P15), the drive section 20N writes the pixel voltage VsigG onto the sub-pixel 11G and performs the μ correction on the sub-pixel 11G. Specifically, at the timing t18, the scanning-line drive section 23N allows the voltage of the scanning signal WSB to vary from the low level to the high level (Part (B) in FIG. 40). Accordingly, the pixel voltage VsigG is written onto the sub-pixel 11G and the μ correction is performed on the sub-pixel 11G as in the case of the above-described embodiment.

Subsequently, in a period beginning from the timing t19 (a light emission period P16), the drive section 20N allows the sub-pixel 11G to emit light. Specifically, at the timing t19, the scanning-line drive section 23N allows the voltage of the scanning signal WSB to vary from the high level to the low level (Part (B) in FIG. 40). Accordingly, the light-emitting device 19 in the sub-pixel 11G emits light as in the case of the above-described embodiment.

[Modification 1-12]

The first embodiment and the modifications thereof have been described above, and two or more thereof may be adopted in combination.

2. Second Embodiment

Next, a display 2 according to a second embodiment will be described. In the present embodiment, the waveform of the data line DTL is different from that in the case of the display 1 according to the above-described first embodiment. Components substantially the same as those in the display 1 according to the above-described first embodiment will be denoted with the same numerals, and will not be further described as appropriate.

As shown in FIG. 1, the display 2 includes a display section 40 and a drive section 50. As shown in FIGS. 2 and 3, in the display section 40, the cells CA each configured of three sub-pixels 11W, 11G, and 11B and the cells CB each configured of three sub-pixels 11W, 11G, and 11R are arranged side by side.

Figure 41:
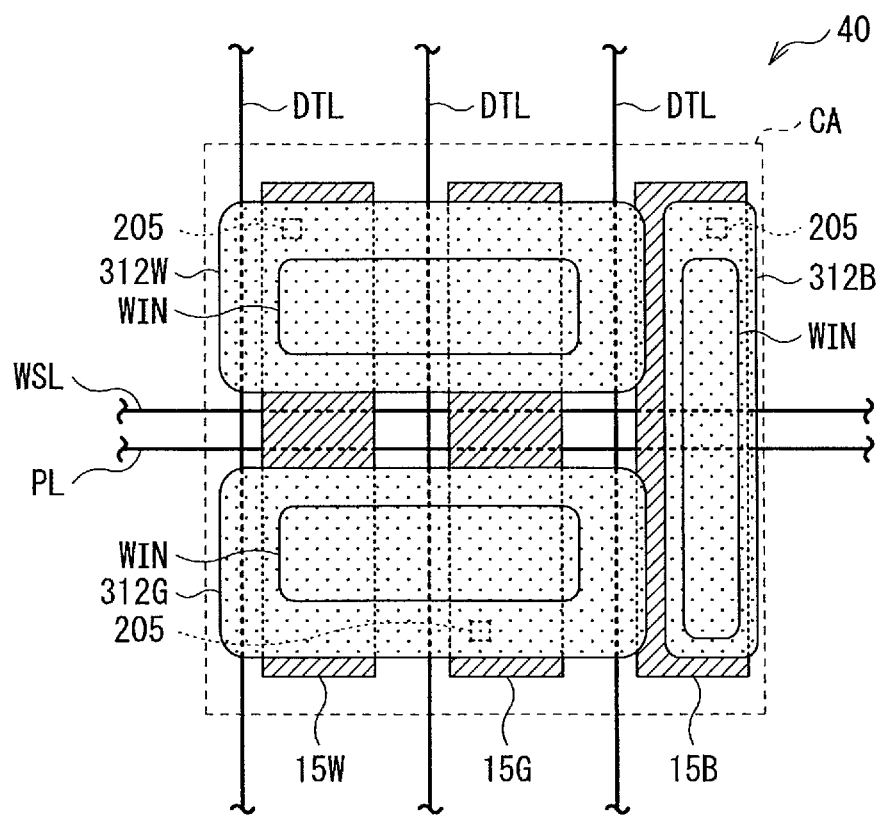
FIG. 41 is a plan view illustrating an arrangement example of anodes in a display according to a second embodiment.

FIG. 41 illustrates the arrangement of the anodes 212 in the cell CA. The cell CA includes three circuit regions 15W, 15G, and 15B, and three anodes 312W, 312G, and 312B. In this example, one data line DTL, the circuit region 15W, one data line DTL, the circuit region 15G, one data line DTL, and the circuit region 15B are arranged in order from left to right in the cell CA. The anodes 312W, 312G, and 312B are arranged on the upper left, on the lower left, and on the right in the cell CA, respectively. The anodes 312W and 312G are arranged so as to overlap with three data lines DTL, and the anode 312B is arranged so as not to overlap with the data lines DTL. Specifically, in the display section 10 according to the above-described first embodiment, the three anodes 212W, 212G, and 212B are arranged so as not to overlap with the data lines DTL. However, in the display section 40 according to the present embodiment, two (the anodes 312W and 312G) of the three anodes 312W, 312G, and 312B are arranged so as to overlap with three data lines DTL.

Description has been given above related to the cell CA. However, the same is applicable to the cell CB. Specifically, the cell CB includes three circuit regions 15W, 15G, and 15R, and three anodes 312W, 312G, and 312R. One data line DTL, the circuit region 15W, one data line DTL, the circuit region 15G, one data line DTL, and the circuit region 15R are arranged in order from left to right in the cell CB. The anodes 312W, 312G, and 312R are arranged on the upper left, on the lower left, and on the right in the cell CB, respectively. The anodes 312W and 312G are arranged so as to overlap with three data lines DTL, and the anode 312R is arranged so as not to overlap with the data lines DTL.

The drive section 50 includes a data-line drive section 57. The data-line drive section 57 generates a signal Sig in accordance with the image signal Sdisp2 supplied from the image signal processing section 30 and the control signal supplied from the timing generation section 22, and applies the generated signal Sig to each data line DTL. The signal Sig is configured of a pixel voltage Vsig instructing light-emission luminance in each sub-pixel 11.

Figure 42:
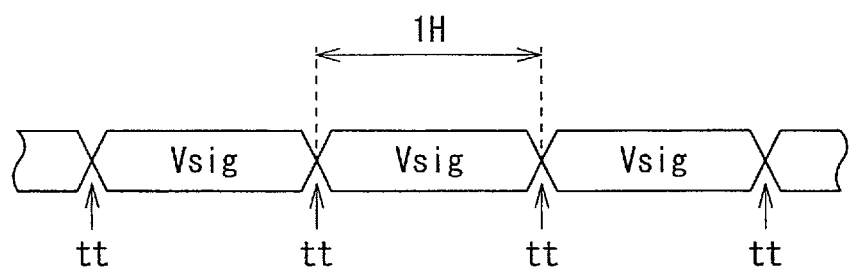
FIG. 42 is a waveform diagram illustrating an example of signals according to the second embodiment.

FIG. 42 illustrates an example of the signal Sig generated by the data-line drive section 57. The signal Sig is configured of a series of a plurality of pixel voltages Vsig that are to be supplied to a plurality of sub-pixels 11 connected to the same data line DTL. The pixel voltage Vsig is allowed to be varied for every one horizontal period. Specifically, in the above-described first embodiment, the pixel voltages Vsig and the voltages Vofs are arranged alternately to configure the signal Sig as shown in FIG. 10. However, in the present embodiment, the signal Sig is configured without including the voltage Vofs.

[Concerning Detailed Operation]

Figure 43:
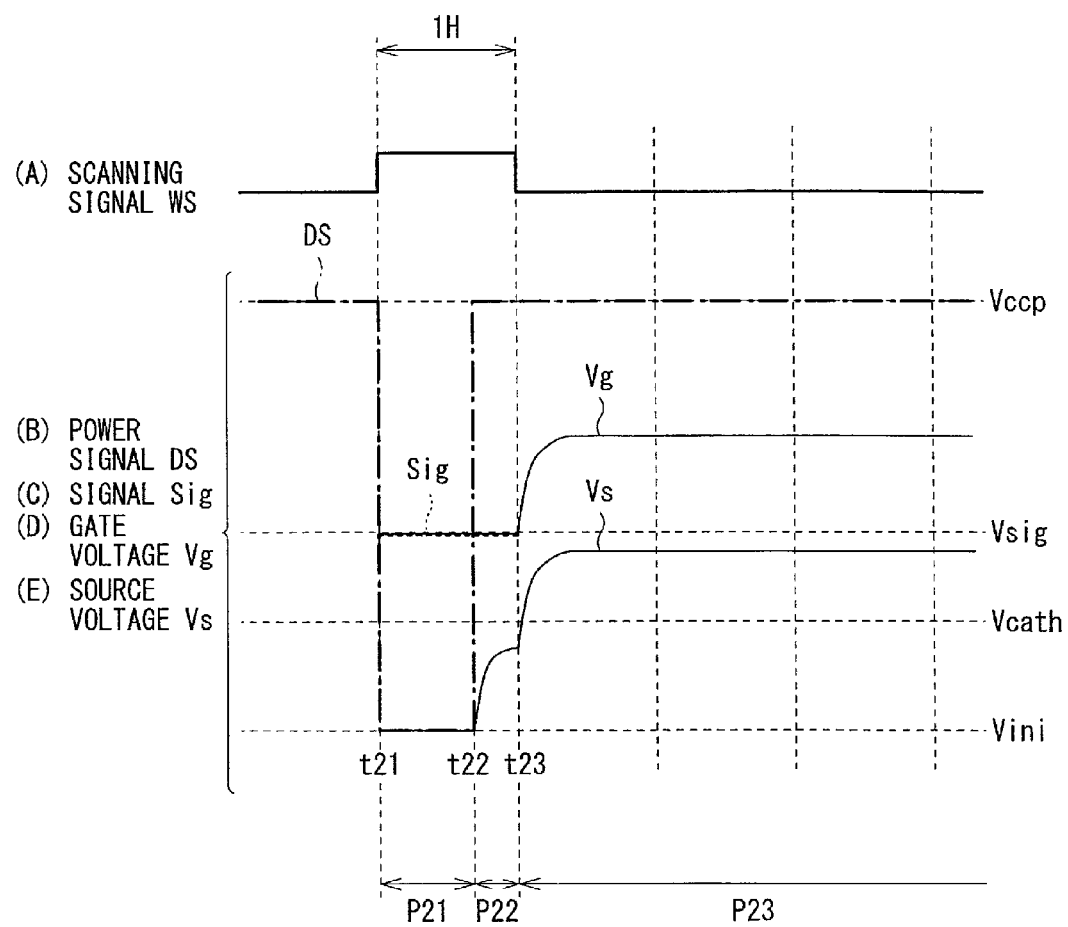
FIG. 43 is a timing waveform diagram illustrating an operation example of the display according to the second embodiment.

FIG. 43 illustrates a timing diagram of display operation in the display 2. The timing diagram illustrates an operation example of display drive with respect to one targeted sub-pixel 11. In FIG. 43, Parts (A), (B), (C), (D), and (E) show the waveforms of the scanning signal WS, the power signal DS, the signal Sig, the gate voltage Vg of the driving transistor DRTr, and the source voltage Vs of the driving transistor DRTr, respectively. The respective waveforms are shown with the use of the same voltage axis in Parts (B) to (E) in FIG. 43.

In one horizontal period (1H), the drive section 50 writes the pixel voltage Vsig onto the sub-pixel 11 and initializes the sub-pixel 11 (a writing period P21), and performs Ids correction for suppressing the influence of the device variations in the driving transistors DRTr on image quality (an Ids correction period P22). Thereafter, the light-emitting device 19 in the sub-pixel 11 emits light with luminance in accordance with the written pixel voltage Vsig (a light emission period P23). The details thereof will be described below.

First, in a period from a timing t21 to a timing t22 (the writing period P21), the drive section 50 writes the pixel voltage Vsig onto the sub-pixel 11 and initializes the sub-pixel 11. Specifically, first, at the timing t21, the data-line drive section 57 sets the signal Sig at the pixel voltage Vsig (Part (C) in FIG. 43), and the scanning-line drive section 23 allows the voltage of the scanning signal WS to vary from the low level to the high level (Part (A) in FIG. 43). Accordingly, the writing transistor WSTr is turned on, and the gate voltage Vg of the driving transistor DRTr is set at the pixel voltage Vsig (part (D) in FIG. 43). At the same time, the power-line drive section 26 allows the power signal DS to vary from the voltage Vccp to the voltage Vini (Part (B) in FIG. 43). Accordingly, the driving transistor DRTr is turned on, and the source voltage Vs of the driving transistor DRTr is set at the voltage Vini (Part (E) in FIG. 43). Accordingly, the gate-source voltage Vgs (=Vsig−Vini) of the driving transistor DRTr is set at a voltage that is larger than the threshold voltage Vth of the driving transistor DRTr, and the sub-pixel 11 is initialized.

Next, in a period from the timing t22 to a timing t23 (the Ids correction period P22), the drive section 50 performs the Ids correction on the sub-pixel 11. Specifically, at the timing t22, the power-line drive section 26 allows the power signal DS to vary from the voltage Vini to the voltage Vccp (Part (B) in FIG. 43). Accordingly, the driving transistor DRTr operates in a saturated region, a current Ids flows from the drain to the source, and the source voltage Vs is increased (Part (E) in FIG. 43). At this time, in this example, the source voltage Vs is lower than the voltage Vcath of the cathode of the light-emitting device 19. Therefore, the light-emitting device 19 retains a reverse-bias state, and a current is not flown into the light-emitting device 19. Since the gate-source voltage Vgs is decreased because of the increase in the source voltage Vs, the current Ids is decreased. Due to this negative feedback operation, the source voltage Vs is increased more slowly with time. The length of time period for performing the Ids correction (the period from the timing t22 to the timing t23) is determined in order to suppress the variations in the current Ids at the timing t23, as will be described later.

Subsequently, in a period beginning from the timing t23 (the light emission period P23), the drive section 50 allows the sub-pixel 11 to emit light. Specifically, at the timing t23, the scanning-line drive section 23 allows the voltage of the scanning signal WS to vary from the high level to the low level (Part (A) in FIG. 43). Accordingly, the writing transistor WSTr is turned off, and the gate of the driving transistor DRTr becomes in a floating state. Therefore, a voltage between terminals of the capacitor Cs, that is, the gate-source voltage Vgs of the driving transistor DRTr is maintained thereafter. The source voltage Vs of the driving transistor DRTr is increased (Part (E) in FIG. 43) as the current Ids flows into the driving transistor DRTr, and the gate voltage Vg of the driving transistor DRTr is also increased accordingly (Part (D) in FIG. 43). When the source voltage Vs of the driving transistor DRTr becomes higher than the sum (Vel+Vcath) of a threshold voltage Vel of the light-emitting device 19 and the voltage Vcath, a current flows between the anode and the cathode of the light-emitting device 19, and thereby, the light-emitting device 19 emits light. In other words, the source voltage Vs is increased by an amount in accordance with the device variations in the light-emitting devices 19, and the light-emitting device 19 emits light.

Subsequently, it is transferred from the light emission period P23 to the writing period P21 after a predetermined period (one frame period) elapses in the display 2. The drive section 50 drives the display section 40 so as to repeat the above-described series of operation.

[Concerning Ids Correction]

As described above, in the Ids correction period P22, the current Ids flows from the drain to the source of the driving transistor DRTr, the source voltage Vs is increased, and the gate-source voltage Vgs is decreased gradually. Accordingly, the current Ids that flows from the drain to the source of the driving transistor DRTr is also decreased gradually.

Figure 44:
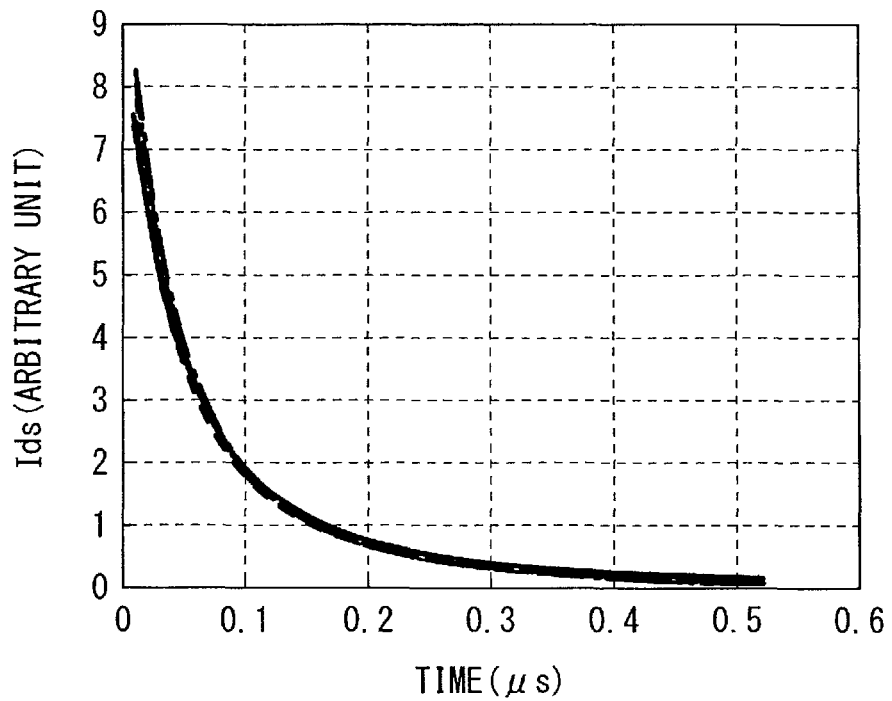
FIG. 44 is an explanatory diagram for explaining operation of the display according to the second embodiment.

FIG. 44 illustrates variation in the current Ids with time when a certain pixel voltage Vsig is applied. FIG. 44 shows a simulation result assuming to manufacture transistors under a plurality of process conditions that are different from one another. The current Ids is decreased gradually with time as shown in FIG. 44. At this time, the variation in the current Ids with time differs depending on the process condition. Specifically, for example, the current Ids is decreased faster when the value of the current Ids is large (when the mobility μ is high and the threshold Vth is low), and the current Ids is decreased slower when the value of the current Ids is small (when the mobility μ is low and the threshold Vth is high).

Figure 45:
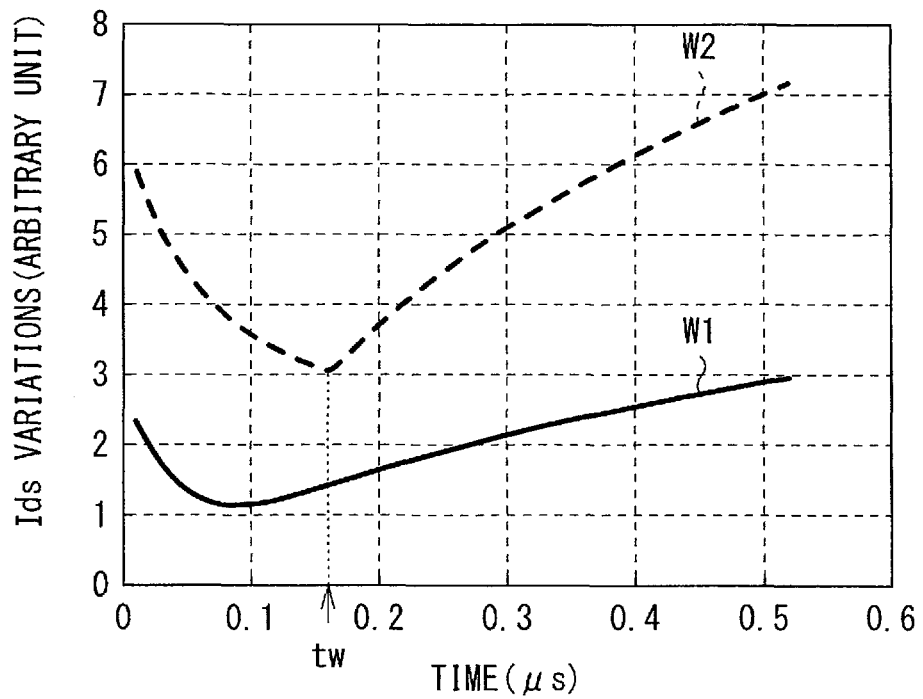
FIG. 45 is another explanatory diagram for explaining the operation of the display according to the second embodiment.

FIG. 45 illustrates dependency, on time, of the variations in the current Ids shown in FIG. 44. The characteristics W1 show values (δ/ave.) obtained by dividing standard deviation by average value. The characteristics W2 show values obtained by dividing variation range by average value (Range/ave.). As shown in FIG. 44, the variations in the current Ids have a local minimum value at a certain time t (for example, at a time tw in the characteristics W2). Accordingly, when the Ids correction is performed with the length of the time tw, the variation range of the current Ids is decreased to the minimum.

In such a manner, the length of the Ids correction period P22 (the timing t22 to the timing t23 in FIG. 43) is set to the length (for example, of the time tw) to allow the variations in the current Ids to be small in the display 2. Accordingly, the variations in the current Ids at the timing t23 are suppressed. Therefore, degradation in image quality is suppressed.

[Concerning Image Quality]

In the display 2, the anodes 312W and 312G are arranged so as to overlap with three data lines DTL, and the anode 312R is arranged so as not to overlap with the data line DTL, as shown in FIG. 41. Accordingly, image quality is improved as described below.

Specifically, by arranging the anodes 312W and 312G to overlap with three data lines DTL, the areas of the anodes 312W and 312G are increased, and therefore, the openings WIN are widened. When the openings WIN are widened in such a manner, current density in the light-emitting layer 230 is allowed to be lower compared to the case of the narrower openings WIN, when the same light-emission luminance is achieved. Therefore, in the display 2, degradation in the light-emitting layer 230 with time (so-called screen burn-in) is suppressed, and accordingly, image quality is improved.

At this time, the anodes 312W and 312G overlap with three data lines DTL. Therefore, the signals Sig in these three data lines DTL may be transferred as a noise to the anodes 312W and 312G because of coupling. However, the noise caused in the anodes 312W and 312G is the sum of the noises from the three signals Sig, and the noises from the three signals Sig cancel out one another. Therefore, the influence of the noises on image quality is reduced. In other words, as shown in FIG. 42, the signal Sig does not include the voltage Vofs unlike in the case of the above-described first embodiment, and is configured of a plurality of continuous pixel voltages Vsig. Therefore, both of transfer of voltage in an increasing direction (rising transfer) and transfer of voltage in a decreasing direction (falling transfer) may be caused at a transfer timing for each one horizontal period (1H). Therefore, when both the rising transfer and the falling transfer are caused in the three signals Sig at a certain transfer timing tt, the noises caused in the anodes 312W and 312G cancel out one another. Accordingly, the noise is suppressed, and image quality is improved.

As described above, in the present embodiment, the anodes are arranged so as to overlap with the plurality of signal lines, and the series of the plurality of pixel voltages are used to configure the signal Sig. Therefore, image quality is improved. Other effects are similar to those in the above-described first embodiment.

[Modification 2-1]

In the above-described embodiment, the voltage at the falling portion of the scanning signal WS varies in short time. However, this is not limitative. Alternatively, for example, the voltage at the falling portion may be decreased gradually. The present modification will be described below in detail.

Figure 46:
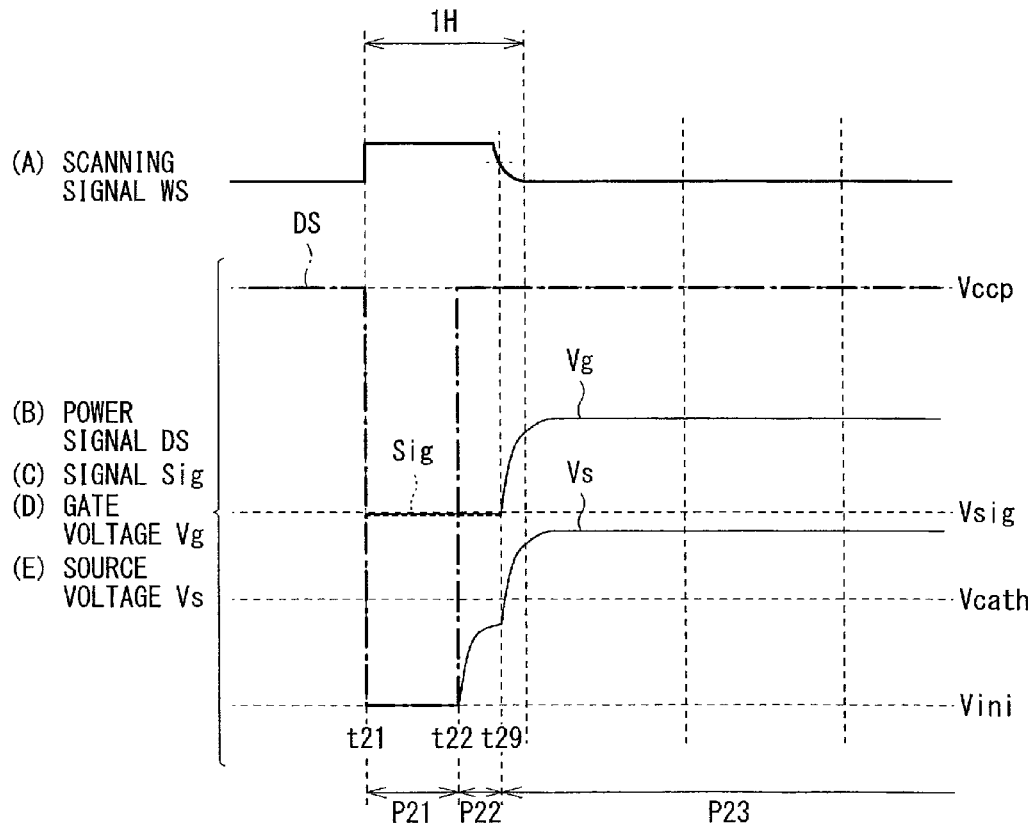
FIG. 46 is a timing waveform diagram illustrating an operation example of the display according to the second embodiment.

FIG. 46 illustrates a timing diagram of display operation in a display 2A according to the present modification. In FIG. 46, Parts (A), (B), (C), (D), and (E) show waveforms of the scanning signal WS, the power signal DS, the signal Sig, the gate voltage Vg of the driving transistor DRTr, and the source voltage Vs of the driving transistor DRTr, respectively.

First, in a period from the timing t21 to the timing t22 (the writing period P21), a drive section 50A according to the present modification writes the pixel voltage Vsig onto the sub-pixel 11 and initializes the sub-pixel 11 as in the above-described second embodiment.

Next, in a period from the timing t22 to a timing t29 (an Ids correction period P22), the drive section 50A performs the Ids correction on the sub-pixel 11 as in the display section 40 according to the above-described second embodiment. At that time, a scanning-line drive section 23A according to the present modification generates the scanning signal WS having the waveform in which the voltage of the falling portion is decreased gradually (Part (A) in FIG. 46). Thus, the drive section 50A so operates as to allow the time length (from the timing t22 to the timing t29) of the Ids correction period P22 to be different depending on the level of the pixel voltage Vsig.

Figure 47:
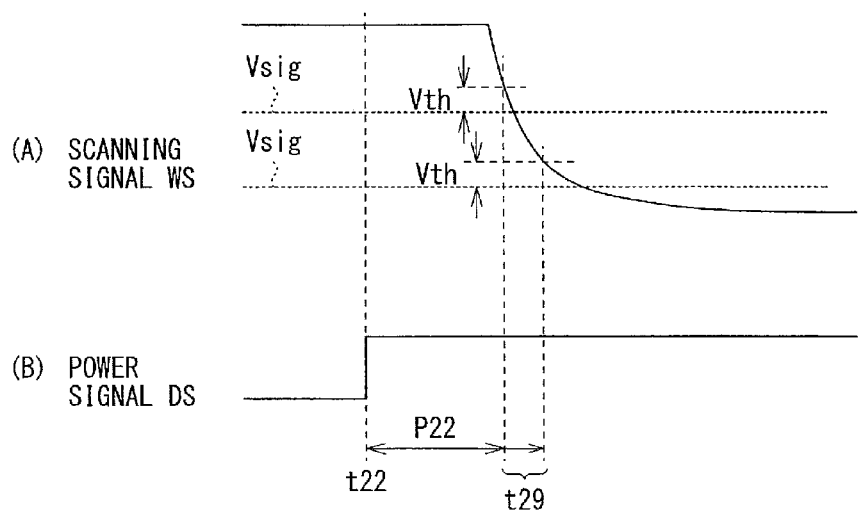
FIG. 47 is an explanatory diagram for explaining operation of the display according to the second embodiment.

FIG. 47 illustrates a timing diagram of the Ids correction operation. In FIG. 47, Parts (A) and (B) illustrate waveforms of the scanning signal WS and the power signal DS, respectively. The writing transistor WSTr is turned on when the voltage of the scanning signal WS is higher than the value of sum of the pixel voltage Vsig and the threshold voltage Vth (Vsig+Vth). The writing transistor WSTr is turned off when the voltage of the scanning signal WS is lower than a value of the sum (Vsig+Vth). As shown in Part (A) in FIG. 47, the voltage of the scanning signal WS is decreased gradually when the voltage falls. Therefore, the timing t29 at which the writing transistor WSTr varies from ON to OFF depends on the level of the pixel voltage Vsig. In other words, the length of the time period of the Ids correction period P22 depends on the level of the pixel voltage Vsig. Specifically, the time period of the Ids correction period P22 is shorter as the level of the pixel voltage Vsig is higher, and the time period of the Ids correction period P22 is longer as the level of the pixel voltage Vsig is lower.

After the Ids correction is completed, in a period beginning from the timing t29 (the light emission period P23), the drive section 50A allows the sub-pixel 11 to emit light as in the case of the above-described second embodiment.

In such a manner, in the display 2A, the voltage of the falling portion of the waveform of the scanning signal WS is decreased gradually. Accordingly, image quality is improved as described below.

As shown in FIGS. 44 and 45, the variations in the current Ids have the local minimum value at a certain time t (for example, the time tw in the characteristics W2). The time when the variations in the current Ids have the local minimum value varies depending on the pixel voltage Vsig.

Figure 48:
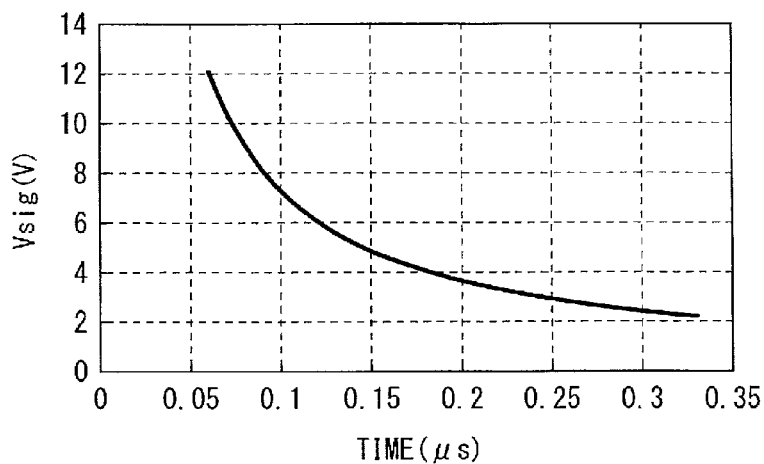
FIG. 48 is another explanatory diagram for explaining the operation of the display according to the second embodiment.

FIG. 48 illustrates a relationship between the pixel voltage Vsig and the time when the variations in the current Ids have the local minimum value. As shown in FIG. 48, the time period in which the variations in the current Ids have the local minimum value is shorter as the pixel voltage Vsig is higher, and is longer as the pixel voltage Vsig is lower. In other words, when the time period of the Ids correction period P22 is allowed to be shorter as the pixel voltage Vsig is higher, and is allowed to be longer as the pixel voltage Vsig is lower, the variations in the current Ids at the timing t29 are suppressed independently from the pixel voltage Vsig.

In the display 2A, in order to allow the length of the time period of the Ids correction period P22 to vary depending on the pixel voltage Vsig in such a manner, the voltage of the falling portion of the scanning signal WS is decreased gradually. Specifically, the waveform of the falling portion of the scanning signal WS is generated so as to achieve the characteristics shown in FIG. 48. Therefore, the variations in the current Ids are suppressed independently of the pixel voltage Vsig. Accordingly, degradation in image quality is suppressed.

It is to be noted that a method of generating such a waveform of the scanning signal WS is disclosed, for example, in Japanese Unexamined Patent Application Publication No. 2008-9198.

[Modification 2-2]

In the above-described embodiment, the Ids correction is performed. However, this is not limitative. Alternatively, the Ids correction may not be performed. The present modification will be described below in detail.

Figure 49:
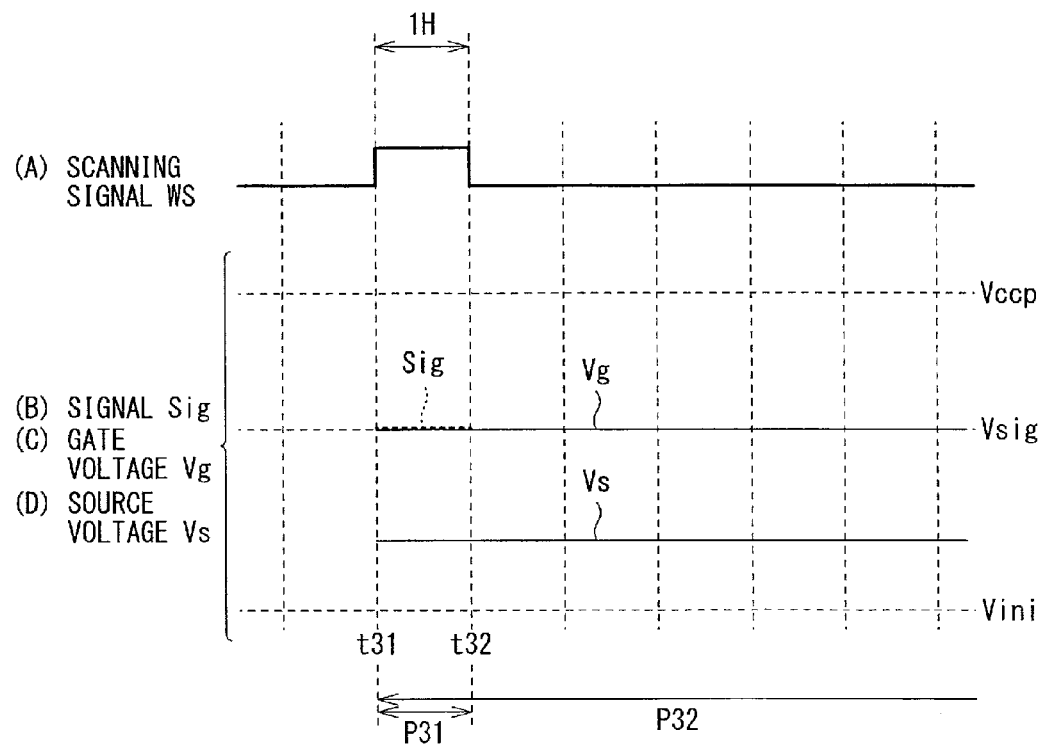
FIG. 49 is a timing waveform diagram illustrating an operation example of a display according to a modification of the second embodiment.

FIG. 49 illustrates a timing diagram of display operation in a display 2B according to the present modification. In FIG. 49, Parts (A), (B), (C), and (D) show waveforms of the scanning signal WS, the signal Sig, the gate voltage Vg of the driving transistor DRTr, and the source voltage Vs of the driving transistor DRTr, respectively.

In a period from a timing t31 to a timing t32 (a writing period P31), a drive section 50B according to the present modification writes the pixel voltage Vsig onto the sub-pixel 11. Specifically, first, at the timing t31, the data-line drive section 57 sets the signal Sig at the pixel voltage Vsig (Part (B) in FIG. 49), and the scanning-line drive section 23 allows the voltage of the scanning signal WS to vary from the low level to the high level (Part (A) in FIG. 49). Accordingly, the writing transistor WSTr is turned on, and the gate voltage Vg of the driving transistor DRTr is set at the voltage Vsig (Part (C) in FIG. 49). Further, the current Ids of the driving transistor DRTr flows into the light-emitting device 19, and the source voltage Vs is determined (Part (D) in FIG. 49). In such a manner, the light-emitting device 19 emits light in a period beginning from the timing t31 (a light emission period P32).

Also in this case, the series of the plurality of pixel voltages configure the signal Sig. Therefore, image quality is improved as in the case of the above-described second embodiment.

[Modification 2-3]

Figure 23:
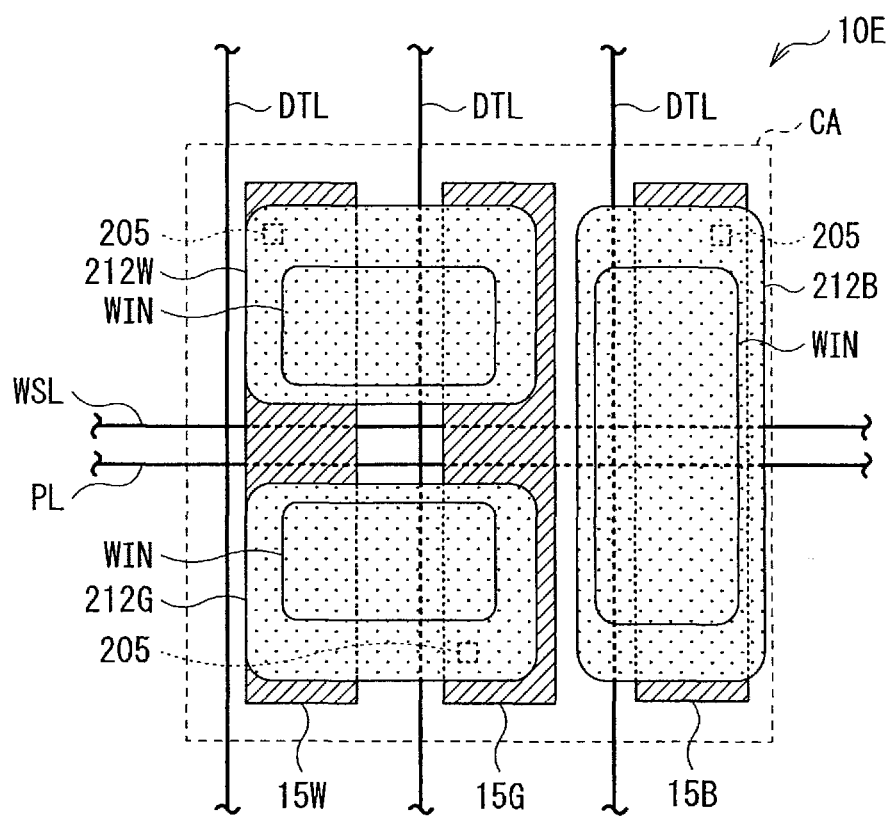
FIG. 23 is a plan view illustrating an arrangement example of anodes according to another modification of the first embodiment.

In the above-described embodiment, the anodes 312W and 312G are arranged so as to overlap with three data lines DTL. However, this is not limitative. Alternatively, for example, each anode 212 may be arranged so as not to overlap with the data line DTL as in the case of the above-described first embodiment (FIG. 7), or each anode 212 may be arranged so as to overlap with one data line DTL as in the case of the above-described Modifications 1-5 of the first embodiment (FIG. 23).

[Modification 2-4]

The second embodiment and the modifications thereof have been described above. Two or more thereof may be adopted in combination. Further, one or more of the above-described modifications of the first embodiment may be adopted in combination therewith.

3. Application Examples

Next, application examples of the displays described in the above embodiments and modifications will be described.

Figure 50:
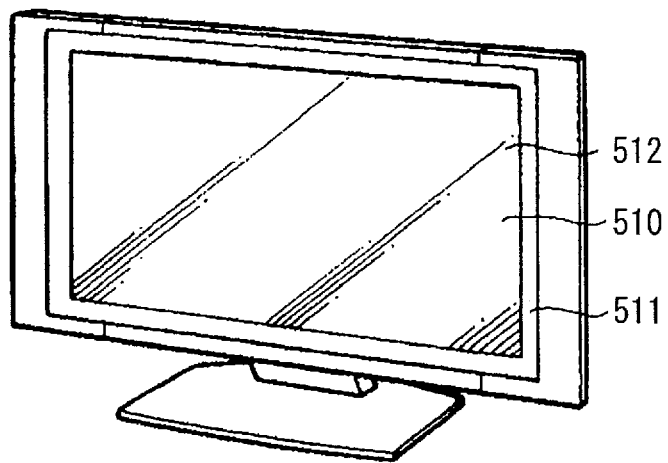
FIG. 50 is a perspective view illustrating an appearance configuration of a television to which the display according to any of the embodiments is applied.

FIG. 50 illustrates an appearance of a television to which any of the displays according to the above-described embodiments and the like is applied. The television includes, for example, an image display screen section 510 that includes a front panel 511 and a filter glass 512. The television is configured of any of the displays according to the above-described embodiments and the like.

The displays according to the above-described embodiments and the like are applicable to electronic apparatuses in any field such as digital cameras, notebook personal computers, mobile terminal apparatuses such as mobile phones, mobile game consoles, and video camcorders, other than such a television. In other words, the displays according to the above-described embodiments and the like are applicable to electronic apparatuses in any filed that display images.

The present technology has been described above referring to some embodiments, modifications, and application examples to electronic apparatuses. However, the present technology is not limited to the above-described embodiments and the like, and may be variously modified.

For example, in the above-described embodiments and the like, the writing transistor WSTr and the driving transistor DRTr are each configured of NMOS. However, this is not limitative. Alternatively, one or both of the writing transistor WSTr and the driving transistor DRTr may be configured of PMOS.

Figure 51:
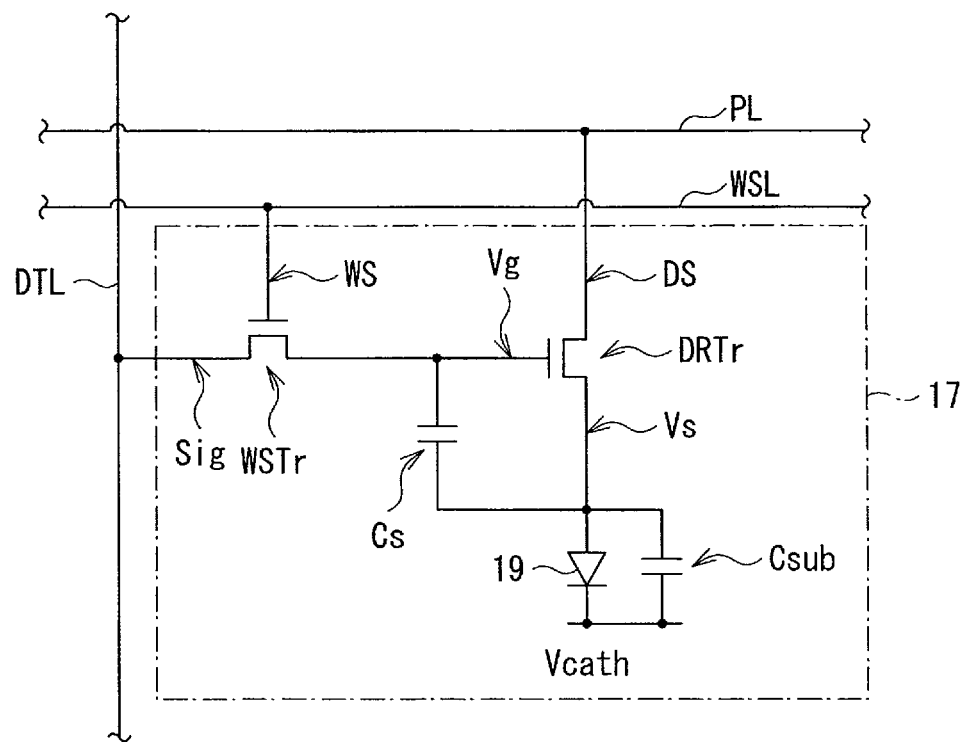
FIG. 51 is a circuit diagram illustrating a configuration example of a sub-pixel according to a modification.
Figure 52:
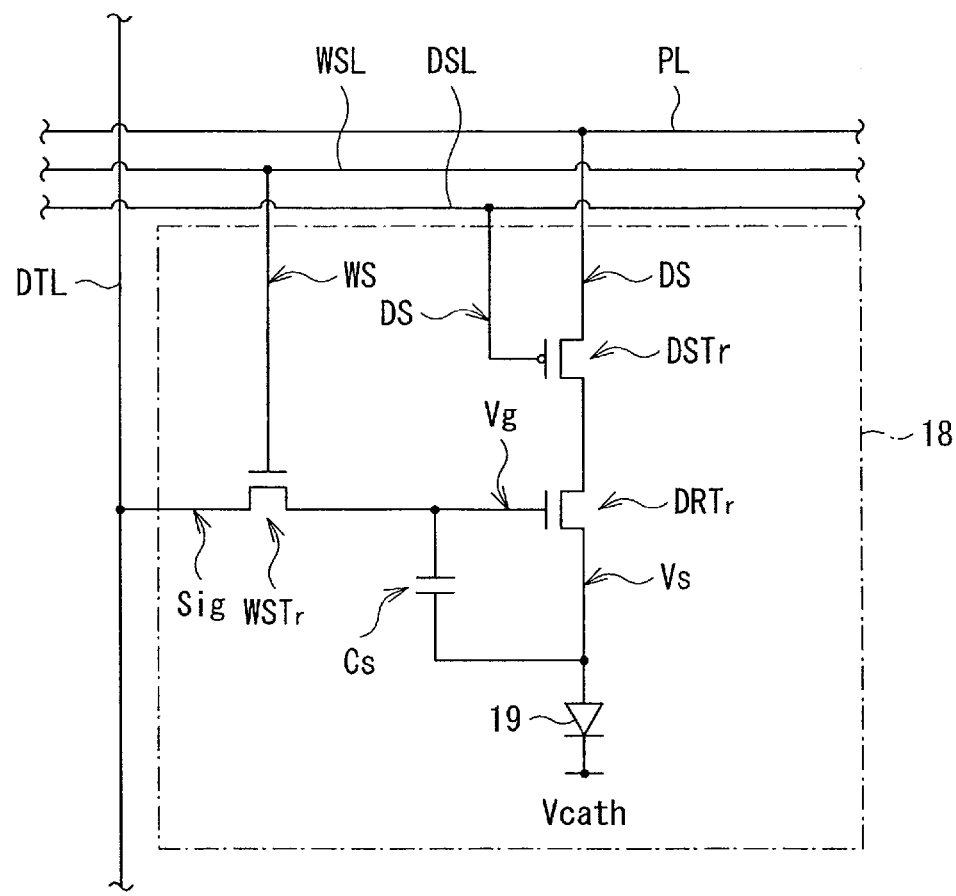
FIG. 52 is a circuit diagram illustrating another configuration example of a sub-pixel according to a modification.

Moreover, in the above-described embodiments and the like, the sub-pixel has a so-called "2Tr1C" configuration, for example. However, this is not limitative, and other devices may be provided in addition thereto. Specifically, for example, as in a sub-pixel 17 shown in FIG. 51, a capacitor Csub connected to the light-emitting device 19 in parallel may be further provided to have a so-called "2Tr2C" configuration. Alternatively, for example, as in a sub-pixel 18 shown in FIG. 52, a power transistor DSTr that controls supply of the power signal DS to the driving transistor DRTr may be provided to have a so-called "3Tr1C" configuration.

Moreover, for example, in the above-described embodiments, the display includes the organic EL display device. However, this is not limitative, and any display may be adopted as long as the display includes a current-driven display device.

It is possible to achieve at least the following configurations from the above-described example embodiments and the modifications of the disclosure.

[Configuration 1]

A display device comprising:

a plurality of pixels on a substrate, each pixel of the plurality of pixels including a set of sub-pixels each being one of:

first sub-pixels configured to emit light of a first color, second sub-pixels configured to emit light of a second color, third sub-pixels configured to emit light of a third color, and fourth sub-pixels configured to emit light of a fourth color; and a drive section that is configured to drive the plurality of pixels, wherein a first subset of the plurality of pixels each includes one of the first sub-pixels, one of the second sub-pixels, and one of the third sub-pixels, but not one of the fourth sub-pixels, and a second subset of the plurality of pixels each includes one of the first sub-pixels, one of the second sub-pixels, and one of the fourth sub-pixels, but not one of the third sub-pixels, and the plurality of pixels alternate, in at least one of a column direction and a row direction, between the first subset and the second subset.

[Configuration 2]

The display device of any one of configurations 1 and 3-15, wherein, for each of the plurality of pixels, each of the sub-pixels included therein has:

a light emitting element that includes an anode electrode, and a corresponding pixel circuit that is connected to the anode electrode and configured to drive the light emitting element, and respective layout regions of the anode electrodes of the first and second sub-pixels do not coincide with the respective layout regions of their corresponding pixel circuits.

[Configuration 3]

The display device of any one of configurations 1, 2, and 4-15, wherein, for each of the plurality of pixels, each of the sub-pixels included therein has:

a light emitting element that includes an anode electrode, and a corresponding pixel circuit that is connected to the anode electrode and configured to drive the light emitting element, and for each of the plurality of pixels, a layout region of the anode electrode of the first sub-pixel overlaps, from a plan perspective, a layout region of the pixel circuit of the second sub-pixel, and a layout region of the anode electrode of the second sub-pixel overlaps, from a plan perspective, a layout region of the pixel circuit of the first sub-pixel.

[Configuration 4]

The display device of any one of configurations 1-3 and 5-15, wherein for each pixel of the first subset, a layout region of the anode electrode of the third sub-pixel does not overlap, from a plan perspective, a layout region of the pixel circuit of the first sub-pixel or a layout region of the pixel circuit of the second sub-pixel, and for each pixel of the second subset, a layout region of the anode electrode of the fourth sub-pixel does not overlap, from a plan perspective, a layout region of the pixel circuit of the first sub-pixel or a layout region of the pixel circuit of the second sub-pixel.

[Configuration 5]

The display device of any one of configurations 1-4 and 6-15, wherein, for each of the plurality of pixels, each of the sub-pixels included therein has:

a light emitting element that includes an anode electrode, and a corresponding pixel circuit that is connected to the anode electrode and configured to drive the light emitting element, and respective layout regions of the anode electrodes of first and second sub-pixels extend longitudinally in a first direction, and respective layout regions of the pixel circuits of the first and second sub-pixels extend longitudinally in a second direction different from the first direction.

[Configuration 6]

The display device of any one of configurations 1-5 and 7-15, wherein, for each of the plurality of pixels, each of the sub-pixels included therein has:

a light emitting element that includes an anode electrode, and a corresponding pixel circuit that is connected to the anode electrode and configured to drive the light emitting element, and respective layout regions of the anode electrodes of the first, second, third, and fourth sub-pixels do not overlap, from a plan perspective, any one of data lines that supply video signal voltages to the plurality of pixels.

[Configuration 7]

The display device of any one of configurations 1-6 and 8-15, wherein, for each of the plurality of pixels, each of the sub-pixels included therein has:

a light emitting element that includes an anode electrode, and a corresponding pixel circuit that is connected to the anode electrode and configured to drive the light emitting element, and respective layout regions of the anode electrodes of the first, second, third, and fourth sub-pixels each overlap, from a plan perspective, exactly one of data lines that supply video signal voltages to the plurality of pixels.

[Configuration 8]

The display device of any one of configurations 1-7 and 9-15, wherein for each of the plurality of pixels, the layout region of the anode electrode of the first sub-pixel overlaps, from a plan perspective, the layout region of the pixel circuit of the second sub-pixel, and the layout region of the anode electrode of the second sub-pixel overlaps, from a plan perspective, the layout region of the pixel circuit of the first sub-pixel.

[Configuration 9]

The display device of any one of configurations 1-8 and 10-15, wherein, for each of the plurality of pixels, each of the sub-pixels included therein has:
- a light emitting element that includes an anode electrode, and
- a corresponding pixel circuit that is connected to the anode electrode and configured to drive the light emitting element, and respective layout regions of the anode electrodes of the first and second sub-pixels each overlap, from a plan perspective, exactly three of data lines that supply video signal voltages to the plurality of pixels, and respective layout regions of the anode electrodes of the third and fourth sub-pixels each do not overlap, from a plan perspective, any one of the data lines.

[Configuration 10]

The display device of any one of configurations 1-9 and 11-15, wherein aspect ratios of respective layout regions of the anode electrodes of the first and second sub-pixels are all smaller than aspect ratios of respective layout regions of the anode electrodes of the third and fourth sub-pixels, where the aspect ratio of a layout region is the length of a longest side thereof divided by the length of the shortest side thereof.

[Configuration 11]

The display device of any one of configurations 1-10 and 12-15, wherein respective layout regions of the anode electrodes of the first and second sub-pixels extend longitudinally in a first direction, and respective layout regions of the anode electrodes of the third and fourth sub-pixels extend longitudinally in a second direction different from the first direction.

[Configuration 12]

The display device of any one of configurations 1-11 and 13-15, wherein the first color is green, the second color is white, the third color is red, and the fourth color is blue.

[Configuration 13]

The display device of any one of configurations 1-12, 14 and 15, wherein the area of the layout region of the anode electrode of each of the blue and red sub-pixels is greater than the area of the layout region of the anode electrode of each of the green sub-pixels, which are each greater than or equal to the area of the layout region of each of the anode electrodes of the white sub-pixels.

[Configuration 14]

A display device comprising:

a plurality of pixels on a substrate, each pixel of the plurality of pixels including a set of sub-pixels each being one of:
- first sub-pixels configured to emit light of a first color,
- second sub-pixels configured to emit light of a second color,
- third sub-pixels configured to emit light of a third color, and
- fourth sub-pixels configured to emit light of a fourth color, wherein a first subset of the plurality of pixels each includes one of the first sub-pixels, one of the second sub-pixels, and one of the third sub-pixels, and a second subset of the plurality of pixels each includes one of the first sub-pixels, one of the second sub-pixels, and one of the fourth sub-pixels, and resolutions of the third sub-pixels and the fourth sub-pixels each are lower than resolutions of either of the first sub-pixels and the second sub-pixels.

[Configuration 15]

The display device of any one of configurations 1-14, wherein an amount of the third sub-pixels is half of an amount of the first sub-pixels.

[Configuration 16]

An electronic apparatus comprising the display device of any one of configurations 1-15.

Moreover, it is possible to achieve at least the following configurations from the above-described example embodiments and the modifications of the disclosure.

(1) A display including:

first pixel sets each configured of a combination of a first pixel, a second pixel, and a non-basic color pixel; and second pixel sets each configured of a combination of the first pixel, a third pixel, and the non-basic color pixel, the first pixel sets and the second pixel sets being arranged alternately in a first direction, a second direction, or both, the second direction intersecting with the first direction, the first pixel being configured to emit first basic color light, the second pixel being configured to emit second basic color light, the third pixel being configured to emit third basic color light, and the non-basic color pixel being configured to emit one color light other than the first to third basic color lights.

(2) The display according to (1), further including a plurality of signal lines extending in the first direction, wherein each of the first pixel, the second pixel, the third pixel, and the non-basic color pixel includes a light-emitting device including a pixel electrode, the pixel electrode in the first pixel is arranged to overlap with all of predetermined one or more signal lines of the plurality of signal lines, the predetermined one or more signal lines being arranged in an arrangement region of the pixel set to which the first pixel belongs, and the pixel electrode in the non-basic color pixel is arranged to overlap with all of predetermined one or more signal lines of the plurality of signal lines, the predetermined one or more signal lines being arranged in an arrangement region of the pixel set to which the non-basic color pixel belongs.

(3) The display according to (2), wherein the pixel electrode in the second pixel and the pixel electrode in the third pixel are arranged to overlap with none of the plurality of signal lines.

(4) The display according to (1), further including a plurality of signal lines extending in the first direction, wherein each of the first pixel, the second pixel, the third pixel, and the non-basic color pixel includes a light-emitting device including a pixel electrode arranged to overlap with any one of the plurality of signal lines.

(5) The display according to (1), further including
a plurality of signal lines extending in the first direction, wherein
each of the first pixel, the second pixel, the third pixel, and the non-basic color pixel includes a light-emitting device including a pixel electrode arranged to overlap with none of the plurality of signal lines.
(6) The display according to any one of (2) to (5), further including
a drive section configured to apply a pixel signal to each of the plurality of signal lines, wherein,
in the pixel signal, luminance signal portions each determining luminance of a pixel are arranged in series on a time axis.
(7) The display according to (4) or (5), further including
a drive section configured to apply a pixel signal to each of the plurality of signal lines, wherein,
the pixel signal includes direct-current signal portions and luminance signal portions each determining luminance of a pixel, and
the luminance signal portions and the direct-current signal portions are arranged alternately on a time axis.
(8) The display according to (6) or (7), further including:
a filter section configured to perform filter processing on a first luminance information map corresponding to the second basic color light, and to perform filter processing on a second luminance information map corresponding to the third basic color light; and
a luminance information extraction section configured to extract first luminance information of a position corresponding to one first pixel set of the first pixel sets from the first luminance information map that has been subjected to the filter processing, and to extract second luminance information of a position corresponding to one second pixel set of the second pixel sets from the second luminance information map that has been subjected to the filter processing, wherein
the drive section generates the luminance signal portion corresponding to the second pixel included in the one first pixel set of the first pixel sets based on the first luminance information, and generates the luminance signal portion corresponding to the third pixel included in the one second pixel set of the second pixel sets based on the second luminance information.
(9) The display according to any one of (1) to (8), further including
a plurality of signal lines extending in the first direction, wherein
the respective first pixel sets are arranged in respective first pixel cells,
the respective second pixel sets are arranged in respective second pixel cells,
in each of the first pixel cells, the first pixel and the non-basic color pixel are arranged in the first direction with respect to each other, and the first and non-basic color pixels are arranged in the second direction with respect to the second pixel, and
in each of the second pixel cells, the first pixel and the non-basic color pixel are arranged in the first direction with respect to each other, and the first and non-basic color pixels are arranged in the second direction with respect to the third pixel.
(10) The display according to any one of (1) to (8), further including
a plurality of signal lines extending in the first direction, wherein
the respective first pixel sets are arranged in respective first pixel cells,
the respective second pixel sets are arranged in respective second pixel cells,
in each of the first pixel cells, the first pixel, the second pixel, and the non-basic color pixel are arranged in the second direction with respect to one another, and
in each of the second pixel cells, the first pixel, the third pixel, and the non-basic color pixel are arranged in the second direction with respect to one another.
(11) The display according to any one of (1) to (8), further including
a plurality of signal lines extending in the first direction, wherein
the respective first pixel sets are arranged in respective first pixel cells,
the respective second pixel sets are arranged in respective second pixel cells,
the first pixel, the second pixel, the third pixel, and the non-basic color pixel each have an opening that has a circular shape or an ellipsoidal shape,
in each of the first pixel cells, the first pixel, the second pixel, and the non-basic color pixel are arranged to be adjacent to one another, and two of the first, second, and non-basic color pixels are arranged in the second direction with respect to each other, and
in each of the second pixel cells, the first pixel, the third pixel, and the non-basic color pixel are arranged to be adjacent to one another, and two of the first, third, and non-basic color pixels are arranged in the second direction with respect to each other.
(12) The display according to any one of (9) to (11), wherein
the first pixel set in one of the first pixel cells has an arrangement pattern different from an arrangement pattern of the first pixel set in another of the first pixel cells, and
the second pixel set in one of the second pixel cells has an arrangement pattern different from an arrangement pattern of the second pixel set in another of the second pixel cells.
(13) The display according to any one of (1) to (12), wherein each of an opening region in the second pixel and an opening region in the third pixel is larger than both of an opening region in the first pixel and an opening region in the non-basic color pixel.
(14) The display according to (13), wherein the opening region in the first pixel is as large as or is larger than the opening region in the non-basic color pixel.
(15) The display according to any one of (1) to (14), wherein
the first basic color light is green light,
the second basic color light is blue light, and
the third basic color light is red light.
(16) The display according to any one of (1) to (15), wherein
each of the first pixel, the second pixel, the third pixel, and the non-basic color pixel includes
a capacitor, and
a transistor including a drain, a gate, and a source, the gate being connected to a first end of the capacitor, and the source being connected to a second end of the capacitor.
(17) An electronic apparatus with a display and a control section configured to control operation of the display, the display including:
first pixel sets each configured of a combination of a first pixel, a second pixel, and a non-basic color pixel; and
second pixel sets each configured of a combination of the first pixel, a third pixel, and the non-basic color pixel,
the first pixel sets and the second pixel sets being arranged alternately in a first direction, a second direction, or both, the second direction intersecting with the first direction,
the first pixel being configured to emit first basic color light, the second pixel being configured to emit second basic color light, the third pixel being configured to emit third basic color light, and the non-basic color pixel being configured to emit one color light other than the first to third basic color lights.

It should be understood by those skilled in the art that various modifications, combinations, sub-combinations, and alterations may occur depending on design requirements and other factors insofar as they are within the scope of the appended claims or the equivalents thereof.

What is claimed is:

1. A display device comprising:
a plurality of pixels on a substrate, each pixel of the plurality of pixels including a set of sub-pixels each being one of:
first sub-pixels configured to emit light of a first color,
second sub-pixels configured to emit light of a second color,
third sub-pixels configured to emit light of a third color, and
fourth sub-pixels configured to emit light of a fourth color; and
a drive section that is configured to drive the plurality of pixels,
wherein a first subset of the plurality of pixels each includes one of the first sub-pixels, one of the second sub-pixels, and one of the third sub-pixels, but not one of the fourth sub-pixels, and a second subset of the plurality of pixels each includes one of the first sub-pixels, one of the second sub-pixels, and one of the fourth sub-pixels, but not one of the third sub-pixels, and
the plurality of pixels alternate, in at least one of a column direction and a row direction, between the first subset and the second subset.

2. The display device of claim 1,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first and second sub-pixels do not coincide with the respective layout regions of their corresponding pixel circuits.

3. The display device of claim 1,
wherein, for each of the plurality of pixels, each of the sub-pixels included therein has:
a light emitting element that includes an anode electrode, and
a corresponding pixel circuit that is connected to the anode electrode and configured to drive the light emitting element, and
for each of the plurality of pixels, a layout region of the anode electrode of the first sub-pixel overlaps, from a plan perspective, a layout region of the pixel circuit of the second sub-pixel, and a layout region of the anode electrode of the second sub-pixel overlaps, from a plan perspective, a layout region of the pixel circuit of the first sub-pixel.

4. The display device of claim 3,
wherein for each pixel of the first subset, a layout region of the anode electrode of the third sub-pixel does not overlap, from a plan perspective, a layout region of the pixel circuit of the first sub-pixel or a layout region of the pixel circuit of the second sub-pixel, and for each pixel of the second subset, a layout region of the anode electrode of the fourth sub-pixel does not overlap, from a plan perspective, a layout region of the pixel circuit of the first sub-pixel or a layout region of the pixel circuit of the second sub-pixel.

5. The display device of claim 1,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of first and second sub-pixels extend longitudinally in a first direction, and respective layout regions of the pixel circuits of the first and second sub-pixels extend longitudinally in a second direction different from the first direction.

6. The display device of claim 1,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first, second, third, and fourth sub-pixels do not overlap, from a plan perspective, any one of data lines that supply video signal voltages to the plurality of pixels.

7. The display device of claim 1,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first, second, third, and fourth sub-pixels each overlap, from a plan perspective, exactly one of data lines that supply video signal voltages to the plurality of pixels.

8. The display device of claim 7,
wherein for each of the plurality of pixels, the layout region of the anode electrode of the first sub-pixel overlaps, from a plan perspective, the layout region of the pixel circuit of the second sub-pixel, and the layout region of the anode electrode of the second sub-pixel overlaps, from a plan perspective, the layout region of the pixel circuit of the first sub-pixel.

9. The display device of claim 1,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first and second sub-pixels each overlap, from a plan perspective, exactly three of data lines that supply video signal voltages to the plurality of pixels, and
respective layout regions of the anode electrodes of the third and fourth sub-pixels each do not overlap, from a plan perspective, any one of the data lines.

10. The display device of claim 1,
wherein aspect ratios of respective layout regions of the anode electrodes of the first and second sub-pixels are all smaller than aspect ratios of respective layout regions of the anode electrodes of the third and fourth sub-pixels, where the aspect ratio of a layout region is the length of a longest side thereof divided by the length of the shortest side thereof.

11. The display device of claim 1,
wherein respective layout regions of the anode electrodes of the first and second sub-pixels extend longitudinally in a first direction, and respective layout regions of the anode electrodes of the third and fourth sub-pixels extend longitudinally in a second direction different from the first direction.

12. The display device of claim 1,
wherein the first color is green, the second color is white, the third color is red, and the fourth color is blue.

13. The display device of claim 12,
wherein the area of the layout region of the anode electrode of each of the blue and red sub-pixels is greater than the area of the layout region of the anode electrode of each of the green sub-pixels, which are each greater than or equal to the area of the layout region of each of the anode electrodes of the white sub-pixels.

14. An electronic apparatus comprising the display device of claim 1.

15. The electronic apparatus of claim 14,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first and second sub-pixels do not coincide with the respective layout regions of their corresponding pixel circuits.

16. The electronic apparatus of claim 14,
wherein, for each of the plurality of pixels, each of the sub-pixels included therein has:
a light emitting element that includes an anode electrode, and
a corresponding pixel circuit that is connected to the anode electrode and configured to drive the light emitting element, and
for each of the plurality of pixels, a layout region of the anode electrode of the first sub-pixel overlaps, from a plan perspective, a layout region of the pixel circuit of the second sub-pixel, and a layout region of the anode electrode of the second sub-pixel overlaps, from a plan perspective, a layout region of the pixel circuit of the first sub-pixel.

17. The electronic apparatus of claim 16,
wherein for each pixel of the first subset, a layout region of the anode electrode of the blue sub-pixel does not overlap, from a plan perspective, a layout region of the pixel circuit of the green sub-pixel or a layout region of the pixel circuit of the green sub-pixel, and
for each pixel of the second subset, a layout region of the anode electrode of the red sub-pixel does not overlap, from a plan perspective, a layout region of the pixel circuit of the green sub-pixel or a layout region of the pixel circuit of the green sub-pixel.

18. The electronic apparatus of claim 14,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of first and second sub-pixels extend longitudinally in a first direction, and respective layout regions of the pixel circuits of the first and second sub-pixels extend longitudinally in a second direction different from the first direction.

19. The electronic apparatus of claim 14,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first, second, third, and fourth sub-pixels do not overlap, from a plan perspective, any one of data lines that supply video signal voltages to the plurality of pixels.

20. The electronic apparatus of claim 14,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first, second, third, and fourth sub-pixels each overlap, from a plan perspective, exactly one of data lines that supply video signal voltages to the plurality of pixels.

21. The electronic apparatus of claim 20,
wherein for each of the plurality of pixels, the layout region of the anode electrode of the first sub-pixel overlaps, from a plan perspective, the layout region of the pixel circuit of the second sub-pixel, and the layout region of the anode electrode of the second sub-pixel overlaps, from a plan perspective, the layout region of the pixel circuit of the first sub-pixel.

22. The electronic apparatus of claim 14,
wherein, for each of the plurality of pixels, each of the sub-pixels included therein has:
a light emitting element that includes an anode electrode, and
a corresponding pixel circuit that is connected to the anode electrode and configured to drive the light emitting element, and
respective layout regions of the anode electrodes of the first and second sub-pixels each overlap, from a plan perspective, exactly three of data lines that supply video signal voltages to the plurality of pixels, and
respective layout regions of the anode electrodes of the third and fourth sub-pixels each do not overlap, from a plan perspective, any one of the data lines.

23. The electronic apparatus of claim 14,
wherein aspect ratios of respective layout regions of the anode electrodes of the first and second sub-pixels are all smaller than aspect ratios of respective layout regions of the anode electrodes of the third and fourth sub-pixels, where the aspect ratio of a layout region is the length of a longest side thereof divided by the length of the shortest side thereof.

24. The electronic apparatus of claim 14,
wherein respective layout regions of the anode electrodes of the first and second sub-pixels extend longitudinally in a first direction, and respective layout regions of the anode electrodes of the third and fourth sub-pixels extend longitudinally in a second direction different from the first direction.

25. The electronic apparatus of claim 14,
wherein the first color is green, the second color is white, the third color is red, and the fourth color is blue.

26. A display device comprising:
a plurality of pixels on a substrate, each pixel of the plurality of pixels including a set of sub-pixels each being one of:

first sub-pixels configured to emit light of a first color,
second sub-pixels configured to emit light of a second color,
third sub-pixels configured to emit light of a third color, and
fourth sub-pixels configured to emit light of a fourth color,
wherein a first subset of the plurality of pixels each includes one of the first sub-pixels, one of the second sub-pixels, and one of the third sub-pixels, and a second subset of the plurality of pixels each includes one of the first sub-pixels, one of the second sub-pixels, and one of the fourth sub-pixels, and
resolutions of the third sub-pixels and the fourth sub-pixels each are lower than resolutions of either of the first sub-pixels and the second sub-pixels.

27. The display device of claim 26,
wherein an amount of the third sub-pixels is half of an amount of the first sub-pixels.

\* \* \* \* \*